(12) United States Patent
Suzuki et al.

(10) Patent No.: US 11,705,624 B2
(45) Date of Patent: Jul. 18, 2023

(54) WIRING BOARD AND METHOD FOR MANUFACTURING WIRING BOARD

(71) Applicant: DAI NIPPON PRINTING CO., LTD., Tokyo-to (JP)

(72) Inventors: Koichi Suzuki, Tokyo-to (JP); Seiji Take, Tokyo-to (JP); Daisuke Matsuura, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 244 days.

(21) Appl. No.: 16/768,254

(22) PCT Filed: Nov. 29, 2018

(86) PCT No.: PCT/JP2018/043909
§ 371 (c)(1),
(2) Date: May 29, 2020

(87) PCT Pub. No.: WO2019/107476
PCT Pub. Date: Jun. 6, 2019

(65) Prior Publication Data
US 2020/0373653 A1    Nov. 26, 2020

(30) Foreign Application Priority Data

Nov. 29, 2017 (JP) .................................. 2017-229272
Mar. 13, 2018 (JP) .................................. 2018-045941
Mar. 20, 2018 (JP) .................................. 2018-053281

(51) Int. Cl.
*H05K 1/02* (2006.01)
*H05K 1/05* (2006.01)
(Continued)

(52) U.S. Cl.
CPC ............. *H01Q 1/36* (2013.01); *H05K 1/0274* (2013.01); *H05K 3/108* (2013.01); *H05K 3/18* (2013.01);
(Continued)

(58) Field of Classification Search
CPC .. H05K 1/02; H05K 1/05; H05K 1/09; H05K 1/0274; H05K 1/16; H05K 3/12;
(Continued)

(56) References Cited

U.S. PATENT DOCUMENTS 5,652,465 A * 7/1997 Hosoda ............... H01L 23/5222
257/797
7,838,998 B2 * 11/2010 Ozawa ................. H01L 21/563
257/772

(Continued)

FOREIGN PATENT DOCUMENTS

EP    0 963 146 A1    12/1999
JP    2001-318454 A    11/2001
(Continued)

OTHER PUBLICATIONS

Jul. 9, 2021 partial supplementary Search Report issued in European Patent Application No. 18883753.8.
(Continued)

*Primary Examiner* — Xiaoliang Chen
(74) *Attorney, Agent, or Firm* — Oliff PLC

(57) ABSTRACT

A wiring board includes: a substrate having transparency; a plurality of first wirings which are arranged on an upper surface of the substrate and extend in a first direction and each of which has a back surface in contact with the substrate and a front surface facing an opposite side of the back surface; and has a back surface in contact with the substrate and a front surface facing an opposite side of the back surface. The first wiring has a pair of side surfaces
(Continued)

which extend in the first direction and are adjacent to the back surface of the first wiring, and each of the pair of side surfaces of the second wiring is recessed inward. The second wiring has a pair of side surfaces which extend in the second direction and are adjacent to the back surface of the second wiring.

25 Claims, 37 Drawing Sheets

(51) Int. Cl.
| | |
|---|---|
| H05K 1/09 | (2006.01) |
| H05K 1/16 | (2006.01) |
| H05K 3/12 | (2006.01) |
| H05K 3/18 | (2006.01) |
| H05K 7/04 | (2006.01) |
| H01Q 1/36 | (2006.01) |
| H01Q 1/38 | (2006.01) |
| H01L 21/70 | (2006.01) |
| H01L 23/48 | (2006.01) |
| H01L 23/52 | (2006.01) |
| H01L 23/522 | (2006.01) |
| H01L 23/535 | (2006.01) |
| H01L 27/00 | (2006.01) |
| H01L 27/02 | (2006.01) |
| H01L 27/12 | (2006.01) |
| H01L 27/32 | (2006.01) |
| H01L 27/115 | (2017.01) |
| H05K 3/10 | (2006.01) |

(52) U.S. Cl.
CPC .............. H05K 2201/10098 (2013.01); H05K 2203/0723 (2013.01)

(58) Field of Classification Search
CPC ............ H05K 3/18; H05K 3/108; H05K 7/04; H01Q 1/36; H01Q 1/38; H01L 21/70; H01L 23/48; H01L 23/52; H01L 23/305; H01L 23/522; H01L 23/535; H01L 23/585; H01L 27/00; H01L 27/02; H01L 27/12; H01L 27/32; H01L 27/115
USPC ........ 361/760, 783; 174/126.1, 253; 257/40, 257/48, 664, 753, 758, 778, 784
See application file for complete search history.

(56) References Cited

U.S. PATENT DOCUMENTS

| | | | | |
|---|---|---|---|---|
| 7,977,795 | B2* | 7/2011 | Higashi | H01L 23/564 |
| | | | | 257/E23.142 |
| 9,213,201 | B2* | 12/2015 | Jung | G02F 1/133723 |
| 9,575,386 | B2* | 2/2017 | Choi | G02F 1/1368 |
| 9,706,668 | B2* | 7/2017 | Kim | H05K 3/4038 |
| 2004/0023057 | A1* | 2/2004 | Kamijima | H05K 3/108 |
| | | | | 428/592 |
| 2006/0283539 | A1 | 12/2006 | Slater | |
| 2007/0108628 | A1* | 5/2007 | Ozawa | H01L 23/49811 |
| | | | | 257/E23.068 |
| 2008/0179719 | A1* | 7/2008 | Nakas | H01L 23/66 |
| | | | | 257/664 |
| 2009/0051620 | A1 | 2/2009 | Ishibashi et al. | |
| 2009/0102065 | A1* | 4/2009 | Lee | H01L 24/05 |
| | | | | 257/E21.59 |
| 2009/0121349 | A1* | 5/2009 | Suzuki | G02F 1/13458 |
| | | | | 257/737 |
| 2011/0199126 | A1* | 8/2011 | Onda | H01L 29/4238 |
| | | | | 257/E27.081 |
| 2012/0043125 | A1 | 2/2012 | Kim et al. | |
| 2012/0127684 | A1* | 5/2012 | Matsumoto | H01L 25/072 |
| | | | | 361/783 |
| 2012/0256310 | A1* | 10/2012 | Ide | H01L 25/50 |
| | | | | 257/E23.06 |
| 2012/0295187 | A1* | 11/2012 | Tsai | H01L 21/0334 |
| | | | | 716/55 |
| 2012/0306106 | A1* | 12/2012 | Takada | H01L 23/522 |
| | | | | 257/784 |
| 2013/0026632 | A1* | 1/2013 | Kikuchi | H01L 21/6835 |
| | | | | 257/E23.01 |
| 2014/0054070 | A1 | 2/2014 | Ichiki | |
| 2014/0145192 | A1* | 5/2014 | Momono | H01L 27/14643 |
| | | | | 716/55 |
| 2014/0158407 | A1 | 6/2014 | Ho | |
| 2014/0167004 | A1* | 6/2014 | Jeong | H01L 51/5246 |
| | | | | 438/33 |
| 2014/0209355 | A1 | 7/2014 | Lebens et al. | |
| 2014/0216783 | A1* | 8/2014 | Trauernicht | H05K 1/0296 |
| | | | | 174/126.1 |
| 2014/0216790 | A1* | 8/2014 | Trauernicht | H05K 1/0296 |
| | | | | 174/253 |
| 2014/0299361 | A1 | 10/2014 | Nakamura et al. | |
| 2015/0364549 | A1* | 12/2015 | Lee | H01L 29/0653 |
| | | | | 257/77 |
| 2016/0284727 | A1* | 9/2016 | Sonehara | H01L 23/528 |
| 2016/0330835 | A1* | 11/2016 | Hirose | G06F 3/041 |
| 2017/0352717 | A1* | 12/2017 | Choi | H01L 27/3276 |
| 2018/0059837 | A1* | 3/2018 | Kim | G06F 3/0446 |
| 2018/0316098 | A1* | 11/2018 | Amadjikpe | H01Q 19/005 |
| 2021/0036095 | A1* | 2/2021 | Pulugurtha | H01F 27/245 |
| 2021/0271344 | A1* | 9/2021 | Tian | G06F 3/0412 |

FOREIGN PATENT DOCUMENTS

| | | |
|---|---|---|
| JP | 2007-89109 A | 4/2007 |
| JP | 2007-142092 A | 6/2007 |
| JP | 2008-171845 A | 7/2008 |
| JP | 2011-66610 A | 3/2011 |
| JP | 2011-205635 A | 10/2011 |
| JP | 5636735 B2 | 12/2014 |
| JP | 2015-46034 A | 3/2015 |
| JP | 5695947 B2 | 4/2015 |
| JP | 2015-156210 A | 8/2015 |
| JP | 2016-15428 A | 1/2016 |
| JP | 2016-184277 A | 10/2016 |
| JP | 2016-218690 A | 12/2016 |
| JP | 2017-123387 A | 7/2017 |
| JP | 2017-162262 A | 9/2017 |
| JP | 2017-175540 A | 9/2017 |
| TW | I466779 B | 1/2015 |
| WO | 2015/156316 A1 | 10/2015 |

OTHER PUBLICATIONS

Oct. 20, 2021 extended Search Report issued in European Patent Application No. 18883753.8.
Jul. 16, 2019 Office Action issued in Japanese Patent Application No. 2019-125309.
Aug. 20, 2019 Office Action issued in Japanese Patent Application No. 2019-125309.
Jun. 4, 2019 Office Action issued in Japanese Patent Application No. 2019-523889.
Mar. 5, 2019 International Search Report issued in International Patent Application No. PCT/2018/043909.
Jun. 2, 2020 International Preliminary Report on Patentability issued in International Patent Application No. PCT/2018/043909.
Aug. 1, 2022 Office Action issued in Taiwanese Patent Application No. 107142720.

* cited by examiner (A)

(B)

(A)

(B)

(A)

(B)

(A)

(B)

(A)

(B)

(A)

(B)

WIRING BOARD AND METHOD FOR MANUFACTURING WIRING BOARD

TECHNICAL FIELD

Embodiments of the present disclosure relate to a wiring board and a method for manufacturing a wiring board.

BACKGROUND ART

Recently, mobile terminal devices such as smartphones and tablets have been more sophisticated, smaller, thinner, and lighter. Since these mobile terminal devices use a plurality of communication bands, a plurality of antennas corresponding to the communication bands are required. For example, a plurality of antennas, such as telephone antennas, wireless fidelity (WiFi) antennas, 3 generation (G) antennas, 4 generation (G) antennas, long term evolution (LTE) antennas, Bluetooth (registered trademark) antennas, and near field communication (NFC) antennas, are mounted on mobile terminal devices. However, a mounting space for the antennas has been limited with the miniaturization of mobile terminal devices, and the degree of freedom in antenna design has been narrowed. Further, the radio wave sensitivity is not always satisfactory because the antennas are built in the limited space.

Thus, a film antenna that can be mounted on a display region of a mobile terminal device has been developed. In this film antenna, an antenna pattern is formed of a mesh-like conductor mesh layer having a conductor portion serving as a formation portion of an opaque conductor layer and a large number of opening portions serving as non-formation portions in a transparent antenna in which the antenna pattern is formed on a transparent substrate.

CITATION LIST

Patent Literature

Patent Literature 1: JP 2011-66610 A
Patent Literature 2: JP 5636735 B2
Patent Literature 3: JP 5695947 B2

One of objects of an embodiment of the present disclosure is to provide a wiring board having a radio wave transmission/reception function with improved conductivity and transparency, and a method for manufacturing the same.

Further, one or more mesh antennas are mounted on the transparent substrate in the conventional film antenna, but both a region where the antenna pattern is formed and a region where the antenna pattern is not formed are present on the transparent substrate. In this case, the region where the antenna pattern is formed is likely to be visible due to the presence of the region where the antenna pattern is not formed.

One of objects of the present embodiment is to provide a wiring board and a method for manufacturing a wiring board, which can make it difficult to visually recognize an antenna pattern region.

Further, one or a plurality of mesh antennas are mounted on the transparent substrate in the conventional film antenna. While transmission and reception are performed using this mesh antenna, a current value tends to increase toward an edge of the mesh antenna, and the current value tends to decrease toward the center. Therefore, a current distribution in each of the mesh antennas is not uniform, and it is difficult to sufficiently improve antenna characteristics.

The present embodiment provides the wiring board and the method for manufacturing the wiring board, which can make a current distribution in an antenna pattern region more uniform and improve antenna characteristics.

SUMMARY OF INVENTION

A wiring board according to one embodiment of the present disclosure includes: a substrate having transparency; a plurality of first wiring which are arranged on an upper surface of the substrate and extend in a first direction and each of which has a back surface in contact with the substrate and a front surface facing an opposite side of the back surface; and a second wiring which is arranged on the upper surface of the substrate, extends in a second direction intersecting with the first direction, and has a back surface in contact with the substrate and a front surface facing an opposite side of the back surface, the first wiring has a pair of side surfaces which extend in the first direction and are adjacent to the back surface of the first wiring, and each of the pair of side surfaces of the first wiring is recessed inward, and the second wiring has a pair of side surfaces which extend in the second direction and are adjacent to the back surface of the second wiring, and each of the pair of side surfaces of the second wiring is recessed inward.

A wiring board according to one embodiment of the present disclosure includes: a substrate having transparency; a plurality of first wiring which are arranged on an upper surface of the substrate and extend in a first direction and each of which has a back surface in contact with the substrate and a front surface facing an opposite side of the back surface; and a second wiring which is arranged on the upper surface of the substrate, extends in a second direction intersecting with the first direction, and has a back surface in contact with the substrate and a front surface facing an opposite side of the back surface, the first wiring has a pair of side surfaces which extend in the first direction and are adjacent to the back surface of the first wiring, the second wiring has a pair of side surfaces which extend in the second direction and are adjacent to the back surface of the second wiring, and one side surface of the first wiring and one side surface of the second wiring are continuously connected by a curved surface.

A wiring board according to one embodiment of the present disclosure includes: a substrate having transparency; a plurality of first wirings which are arranged on an upper surface of the substrate and extend in a first direction and each of which has a back surface in contact with the substrate and a front surface facing an opposite side of the back surface; and a second wiring which is arranged on the upper surface of the substrate, extends in a second direction intersecting with the first direction, and has a back surface in contact with the substrate and a front surface facing an opposite side of the back surface, and a line width of the back surface of the second wiring is smaller than a line width of the back surface of the first wiring.

In the wiring board according to one embodiment of the present disclosure, the line width of the back surface of the first wiring may be larger than a line width of the front surface of the first wiring, and the line width of the back surface of the second wiring may be larger than a line width of the front surface of the second wiring.

In the wiring board according to one embodiment of the present disclosure, the second wiring may have a pair of side surfaces which extend in the second direction and are adjacent to the back surface of the second wiring, and an angle between the front surface and each of the side surfaces of the second wiring may be smaller than an external angle of an angle between the back surface and each of the side surfaces of the second wiring.

In the wiring board according to one embodiment of the present disclosure, the first wiring may have a pair of side surfaces which extend in the first direction and are adjacent to the back surface of the first wiring, and an angle between the front surface and each of the side surfaces of the first wiring may be smaller than an external angle of an angle between the back surface and each of the side surfaces of the first wiring.

In the wiring board according to one embodiment of the present disclosure, an intersection between the first wiring and the second wiring may include a curved surface at at least one of corners formed by the upper surface of the substrate, a surface adjacent to the back surface of the first wiring, and a surface adjacent to the back surface of the second wiring, the curved surface being continuous among the surfaces.

The wiring board according to one embodiment of the present disclosure may have a radio wave transmission/reception function.

A method for manufacturing a wiring board according to one embodiment of the present disclosure includes: forming a conductive layer on an upper surface of a substrate; forming an insulating layer that includes a first trench extending in a first direction and a second trench extending in a second direction; forming a first conductor arranged in the first trench and a second conductor arranged in the second trench; removing the insulating layer; and removing the conductive layer to expose the upper surface of the substrate and forming a first wiring and a second wiring from the first conductor and the second conductor.

In the method for manufacturing a wiring board according to one embodiment of the present disclosure, the first wiring may have a pair of side surfaces which extend in the first direction and are adjacent to a back surface of the first wiring, and each of the pair of side surfaces of the first wiring may be recessed inward, and the second wiring may have a pair of side surfaces which extend in the second direction and are adjacent to a back surface of the second wiring, and each of the pair of side surfaces of the second wiring may be recessed inward.

In the method for manufacturing a wiring board according to one embodiment of the present disclosure, the first wiring may have a pair of side surfaces which extend in the first direction and are adjacent to a back surface of the first wiring, the second wiring may have a pair of side surfaces which extend in the second direction and are adjacent to a back surface of the second wiring, and one side surface of the first wiring and one side surface of the second wiring may be continuously connected by a curved surface.

In the method for manufacturing a wiring board according to one embodiment of the present disclosure, a line width of a back surface of the second wiring may be smaller than a line width of a back surface of the first wiring.

In the method for manufacturing a wiring board according to one embodiment of the present disclosure, the insulating layer that includes the first trench and the second trench may be formed using an imprinting method.

In the method for manufacturing a wiring board according to one embodiment of the present disclosure, a method for forming the first wiring and the second wiring may include: forming the conductive layer by a sputtering method; forming the first wiring and the second wiring by an electrolytic plating method; and removing the conductive layer by wet etching so as to expose the upper surface of the substrate.

In the method for manufacturing a wiring board according to one embodiment of the present disclosure, front surfaces of the first wiring and the second wiring may be subjected to a blackening treatment.

According to the embodiments of the present disclosure, it is possible to provide the wiring board with the improved conductivity and transparency and the method for manufacturing the same.

A wiring board according to one embodiment of the present disclosure is a wiring board including: a substrate having transparency; a wiring pattern region which is arranged on the substrate and includes a plurality of wirings; and a dummy pattern region which is arranged around the wiring pattern region and includes a plurality of dummy wirings electrically independent of the wirings, wherein each of the wiring pattern region and the dummy pattern region is formed by repeating a predetermined unit pattern shape, and a unit pattern shape of the dummy pattern region is a shape in which a part of a unit pattern shape of the wiring pattern region is missing, and an additional pattern apart from the dummy wiring is arranged in the dummy pattern region.

In the wiring board according to one embodiment of the present disclosure, the dummy wiring may have a first dummy wiring portion and a second dummy wiring portion, and the first dummy wiring portion and the second dummy wiring portion may be arranged apart from each other in a plane direction.

A wiring board according to one embodiment of the present disclosure is a wiring board including: a substrate having transparency; a wiring pattern region which is arranged on the substrate and includes a plurality of wirings; and a dummy pattern region which is arranged around the wiring pattern region and includes a plurality of dummy wirings electrically independent of the wirings, wherein the dummy wiring has a substantially L shape in a plan view.

In the wiring board according to one embodiment of the present disclosure, an additional pattern apart from the dummy wiring may be arranged in the dummy pattern region.

A wiring board according to one embodiment of the present disclosure is a wiring board including: a substrate having transparency; a wiring pattern region which is arranged on the substrate and includes a plurality of wirings; and a dummy pattern region which is arranged around the wiring pattern region and includes a plurality of dummy wirings electrically independent of the wirings, wherein the dummy wiring has a first dummy wiring portion and a second dummy wiring portion, and the first dummy wiring portion and the second dummy wiring portion are arranged obliquely with respect to the wiring.

In the wiring board according to one embodiment of the present disclosure, an aperture ratio of the dummy pattern region may be higher than an aperture ratio of the wiring pattern region.

In the wiring board according to one embodiment of the present disclosure, the aperture ratio of the dummy pattern region may be in a range of 87% or more and less than 100%.

In the wiring board according to one embodiment of the present disclosure, a difference between the aperture ratio of the dummy pattern region and the aperture ratio of the wiring pattern region may be 1% or less.

In the wiring board according to one embodiment of the present disclosure, the wiring pattern region may include a plurality of connection wirings connecting the plurality of wirings.

The wiring board according to one embodiment of the present disclosure may have a radio wave transmission/reception function.

According to the embodiments of the present disclosure, it is possible to make it difficult to visually recognize the wiring pattern region.

A wiring board according to one embodiment of the present disclosure is a wiring board including: a substrate having transparency; and an antenna pattern region which is arranged on the substrate and includes a plurality of antenna wirings having a function as an antenna, wherein an aperture ratio of a widthwise central portion of the antenna pattern region is higher than an aperture ratio of a widthwise edge portion of the antenna pattern region.

In the wiring board according to one embodiment of the present disclosure, a pitch of the plurality of antenna wirings in the widthwise central portion of the antenna pattern region may be wider than a pitch of the plurality of antenna wirings in a widthwise edge portion of the antenna pattern region.

In the wiring board according to one embodiment of the present disclosure, a void portion in which the antenna wiring is not provided may be formed in a widthwise central portion of the antenna pattern region.

In the wiring board according to one embodiment of the present disclosure, a dummy pattern region including a plurality of dummy wirings electrically independent of the antenna wiring may be formed in the void portion.

In the wiring board according to one embodiment of the present disclosure, the antenna pattern region may have a first pattern region and a second pattern region separated with the void portion therebetween, the first pattern region and the second pattern region may be respectively arranged on both widthwise edge portions of the antenna pattern region, and the first pattern region and the second pattern region may be electrically connected to each other by a central pattern region.

In the wiring board according to one embodiment of the present disclosure, connection pattern regions each having an inclined portion formed obliquely to a width direction of the antenna pattern region may be provided between the central pattern region and each of the first pattern region and the second pattern region.

In the wiring board according to one embodiment of the present disclosure, a power feeding unit may be electrically connected to the antenna pattern region, and a length of the power feeding unit in the widthwise central portion may be longer than a length of the power feeding unit in the widthwise edge portion.

A wiring board according to one embodiment of the present disclosure is a wiring board including: a substrate having transparency; an antenna pattern region which is arranged on the substrate and includes a plurality of antenna wirings having a function as an antenna; a power feeding unit electrically connected to the antenna pattern region, wherein a length of the power feeding unit in a widthwise central portion is longer than a length of the power feeding unit in a widthwise edge portion.

A method for manufacturing a wiring board according to one embodiment of the present disclosure is a method for manufacturing a wiring board including: a step of preparing a substrate having transparency; and a step of forming an antenna pattern region, which includes a plurality of antenna wirings each having a function as an antenna, on the substrate, wherein an aperture ratio of a widthwise central portion of the antenna pattern region is higher than an aperture ratio of a widthwise edge portion of the antenna pattern region.

A method for manufacturing a wiring board according to one embodiment of the present disclosure is a method for manufacturing a wiring board including: a step of preparing a substrate having transparency; and a step of forming an antenna pattern region including a plurality of antenna wirings each having a function as an antenna and a power feeding unit electrically connected to the antenna pattern region on the substrate, wherein a length of the power feeding unit in a widthwise central portion is longer than a length of the power feeding unit in a widthwise edge portion.

According to the embodiment of the present disclosure, the current distribution in the antenna pattern region can be made more uniform, and the antenna characteristic can be improved.

DESCRIPTION OF EMBODIMENTS

Figure 1:
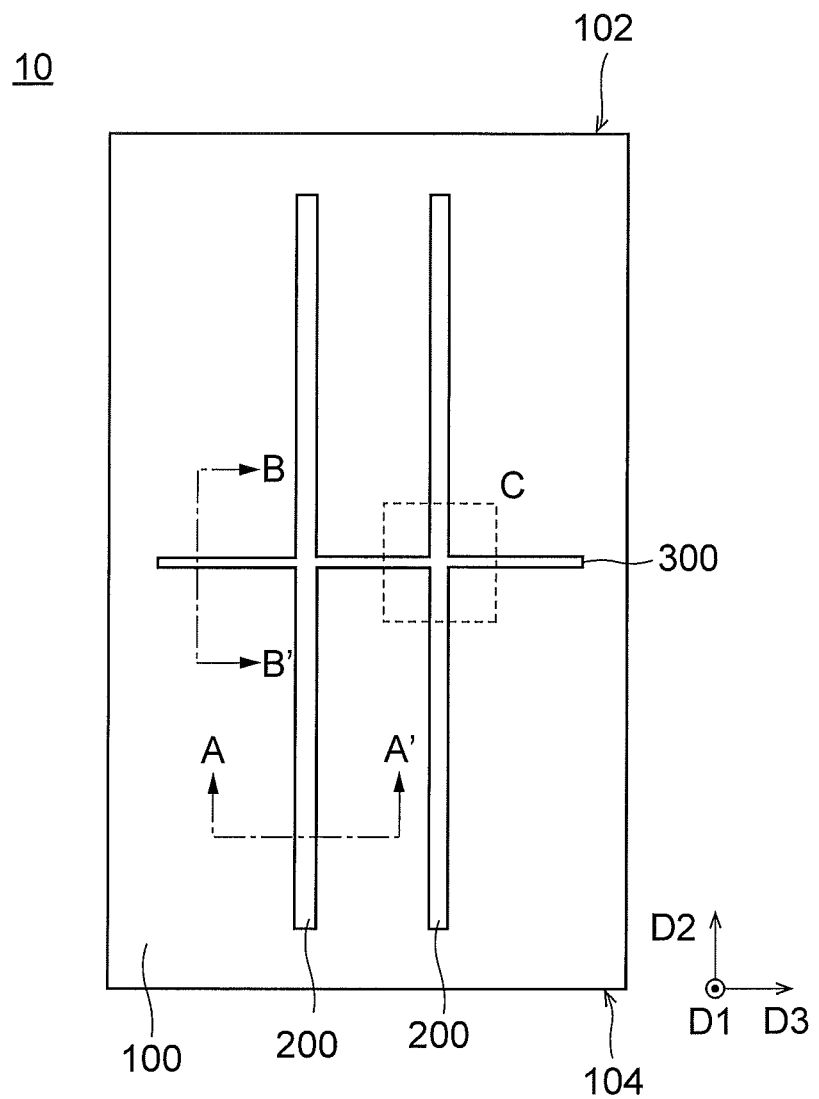
FIG. 1 is a top view illustrating an example of a wiring board according to a first embodiment of the present disclosure.

Each of the following drawings is schematically illustrated. Therefore, a size and a shape of each portion are exaggerated as appropriate in order to facilitate understanding. Further, it is possible to appropriately change and implement within a scope not departing from a technical idea. Note that the same portions are denoted by the same reference signs in the following drawings, and a detailed description thereof is sometimes partially omitted. Further, a numerical value such as a dimension of each member and a material name described in the present specification are examples as embodiments, and can be appropriately selected and used without being limited thereto. In the present specification, terms specifying a shape and a geometric condition, such as terms such as parallel, orthogonal, and vertical, include not only one that is strictly meant but also substantially the same state.

First Embodiment

Hereinafter, a wiring board and a method for manufacturing the same according to a first embodiment will be described with reference to the drawings. However, the wiring board and the method for manufacturing the same according to the present embodiment can be carried out in many different modes, and is not construed as being limited to the following description of embodiments. Note that the same portions or portions having similar functions are denoted by the same reference signs in the drawings referred to in the present embodiment, and a repeated description thereof will be omitted. Further, the description will be given using the term "upper" or "lower" for convenience of description, but the vertical direction may be reversed. Further, a "front surface" of a wiring refers to a surface opposite to a surface on which a substrate is provided as viewed from the wiring in the present embodiment. A "back surface" of the wiring refers to a surface on the side where the substrate is provided as viewed from the wiring. A "side surface" of the wiring refers to a surface located between the "front surface" and the "back surface", the surface facing a lateral side with respect to a longitudinal direction of the wiring.

A configuration of a wiring board 10 according to the present embodiment will be described with reference to FIG. 1 or 2.

[Configuration of Wiring Board]

FIG. 1 is a top view illustrating an example of the wiring board according to the present embodiment. FIG. 2 is a cross-sectional view illustrating an example of the wiring board according to the present embodiment. FIG. 2(A) is an enlarged cross-sectional view taken along a chain line A-A' of FIG. 1. FIG. 2(B) is an enlarged cross-sectional view taken along a chain line B-B' of FIG. 1. As illustrated in FIG. 1, the wiring board 10 includes a substrate 100, a first wiring 200, and a second wiring 300. The first wiring 200 and the second wiring 300 are arranged on an upper surface of the substrate 100. Although two first wirings 200 and one second wiring 300 are arranged in the present embodiment, the configuration is not limited thereto. It is sufficient that two or more first wirings 200 and one or more second wirings 300 are provided.

As illustrated in FIG. 1, a line-and-space shape in which a plurality of lines extend independently from a first side 102 of the substrate 100 toward a second side 104 opposite to the first side 102 (in a longitudinal direction of the first wiring 200, a first direction, and an opposite direction of D2) is illustrated as a planar shape of the first wiring 200. As a planar shape of the second wiring 300, a shape in which one line extends in a direction orthogonal to a direction in which the first wiring 200 extends (a longitudinal direction of the second wiring 300, a second direction, and a D3 direction) is illustrated. That is, the second wiring 300 is orthogonal to the two first wirings 200. Further, the first wiring 200 is longer than the second wiring 300. When the wiring board 10 has a radio wave transmission/reception function, the first wiring 200 has a function as an antenna, and the second wiring 300 has a function of connecting the plurality of first wirings 200. Each of the first wirings 200 extends in a direction (a D2 direction) corresponding to a frequency band of the antenna, and each of the second wirings 300 extends in the direction orthogonal to the first wiring 200 (the D3 direction). However, it is sufficient that a plurality of lines intersect or are connected with each other in the planar shape of the first wiring 200 and the second wiring 300 without being limited to such a shape. For example, a direction of the first wiring 200 and a direction of the second wiring 300 may intersect at an acute angle or may intersect at an obtuse angle. When the plurality of first wirings 200 and the plurality of second wirings 300 are arranged, the planar shape thereof have such a repetitive shape. That is, a regular grid or mesh shape is formed by the first wiring 200 extending in the first direction and the second wiring 300 extending in the second direction. However, the configuration is not limited thereto, and the repetitive shape is not necessarily uniform on the substrate 100. Further, the substrate 100 is rectangular in FIG. 1, but is not limited to this shape.

As illustrated in FIG. 2(A), the first wiring 200 has a back surface (first surface) 201 in contact with the substrate 100, and a front surface (second surface) 202 facing the opposite side of the back surface 201. As illustrated in FIG. 2(B), the second wiring 300 has a back surface (third surface) 303 in contact with the substrate 100, and a front surface (fourth surface) 304 facing the opposite side of the back surface 303. As illustrated in FIGS. 1, 2(A), and 2(B), a line width of the front surface 304 of the second wiring 300 is smaller than a line width of the front surface 202 of the first wiring 200. Further, a line width of the back surface 303 of the second wiring 300 is smaller than a line width of the back surface 201 of the first wiring 200. Here, the line width means a width parallel to the upper surface of the substrate 100 in a cross section that intersects perpendicularly with a direction in which each wiring extends. That is, the line widths of the front surface 202 and the back surface 201 of the first wiring 200 in the present embodiment respectively indicate lengths of the front surface 202 and the back surface 201 in the D3 direction, and the line widths of the front surface 304 and the back surface 303 of the second wiring 300 respectively indicate lengths of the front surface 304 and the back surface 303 in the D2 direction. With the arrangement in which the line widths of the front surface 304 and the back surface 303 of the second wiring 300 are smaller than the line widths of the front surface 202 and the back surface 201 of the first wiring 200, respectively, it is possible to suppress the visibility of the spare second wiring 300 corresponding to the disconnection of the first wiring 200 or the like while maintaining reliability of the first wiring 200 having the radio wave transmission/reception function. Thus, a conductivity and transparency of the wiring board 10 can be improved. Note that the line width of the front surface 304 of the second wiring 300 may be the same as the line width of the front surface 202 of the first wiring 200 without being limited to the above arrangement. Further, the line width of the back surface 303 of the second wiring 300 may be the same as the line width of the back surface 201 of the first wiring 200.

As illustrated in FIG. 2(A), the line width of the back surface 201 of the first wiring 200 is larger than the line width of the front surface 202 of the first wiring 200. As illustrated in FIG. 2(B), the line width of the back surface 303 of the second wiring 300 is larger than the line width of the front surface 304 of the second wiring 300. Since the first wiring 200 and the second wiring 300 are arranged such that the line width of the surface in contact with the substrate 100 is larger than the line width of the surface facing the side opposite to the surface in contact with the substrate 100, the adhesion between the substrate 100 and each of the first wiring 200 and the second wiring 300 can be improved while suppressing the visibility of the first wiring 200 and the second wiring 300 in a plan view in the D1 direction. Furthermore, a wiring resistance can be suppressed by increasing the area of each cross section of the first wiring 200 and the second wiring 300 that intersects perpendicularly with the direction in which each wiring extends. Thus, the transparency, the reliability, and the conductivity of the wiring board 10 can be improved.

As illustrated in FIG. 2(A), the first wiring 200 has a pair of side surfaces (ninth and tenth surfaces) 209 and 210 which extend in the direction of the first wiring 200 and are adjacent to the back surface 201. In the first wiring 200, an angle between the back surface 201 and one side surface 209 and an angle between the back surface 201 and the other side surface 210 are acute angles. In the first wiring 200, the angle between the back surface 201 and the one side surface 209 is the same as the angle between the back surface 201 and the other side surface 210. That is, in a cross section that intersects perpendicularly with a direction in which the first wiring 200 extends, the first wiring 200 is line-symmetric about the extending direction (the D2 direction).

As illustrated in FIG. 2(B), the second wiring 300 has a pair of side surfaces (fifth and sixth surfaces) 305 and 306 which extend in the direction of the second wiring 300 and are adjacent to the back surface 303. In the second wiring 300, an angle between the back surface 303 and one side surface 305 and an angle between the back surface 303 and the other side surface 306 are acute angles. In the second wiring 300, the angle between the back surface 303 and the one side surface 305 is the same as the angle between the back surface 303 and the other side surface 306. That is, in a cross section that intersects perpendicularly with the direction in which the second wiring 300 extends, the second wiring 300 is line-symmetric about the extending direction (the D3 direction).

It is sufficient that a material of the first wiring 200 and a material of the second wiring 300 are conductive metal materials. In the present embodiment, the material of the first wiring 200 and the material of the second wiring 300 are copper, but are not limited thereto. As the material of the first wiring 200 and the material of the second wiring 300, for example, a metal material (including an alloy) such as gold, silver, copper, platinum, tin, aluminum, iron, and nickel can be used.

In the present embodiment, the line width of the first wiring 200 (the line width of the back surface 201 and the line width of the front surface 202) is not particularly limited as long as the above conditions are satisfied, and can be appropriately selected according to the application. For example, the line width of the first wiring 200 can be selected in a range of 0.1 µm or more and 5.0 µm or less. The line width of the second wiring 300 (the line width of the back surface 303 and the line width of the front surface 304) is not particularly limited as long as the above conditions are satisfied, and can be appropriately selected according to the application. For example, the line width of the second wiring 300 can be selected in a range of 0.1 µm or more and 5.0 µm or less. Each height of the first wiring 200 and the second wiring 300 is not particularly limited, and can be appropriately selected according to the application, and, for example, can be selected in the range of 0.1 µm or more and 5.0 µm or less.

Although not illustrated in the drawing, it is preferable that the first wiring 200 and the second wiring 300 be subjected to a blackening treatment on surfaces other than the surface in contact with the substrate 100. In particular, it is preferable that the surface facing the side opposite to the surface in contact with the substrate 100 be subjected to the blackening treatment for each of the first wiring 200 and the second wiring 300. In the present embodiment, the front surface 202 of the first wiring 200 and the front surface 304 of the second wiring 300 include copper oxide, which is an oxide film of each wiring material. However, the configuration is not limited thereto, and it is more preferable that the side surface 209 and the side surface 210 of the first wiring 200 and the side surface 305 and the side surface 306 of the second wiring 300 be further subjected to the blackening treatment. Further, as a method for the blackening treatment, formation can be performed by a known blackening treatment method such as oxidation, sulfurization, and nickel black plating of the metal wiring. The blackening treatment may be performed by forming a black resin film or the like. Since the front surfaces of the first wiring 200 and the second wiring 300 are subjected to the blackening treatment, it is possible to suppress light reflection of the first wiring 200 and the second wiring 300, and to achieve absorption of external light of the wiring board 10 and contrast improvement.

Although not illustrated in the drawing, an adhesion layer may be further arranged between the substrate 100 and the first wiring 200 and between the substrate 100 and the second wiring 300. As a material of the adhesion layer, for example, indium-zinc-oxide (IZO) or the like can be used. Since the adhesion layer is arranged between the substrate 100 and the first wiring 200 and between the substrate 100 and the second wiring 300, the adhesion between the substrate 100 and the first wiring 200 and between the substrate 100 and the second wiring 300 can be further improved.

It is sufficient that a material of the substrate 100 is a material having transparency and an electrical insulating property in a visible light region. In the present embodiment, the material of the substrate 100 is polyethylene terephthalate, but is not limited thereto. As the material of the substrate 100, it is preferable to use, for example, an organic insulating material such as a polyester resin such as polyethylene terephthalate, an acrylic resin such as pomethylmethacrylate, a polycarbonate resin, a polyimide resin, a polyolefin resin such as a cycloolefin polymer, and a cellulosic resin material such as triacetyl cellulose. Further, glass, ceramics, or the like can be appropriately selected as the material of the substrate 100 according to the application. Note that the example in which the substrate 100 is constituted by a single layer is illustrated, but a structure in which a plurality of base materials or layers are stacked may be adopted without being limited thereto. Further, the substrate 100 may be in the form of a film or a plate. Thus, a thickness of the substrate 100 is not particularly limited, and can be appropriately selected according to the application.

As described above, the wiring board 10 according to the present embodiment is arranged such that the line widths of the back surface 303 and the front surface 304 of the second wiring 300 are smaller than the line widths of the back surface 201 and the front surface 202 of the first wiring 200, respectively, on the substrate 100, and thus, it is possible to suppress the visibility of the second wiring 300 in a plan view in the D1 direction while maintaining the reliability of the first wiring 200 having the radio wave transmission/reception function. Since the first wiring 200 and the second wiring 300 are arranged such that the line width of the surface in contact with the substrate 100 is larger than the surface facing the side opposite to the surface in contact with the substrate 100, the adhesion between the substrate 100 and each of the first wiring 200 and the second wiring 300 can be improved while suppressing the visibility of the first wiring 200 and the second wiring 300 in a plan view in the D1 direction. Furthermore, a wiring resistance can be suppressed by increasing each cross-sectional area of the first wiring 200 and the second wiring 300 that intersects perpendicularly with the direction in which each wiring extends. Thus, the transparency, the reliability, and the conductivity of the wiring board 10 can be improved.

The wiring board 10 according to the present embodiment can be mounted on a display device as a wireless communication module by being connected to a wireless communication circuit. The wiring board 10 is arranged on an upper surface of a display region such that the substrate 100 faces the display region of the display device so that it is possible to suppress the visibility of the first wiring 200 and the second wiring 300 in a plan view in the D1 direction. Thus, it is possible to provide the display device including the wiring board having the radio wave transmission/reception function with improved transparency, reliability, and conductivity.

When the wiring board 10 has the radio wave transmission/reception function, the wiring board 10 may have any function of a telephone antenna, a WiFi antenna, a 3G antenna, a 4G antenna, an LTE antenna, a Bluetooth (registered trademark) antenna, and an NFC antenna. Alternatively, the wiring board 10 does not necessarily have the radio wave transmission/reception function, and in this case, the wiring board 10 may serve a function, for example, hovering (a function that enables operation without requiring a user to directly touch a display), fingerprint authentication, a heater, noise cut (shield), or the like.

Next, various modifications of the wiring board according to the present embodiment will be described.

<First Modification>

Figure 2:
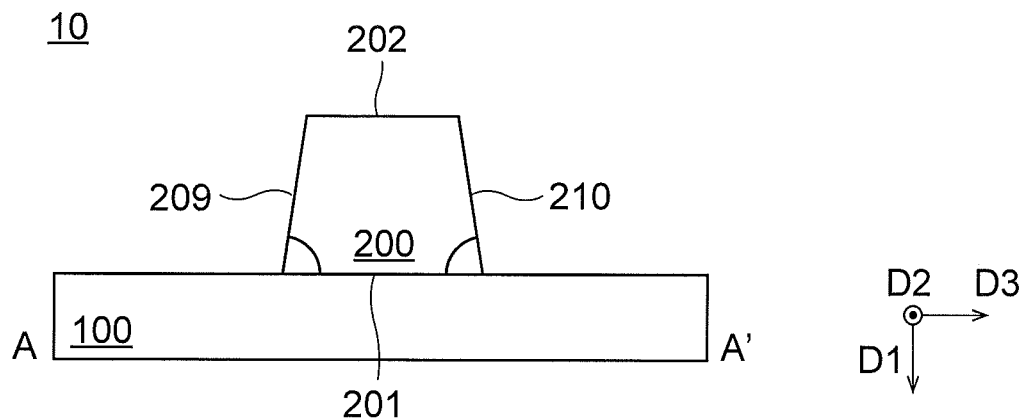
FIG. 2 is a cross-sectional view illustrating an example of the wiring board according to the first embodiment of the present disclosure.
Figure 2:
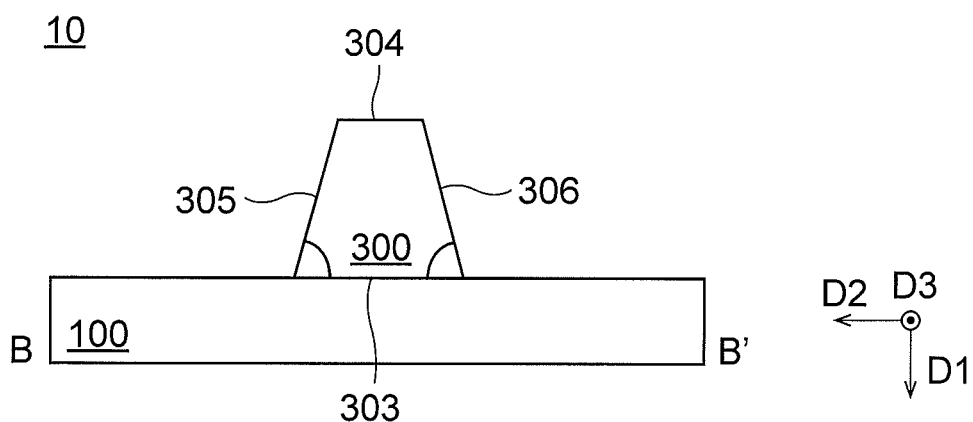

In the mode illustrated in FIGS. 1 and 2, the second wiring 300 is line-symmetric about the longitudinal direction (the D3 direction) in the cross section that intersects perpendicularly with the direction in which the second wiring 300 extends. In the present modification, however, a second wiring 300a is asymmetric about a longitudinal direction (D3 direction) in a cross section that intersects perpendicularly with a direction in which the second wiring 300a extends.

A configuration of a wiring board 10a according to the present modification will be described with reference to FIG. 3. Here, the configuration of the wiring board 10a according to the present modification is the same as the configuration of the wiring board 10 illustrated in FIGS. 1 and 2 except for the cross-sectional shape of the second wiring 300. Thus, detailed descriptions of the same portions as those in the mode illustrated in FIGS. 1 and 2 will be omitted.

[Configuration of Wiring Board]

Figure 3:
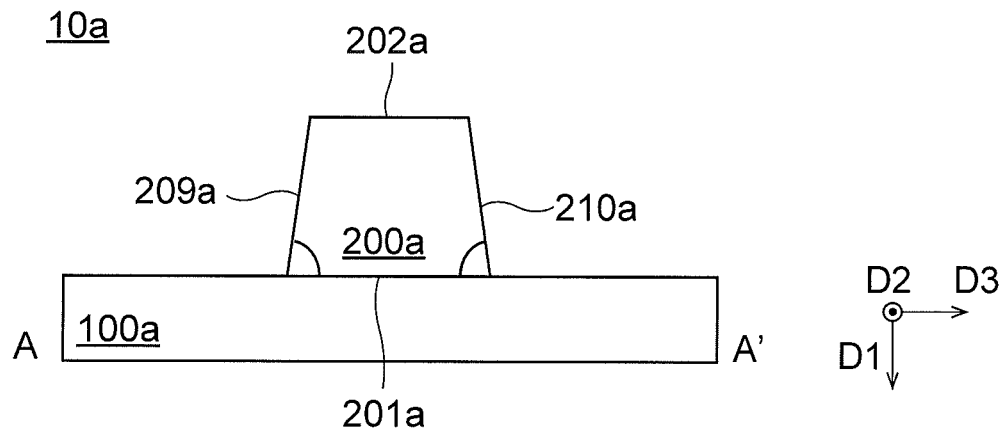
FIG. 3 is a cross-sectional view illustrating a first modification of the wiring board according to the first embodiment of the present disclosure.
Figure 3:
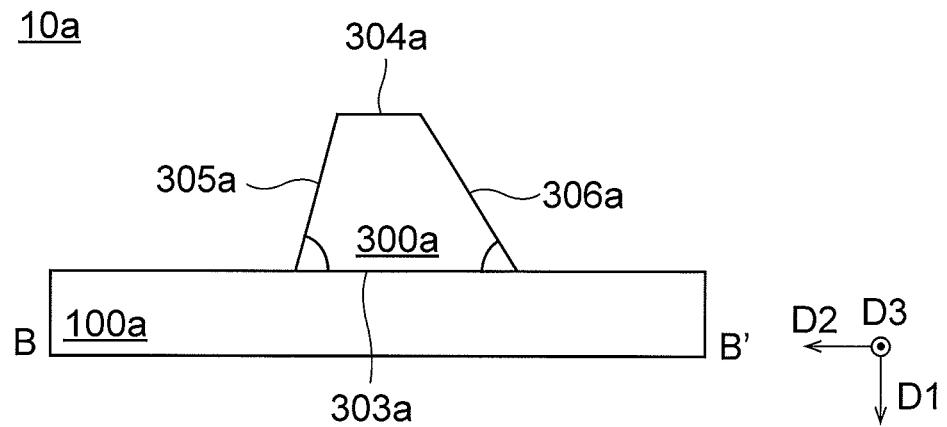

FIG. 3 is a cross-sectional view illustrating an example of the wiring board according to the present modification. The wiring board 10a according to the present modification includes a substrate 100a, a first wiring 200a, and the second wiring 300a, which is similar to the mode illustrated in FIG. 1. FIG. 3(A) is an enlarged cross-sectional view taken along a chain line A-A' of FIG. 1. FIG. 3(B) is an enlarged cross-sectional view taken along a chain line B-B' of FIG. 1.

As illustrated in FIG. 3(A), the first wiring 200a has a back surface (first surface) 201a in contact with the substrate 100a, and a front surface (second surface) 202a facing the opposite side of the back surface 201a. As illustrated in FIG. 3(B), the second wiring 300a has a back surface (third surface) 303a in contact with the substrate 100a, and a front surface (fourth surface) 304a facing the opposite side of the back surface 303a. As illustrated in FIGS. 3(A) and 3(B), a line width of the front surface 304a of the second wiring 300a is smaller than a line width of the front surface 202a of the first wiring 200a. Further, a line width of the back surface 303a of the second wiring 300a is smaller than a line width of the back surface 201a of the first wiring 200a. With the arrangement in which the line widths of the front surface 304a and the back surface 303a of the second wiring 300a are smaller than the line widths of the front surface 202a and the back surface 201a of the first wiring 200a, respectively, it is possible to suppress the visibility of the spare second wiring 300a corresponding to the disconnection of the first wiring 200a or the like while maintaining reliability of the first wiring 200a having a radio wave transmission/reception function. Thus, a conductivity and transparency of the wiring board 10a can be improved.

As illustrated in FIG. 3(A), the line width of the back surface 201a of the first wiring 200a is larger than the line width of the front surface 202a of the first wiring 200a. As illustrated in FIG. 3(B), the line width of the back surface 303a of the second wiring 300a is larger than the line width of the front surface 304a of the second wiring 300a. Since the first wiring 200a and the second wiring 300a are arranged such that the line width of the surface in contact with the substrate 100a is larger than the line width of the surface facing the side opposite to the surface in contact with the substrate 100a, the adhesion between the substrate 100a and each of the first wiring 200a and the second wiring 300a can be improved while suppressing the visibility of the first wiring 200a and the second wiring 300a in a plan view in a D1 direction. Furthermore, a wiring resistance can be suppressed by increasing the area of each cross section of the first wiring 200a and the second wiring 300a that intersects perpendicularly with the direction in which each wiring extends. Thus, the transparency, the reliability, and the conductivity of the wiring board 10a can be improved.

As illustrated in FIG. 3(A), the first wiring 200a has a pair of side surfaces (ninth and tenth surfaces) 209a and 210a which extend in the direction of the first wiring 200a and are adjacent to the back surface 201a. In the first wiring 200a, an angle between the back surface 201a and one side surface 209a and an angle between the back surface 201a and the other side surface 210a are acute angles. In the first wiring 200a, the angle between the back surface 201a and the pair of side surfaces 209a is the same as the angle between the back surface 201a and the other side surface 210a. That is, in a cross section that intersects perpendicularly with a direction in which the first wiring 200a extends, the first wiring 200a is line-symmetric about the extending direction (the D2 direction).

As illustrated in FIG. 3(B), the second wiring 300a has a pair of side surfaces (fifth and sixth surfaces) 305a and 306a which extend in the direction of the second wiring 300a and are adjacent to the back surface 303a. In the second wiring 300a, an angle between the back surface 303a and one side surface 305a and an angle between the back surface 303a and the other side surface 306a are acute angles. In the second wiring 300a, the angle between the back surface 303a and the other side surface 306a is smaller than the angle between the back surface 303a and the one side surface 305a. That is, in a cross section that intersects perpendicularly with the direction in which the second wiring 300a extends, the second wiring 300a is asymmetric about the extending direction (the D3 direction). With the arrangement in which the angle between the back surface 303a and the other side surface 306a is smaller than the angle between the back surface 303a and the one side surface 305a in the second wiring 300a, the line width of the back side 303a becomes large, and it is possible to improve the adhesion between the substrate 100a and the second wiring 300a while suppressing the visibility of the one side surface 305a of the second wiring 300a in a plan view in the D1 direction. Furthermore, a wiring resistance can be suppressed by increasing a cross-sectional area of the second wiring 300a that intersects perpendicularly with the direction in which the wiring extends. Thus, the transparency, the reliability, and the conductivity of the wiring board 10a can be improved.

As described above, the wiring board 10a according to the present modification is arranged such that the line widths of the back surface 303a and the front surface 304a of the second wiring 300a are smaller than the line widths of the back surface 201a and the front surface 202a of the first wiring 200a, respectively, on the substrate 100a, and thus, it is possible to suppress the visibility of the second wiring 300a in a plan view in the D1 direction while maintaining the reliability of the first wiring 200a having the radio wave transmission/reception function. Since the first wiring 200a and the second wiring 300a are arranged such that the line width of the surface in contact with the substrate 100a is larger than the surface facing the side opposite to the surface in contact with the substrate 100a, the adhesion between the substrate 100a and each of the first wiring 200a and the second wiring 300a can be improved while suppressing the visibility of the first wiring 200a and the second wiring 300a in a plan view in a D1 direction. With the arrangement in which the angle between the back surface 303a and the other side surface 306a is smaller than the angle between the back surface 303a and the one side surface 305a in the second wiring 300a, it is possible to improve the adhesion between the substrate 100a and the second wiring 300a while suppressing the visibility of the one side surface 305a of the second wiring 300a in a plan view in the D1 direction. Furthermore, a wiring resistance can be suppressed by increasing each cross-sectional area of the first wiring 200a and the second wiring 300a that intersects perpendicularly with the direction in which each wiring extends. Thus, the transparency, the reliability, and the conductivity of the wiring board 10a can be improved.

The wiring board 10a according to the present modification can be mounted on a display device as a wireless communication module by being connected to a wireless communication circuit. The wiring board 10a is arranged on an upper surface of a display region such that the substrate 100a faces the display region of the display device so that it is possible to suppress the visibility of the first wiring 200a and the second wiring 300a in a plan view in the D1 direction. The wiring board 10a is arranged such that a direction of the first wiring 200a is a vertical direction of the display region and the one side surface 305a of the second wiring 300a is in the upper direction of the display region (light incident direction) so that the reflection of light by the other side surface 306a of the second wiring 300a can be suppressed. Thus, it is possible to provide the display device including the wiring board having the radio wave transmission/reception function with improved transparency, reliability, and conductivity.

<Second Modification>

In the mode illustrated in FIGS. 1 and 2, the second wiring 300 is line-symmetric with respect to the longitudinal direction (the D3 direction) in the cross section that intersects perpendicularly with the direction in which the second wiring 300 extends. In the present modification, however, a second wiring 300b is asymmetric about a longitudinal direction (D3 direction) in a cross section that intersects perpendicularly with a direction in which the second wiring 300b extends.

A configuration of a wiring board 10b according to the present modification will be described with reference to FIG. 4. Here, the configuration of the wiring board 10b according to the present modification is the same as the configuration of the wiring board 10 illustrated in FIGS. 1 and 2 except for the cross-sectional shape of the second wiring 300. Thus, detailed descriptions of the same portions as those in the mode illustrated in FIGS. 1 and 2 will be omitted.

[Configuration of Wiring Board]

Figure 4:
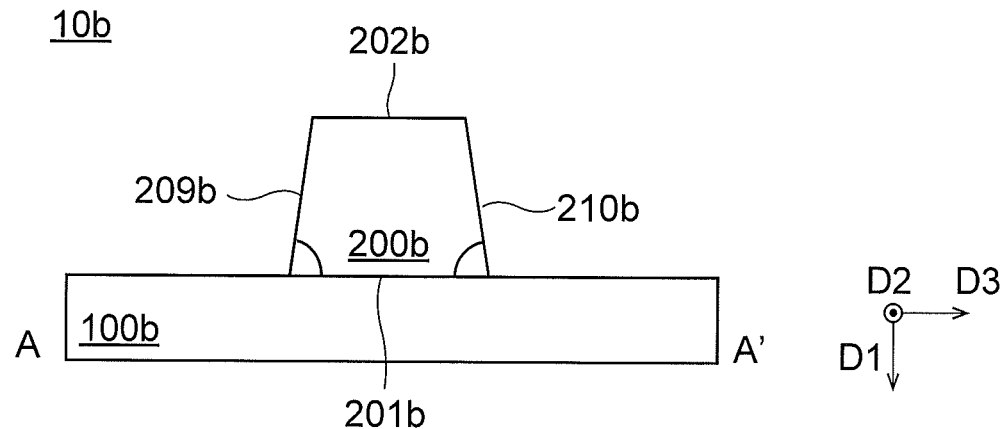
FIG. 4 is a cross-sectional view illustrating a second modification of the wiring board according to the first embodiment of the present disclosure.
Figure 4:
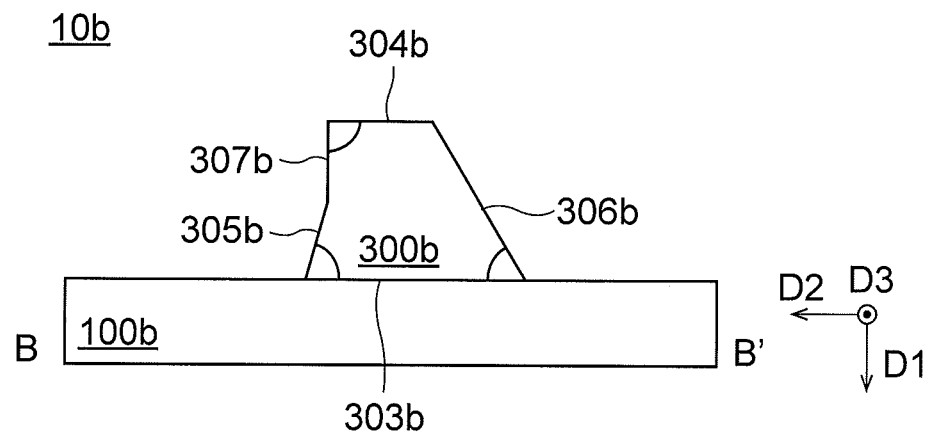

FIG. 4 is a cross-sectional view illustrating an example of the wiring board according to the present modification. The wiring board 10b according to the present modification includes a substrate 100b, a first wiring 200b, and the second wiring 300b, which is similar to the mode illustrated in FIG. 1. FIG. 4(A) is an enlarged cross-sectional view taken along the chain line A-A' of FIG. 1. FIG. 4(B) is an enlarged cross-sectional view taken along the chain line B-B' of FIG. 1.

As illustrated in FIG. 4(A), the first wiring 200b has a back surface (first surface) 201b in contact with the substrate 100b, and a front surface (second surface) 202b facing the opposite side of the back surface 201b. As illustrated in FIG. 4(B), the second wiring 300b has a back surface (third surface) 303b in contact with the substrate 100b, and a front surface (fourth surface) 304b facing the opposite side of the back surface 303b. As illustrated in FIGS. 4(A) and 4(B), a line width of the front surface 304b of the second wiring 300b is smaller than a line width of the front surface 202b of the first wiring 200b. Further, a line width of the back surface 303b of the second wiring 300b is smaller than a line width of the back surface 201b of the first wiring 200b. With the arrangement in which the line widths of the front surface 304b and the back surface 303b of the second wiring 300b are smaller than the line widths of the front surface 202b and the back surface 201b of the first wiring 200b, respectively, it is possible to suppress the visibility of the spare second wiring 300b corresponding to the disconnection of the first wiring 200b or the like while maintaining reliability of the first wiring 200b having a radio wave transmission/reception function. Thus, a conductivity and transparency of the wiring board 10b can be improved.

As illustrated in FIG. 4(A), the line width of the back surface 201b of the first wiring 200b is larger than the line width of the front surface 202b of the first wiring 200b. As illustrated in FIG. 4(B), the line width of the back surface 303b of the second wiring 300b is larger than the line width of the front surface 304b of the second wiring 300b. Since the first wiring 200b and the second wiring 300b are arranged such that the line width of the surface in contact with the substrate 100b is larger than the line width of the surface facing the side opposite to the surface in contact with the substrate 100b, the adhesion between the substrate 100b and each of the first wiring 200b and the second wiring 300b can be improved while suppressing the visibility of the first wiring 200b and the second wiring 300b in a plan view in the D1 direction. Furthermore, a wiring resistance can be suppressed by increasing the area of each cross section of the first wiring 200b and the second wiring 300b that intersects perpendicularly with the direction in which each wiring extends. Thus, the transparency, the reliability, and the conductivity of the wiring board 10b can be improved.

As illustrated in FIG. 4(A), the first wiring 200b has a pair of side surfaces (ninth and tenth surfaces) 209b and 210b which extend in the direction of the first wiring 200b and are adjacent to the back surface 201b. In the first wiring 200b, an angle between the back surface 201b and one side surface 209b and an angle between the back surface 201b and the other side surface 210b are acute angles. In the first wiring 200b, the angle between the back surface 201b and the one side surface 209b is the same as the angle between the back surface 201b and the other side surface 210b. That is, in a cross section that intersects perpendicularly with a direction in which the first wiring 200b extends, the first wiring 200b is line-symmetric about the extending direction (the D2 direction).

As illustrated in FIG. 4(B), the second wiring 300b has a pair of side surfaces (fifth and sixth surfaces) 305b and 306b which extend in the direction of the second wiring 300b and are adjacent to the back surface 303b. In the second wiring 300b, an angle between the back surface 303b and one side surface 305b and an angle between the back surface 303b and the other side surface 306b are acute angles. In the second wiring 300b, the angle between the back surface 303b and the other side surface 306b is smaller than the angle between the back surface 303b and the one side surface 305b. The one side surface 305b of the second wiring 300b according to the present modification is recessed inward (toward the negative side in the D2 direction). The one side surface 305b includes an upper side surface (seventh surface) 307b adjacent to the front surface 304b. In FIG. 4(B), an angle between the front surface 304b and the upper side surface 307b is about 90°. However, the configuration is not limited thereto, and it is sufficient for the angle between the front surface 304b and the upper side surface 307b to be smaller than an external angle of the angle between the back surface 303b and the one side surface 305b (an angle obtained by subtracting the angle between the back surface 303b and the one side surface 305b from 180°). The angle between the front surface 304b and the upper side surface 307b is preferably in a range of 60° or more and 90° or less. That is, the one side surface 305b of the second wiring 300b includes a shape (the upper side surface 307b) that is connected to the front surface 304b at an angle smaller than the external angle of the angle between the back surface 303b and the one side surface 305b. However, the configuration is not limited thereto, and the one side surface 305b may further include a different surface, and the respective surfaces forming the one side surface 305b may form a corner (intersection line) or may be continuously connected by a curved surface. In a cross section that intersects perpendicularly with a direction in which the second wiring 300b extends, the second wiring 300b is asymmetric about the extending direction (the D3 direction).

With the arrangement in which the angle between the back surface 303b and the other side surface 306b is smaller than the angle between the back surface 303b and the one side surface 305b in the second wiring 300b, the line width of the back side 303b becomes large, and it is possible to improve the adhesion between the substrate 100b and the second wiring 300b while suppressing the visibility of the one side surface 305b of the second wiring 300b in a plan view in the D1 direction. Since the angle between the front surface 304b and the upper side surface 307b is smaller than the external angle of the angle between the back surface 303b and the one side surface 305b in the second wiring 300b, the visibility of the upper side surface 307b of the second wiring 300b in a plan view in the D1 direction can be suppressed. Furthermore, a wiring resistance can be suppressed by increasing a cross-sectional area of the second wiring 300b that intersects perpendicularly with the direction in which the wiring extends. Thus, the transparency, the reliability, and the conductivity of the wiring board 10b can be improved.

As described above, the wiring board 10b according to the present modification is arranged such that the line widths of the back surface 303b and the front surface 304b of the second wiring 300b are smaller than the line widths of the back surface 201b and the front surface 202b of the first wiring 200b, respectively, on the substrate 100b, and thus, it is possible to suppress the visibility of the second wiring 300b in a plan view in the D1 direction while maintaining the reliability of the first wiring 200b having the radio wave transmission/reception function. Since the first wiring 200b and the second wiring 300b are arranged such that the line width of the surface in contact with the substrate 100b is larger than the surface facing the side opposite to the surface in contact with the substrate 100b, the adhesion between the substrate 100b and each of the first wiring 200b and the second wiring 300b can be improved while suppressing the visibility of the first wiring 200b and the second wiring 300b in a plan view in the D1 direction. With the arrangement in which the angle between the back surface 303b and the other side surface 306b is smaller than the angle between the back surface 303b and the one side surface 305b in the second wiring 300b, it is possible to improve the adhesion between the substrate 100b and the second wiring 300b while suppressing the visibility of the one side surface 305b of the second wiring 300b in a plan view in the D1 direction. Since the angle between the front surface 304b and the upper side surface 307b is smaller than the external angle of the angle between the back surface 303b and the one side surface 305b in the second wiring 300b, the visibility of the upper side surface 307b of the second wiring 300b in a plan view in the D1 direction can be suppressed. Furthermore, a wiring resistance can be suppressed by increasing each cross-sectional area of the first wiring 200b and the second wiring 300b that intersects perpendicularly with the direction in which each wiring extends. Thus, the transparency, the reliability, and the conductivity of the wiring board 10b can be improved.

The wiring board 10b according to the present modification can be mounted on a display device as a wireless communication module by being connected to a wireless communication circuit. The wiring board 10b is arranged on an upper surface of a display region such that the substrate 100b faces the display region of the display device so that it is possible to suppress the visibility of the first wiring 200b and the second wiring 300b in a plan view in the D1 direction. The wiring board 10b is arranged such that a direction of the first wiring 200b is a vertical direction of the display region and the upper side surface 307b of the second wiring 300b is in the upper direction of the display region (light incident direction) so that the reflection of light by the other side surface 306b of the second wiring 300b can be suppressed. Thus, it is possible to provide the display device including the wiring board having the radio wave transmission/reception function with improved transparency, reliability, and conductivity.

<Third Modification>

In the mode illustrated in FIGS. 1 and 2, the second wiring 300 is line-symmetric with respect to the longitudinal direction (the D3 direction) in the cross section that intersects perpendicularly with the direction in which the second wiring 300 extends. In the present modification, however, a second wiring 300c is asymmetric about a longitudinal direction (D3 direction) in a cross section that intersects perpendicularly with a direction in which the second wiring 300c extends.

A configuration of a wiring board 10c according to the present modification will be described with reference to FIG. 5. Here, the configuration of the wiring board 10c according to the present modification is the same as the configuration of the wiring board 10 illustrated in FIGS. 1 and 2 except for the cross-sectional shapes of the first wiring 200 and the second wiring 300. Thus, detailed descriptions of the same portions as those in the mode illustrated in FIGS. 1 and 2 will be omitted.

[Configuration of Wiring Board]

Figure 5:
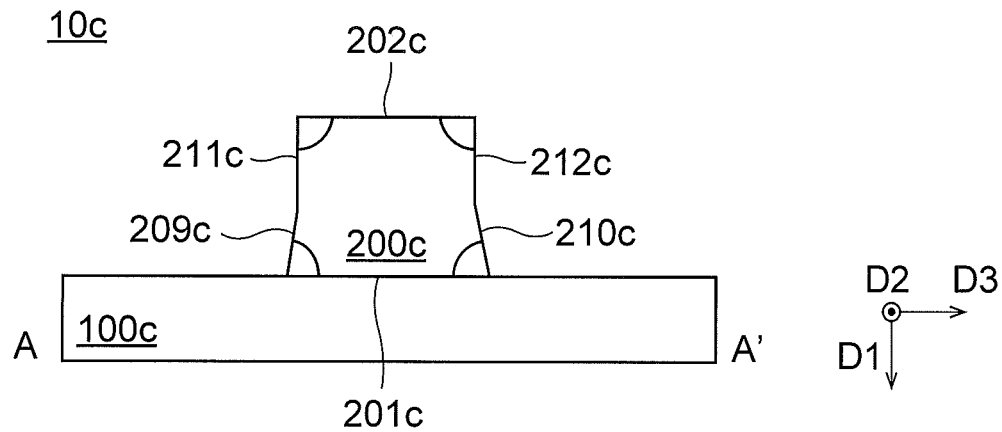
FIG. 5 is a cross-sectional view illustrating a third modification of the wiring board according to the first embodiment of the present disclosure.
Figure 5:
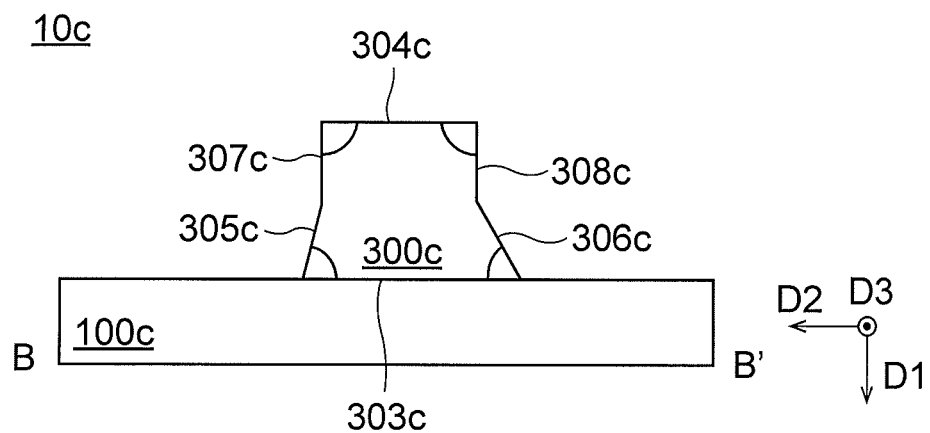

FIG. 5 is a cross-sectional view illustrating an example of the wiring board according to the present modification. The wiring board 10c according to the present modification includes a substrate 100c, a first wiring 200c, and the second wiring 300c, which is similar to the mode illustrated in FIG. 1. FIG. 5(A) is an enlarged cross-sectional view taken along the chain line A-A' of FIG. 1. FIG. 5(B) is an enlarged cross-sectional view taken along the chain line B-B' of FIG. 1.

As illustrated in FIG. 5(A), the first wiring 200c has a back surface (first surface) 201c in contact with the substrate 100c, and a front surface (second surface) 202c facing the opposite side of the back surface 201c. As illustrated in FIG. 5(B), the second wiring 300c has a back surface (third surface) 303c in contact with the substrate 100c, and a front surface (fourth surface) 304c facing the opposite side of the back surface 303c. As illustrated in FIGS. 5(A) and 5(B), a line width of the front surface 304c of the second wiring 300c is smaller than a line width of the front surface 202c of the first wiring 200c. Further, a line width of the back surface 303c of the second wiring 300c is smaller than a line width of the back surface 201c of the first wiring 200c. With the arrangement in which the line widths of the front surface 304c and the back surface 303c of the second wiring 300c are smaller than the line widths of the front surface 202c and the back surface 201c of the first wiring 200c, respectively, it is possible to suppress the visibility of the spare second wiring 300c corresponding to the disconnection of the first wiring 200c or the like while maintaining reliability of the first wiring 200c having a radio wave transmission/reception function. Thus, a conductivity and transparency of the wiring board 10c can be improved.

As illustrated in FIG. 5(A), the line width of the back surface 201c of the first wiring 200c is larger than the line width of the front surface 202c of the first wiring 200c. As illustrated in FIG. 5(B), the line width of the back surface 303c of the second wiring 300c is larger than the line width of the front surface 304c of the second wiring 300c. Since the first wiring 200c and the second wiring 300c are arranged such that the line width of the surface in contact with the substrate 100c is larger than the line width of the surface facing the side opposite to the surface in contact with the substrate 100c, the adhesion between the substrate 100c and each of the first wiring 200c and the second wiring 300c can be improved while suppressing the visibility of the first wiring 200c and the second wiring 300c in a plan view in the D1 direction. Furthermore, a wiring resistance can be suppressed by increasing the area of each cross section of the first wiring 200c and the second wiring 300c that intersects perpendicularly with the direction in which each wiring extends. Thus, the transparency, the reliability, and the conductivity of the wiring board 10c can be improved.

As illustrated in FIG. 5(A), the first wiring 200c has a pair of side surfaces (ninth and tenth surfaces) 209c and 210c which extend in the direction of the first wiring 200c and are adjacent to the back surface 201c. In the first wiring 200c, an angle between the back surface 201c and one side surface 209c and an angle between the back surface 201c and the other side surface 210c are acute angles. In the first wiring 200c, the angle between the back surface 201c and the one side surface 209c is the same as the angle between the back surface 201c and the other side surface 210c. The one side surface 209c of the first wiring 200c according to the present modification is recessed inward (toward the positive side in the D3 direction). The one side surface 209c includes an upper side surface (eleventh surface) 211c adjacent to the front surface 202c. The other side surface 210c of the first wiring 200c is recessed inward (toward the negative side in the D3 direction). The other side surface 210c includes an upper side surface (twelfth surface) 212c adjacent to the front surface 202c. In FIG. 5(A), an angle between the front surface 202c and the upper side surface 211c and an angle between the front surface 202c and the upper side surface 212c are approximately 90°. However, the configuration is not limited thereto, and the angle between the front surface 202c and the upper side surface 211c may be smaller than an external angle of the angle between the back surface 201c and the one side surface 209c. The angle between the front surface 202c and the upper side surface 211c is preferably in a range of 60° or more and 90° or less. It is sufficient for the angle between the front surface 202c and the upper side surface 212c to be smaller than the external angle of the angle between the back surface 201c and the other side surface 210c. The angle between the front surface 202c and the upper side surface 212c is preferably in a range of 60° or more and 90° or less. That is, the one side surface 209c of the first wiring 200c includes a shape (the upper side surface 211c) that is connected to the front surface 202c at an angle smaller than the external angle of the angle between the back surface 201c and the one side surface 209c. The other side surface 210c of the first wiring 200c includes a shape (the upper side surface 212c) that is connected to the front surface 202c at an angle smaller than the external angle of the angle between the back surface 201c and the other side surface 210c. However, the configuration is not limited thereto, and the one side surface 209c and the other side surface 210c may further include different surfaces, and the respective surfaces forming the one side surface 209c and the other side surface 210c may form a corner (intersection line) or may be continuously connected by a curved surface. That is, in a cross section that intersects perpendicularly with a direction in which the first wiring 200c extends, the first wiring 200c is line-symmetric about the extending direction (the D2 direction). Since the angle between the front surface 202c and the upper side surface 211c is smaller than the external angle of the angle between the back surface 201c and the one side surface 209c, and the angle between the front surface 202c and the upper side surface 212c is smaller than the external angle of the angle between the back surface 201c and the other side surface 210c in the first wiring 200c, it is possible to suppress the visibility of the upper side surface 211c and the upper side surface 212c of the first wiring 200c in a plan view in the D1 direction. Furthermore, a wiring resistance can be suppressed by increasing a cross-sectional area of the first wiring 200c that intersects perpendicularly with the direction in which the wiring extends. Thus, the transparency, the reliability, and the conductivity of the wiring board 10c can be improved.

As illustrated in FIG. 5(B), the second wiring 300c has a pair of side surfaces (fifth and sixth surfaces) 305c and 306c which extend in the direction of the second wiring 300c and are adjacent to the back surface 303c. In the second wiring 300c, an angle between the back surface 303c and one side surface 305c and an angle between the back surface 303c and the other side surface 306c are acute angles. In the second wiring 300c, the angle between the back surface 303c and the other side surface 306c is smaller than the angle between the back surface 303c and the one side surface 305c. The one side surface 305c of the second wiring 300c according to the present modification is recessed inward (toward the negative side in the D2 direction). The one side surface 305c includes an upper side surface (seventh surface) 307c adjacent to the front surface 304c. The other side surface 306c of the second wiring 300c is recessed inward (toward the positive side in the D2 direction). The other side surface 306c includes an upper side surface (eighth surface) 308c adjacent to the front surface 304c. In FIG. 5(B), an angle between the front surface 304c and the upper side surface 307c and an angle between the front surface 304c and the upper side surface 308c are approximately 90°. However, the configuration is not limited thereto, and the angle between the front surface 304c and the upper side surface 307c may be smaller than an external angle of the angle between the back surface 303c and the one side surface 305c. The angle between the front surface 304c and the upper side surface 307c is preferably in a range of 60° or more and 90° or less. It is sufficient for the angle between the front surface 304c and the upper side surface 308c to be smaller than the external angle of the angle between the back surface 303c and the other side surface 306c. The angle between the front surface 304c and the upper side surface 308c is preferably in a range of 60° or more and 90° or less. That is, the one side surface 305c of the second wiring 300c includes a shape (the upper side surface 307c) that is connected to the front surface 304c at an angle smaller than the external angle of the angle between the back surface 303c and the one side surface 305c. The other side surface 306c of the second wiring 300c includes a shape (the upper side surface 308c) that is connected to the front surface 304c at an angle smaller than the external angle of the angle between the back surface 303c and the other side surface 306c. However, the configuration is not limited thereto, and the one side surface 305c and the other side surface 306c may further include different surfaces, and the respective surfaces forming the one side surface 305c and the other side surface 306c may form a corner (intersection line) or may be continuously connected by a curved surface. In a cross section that intersects perpendicularly with a direction in which the second wiring 300c extends, the second wiring 300c is asymmetric about the extending direction (the D3 direction). With the arrangement in which the angle between the back surface 303c and the other side surface 306c is smaller than the angle between the back surface 303c and the one side surface 305c in the second wiring 300c, the line width of the back side 303c becomes large, and it is possible to improve the adhesion between the substrate 100c and the second wiring 300c while suppressing the visibility of the one side surface 305c of the second wiring 300c in a plan view in the D1 direction. Since the angle between the front surface 304c and the upper side surface 307c is smaller than the external angle of the angle between the back surface 303c and the one side surface 305c, and the angle between the front surface 304c and the upper side surface 308c is smaller than the external angle of the angle between the back surface 303c and the other side surface 306c in the second wiring 300c, it is possible to suppress the visibility of the upper side surface 307c and the upper side surface 308c of the second wiring 300c in a plan view in the D1 direction. Furthermore, a wiring resistance can be suppressed by increasing a cross-sectional area of the second wiring 300c that intersects perpendicularly with the direction in which the wiring extends. Thus, the transparency, the reliability, and the conductivity of the wiring board 10c can be improved.

As described above, the wiring board 10c according to the present modification is arranged such that the line width of the front surface 304c of the second wiring 300c of the substrate 100c is smaller than the line width of the front surface 202c of the first wiring 200c, and thus, it is possible to suppress the visibility of the second wiring 300c in a plan view in the D1 direction while maintaining the reliability of the first wiring 200c having the radio wave transmission/reception function. Since the first wiring 200c and the second wiring 300c are arranged such that the line width of the surface in contact with the substrate 100c is larger than the surface facing the side opposite to the surface in contact with the substrate 100c, the adhesion between the substrate 100c and each of the first wiring 200c and the second wiring 300c can be improved while suppressing the visibility of the first wiring 200c and the second wiring 300c in a plan view in the D1 direction. Since the angle between the front surface 202c and the upper side surface 211c is smaller than the external angle of the angle between the back surface 201c and the one side surface 209c, and the angle between the front surface 202c and the upper side surface 212c is smaller than the external angle of the angle between the back surface 201c and the other side surface 210c in the first wiring 200c, it is possible to suppress the visibility of the upper side surface 211c and the upper side surface 212c of the first wiring 200c in a plan view in the D1 direction. With the arrangement in which the angle between the back surface 303c and the other side surface 306c is smaller than the angle between the back surface 303c and the one side surface 305c in the second wiring 300c, it is possible to improve the adhesion between the substrate 100c and the second wiring 300c while suppressing the visibility of the one side surface 305c of the second wiring 300c in a plan view in the D1 direction. Since the angle between the front surface 304c and the upper side surface 307c is smaller than the external angle of the angle between the back surface 303c and the one side surface 305c, and the angle between the front surface 304c and the upper side surface 308c is smaller than the external angle of the angle between the back surface 303c and the other side surface 306c in the second wiring 300c, it is possible to suppress the visibility of the upper side surface 307c and the upper side surface 308c of the second wiring 300c in a plan view in the D1 direction. Furthermore, a wiring resistance can be suppressed by increasing each cross-sectional area of the first wiring 200c and the second wiring 300c that intersects perpendicularly with the direction in which each wiring extends. Thus, the transparency, the reliability, and the conductivity of the wiring board 10c can be improved.

Further, since the side surfaces 209c and 210c of the first wiring 200c are recessed inward and the side surfaces 305c and 306c of the second wiring 300c are recessed inward according to the present modification, it is possible to suppress the maximum width as the first wiring 200c and the second wiring 300c are viewed at an oblique viewing angle. As a result, for example, it is possible to make the first wiring 200c and the second wiring 300c less visible on the front surface of the display, and to make it difficult for a user to visually recognize the first wiring 200c and the second wiring 300c with a naked eye. Further, in general, when an alternating current is applied to the wiring, it becomes more difficult for the current to flow to a central portion of the wiring as a frequency becomes higher so that the current flows on the outside surface of the wiring (skin effect). In the present modification, it becomes possible to cause the current to flow over a wide region of the cross sections of the first wiring 200c and the second wiring 300c by recessing the respective side surfaces of the first wiring 200c and the second wiring 300c. Thus, the cross sections of the first wiring 200c and the second wiring 300c can be used efficiently. Furthermore, since the respective side surfaces of the first wiring 200c and the second wiring 300c are recessed, light that is incident obliquely to the D1 direction is hardly reflected in the D1 direction so that it is possible to make it difficult to recognize the first wiring 200c and the second wiring 300c with the naked eye.

The wiring board 10c according to the present modification can be mounted on a display device as a wireless communication module by being connected to a wireless communication circuit. The wiring board 10c is arranged on an upper surface of a display region such that the substrate 100c faces the display region of the display device so that it is possible to suppress the visibility of the first wiring 200c and the second wiring 300c in a plan view in the D1 direction. The wiring board 10c is arranged such that a direction of the first wiring 200 is a vertical direction of the display region and the upper side surface 307c of the second wiring 300c is in the upper direction of the display region (light incident direction) so that the reflection of light by the other side surface 306c of the second wiring 300c can be suppressed. Thus, it is possible to provide the display device including the wiring board having the radio wave transmission/reception function with improved transparency, reliability, and conductivity.

<Fourth Modification>

In the mode illustrated in FIGS. 1 and 2, the second wiring 300 is line-symmetric with respect to the longitudinal direction (the D3 direction) in the cross section that intersects perpendicularly with the direction in which the second wiring 300 extends. In the present modification, however, a second wiring 300d is asymmetric about a longitudinal direction (D3 direction) in a cross section that intersects perpendicularly with a direction in which the second wiring 300d extends.

A configuration of a wiring board 10d according to the present modification will be described with reference to FIG. 6. Here, the configuration of the wiring board 10d according to the modification is the same as the configuration of the wiring board 10 illustrated in FIGS. 1 and 2 except for the cross-sectional shapes of the first wiring 200 and the second wiring 300. Thus, detailed descriptions of the same portions as those in the mode illustrated in FIGS. 1 and 2 will be omitted.

[Configuration of Wiring Board]

Figure 6:
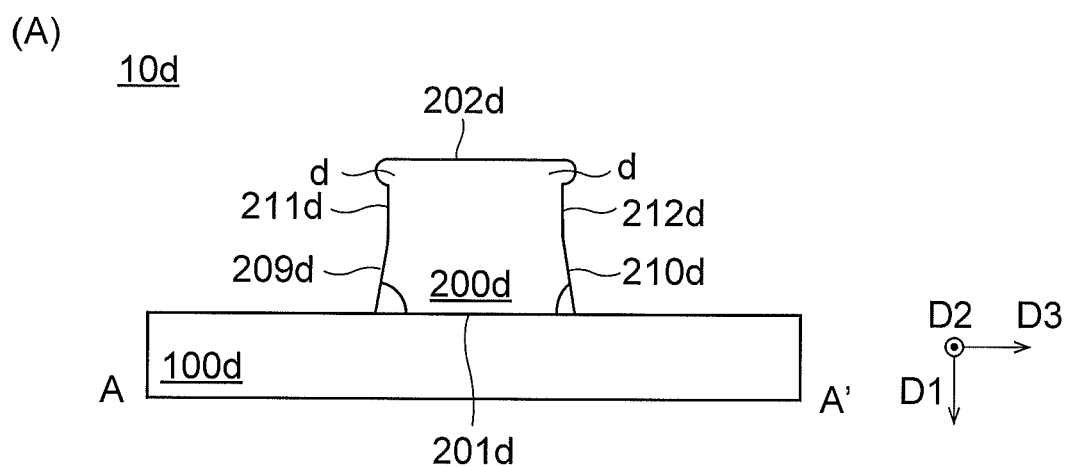
FIG. 6 is a cross-sectional view illustrating a fourth modification of the wiring board according to the first embodiment of the present disclosure.
Figure 6:
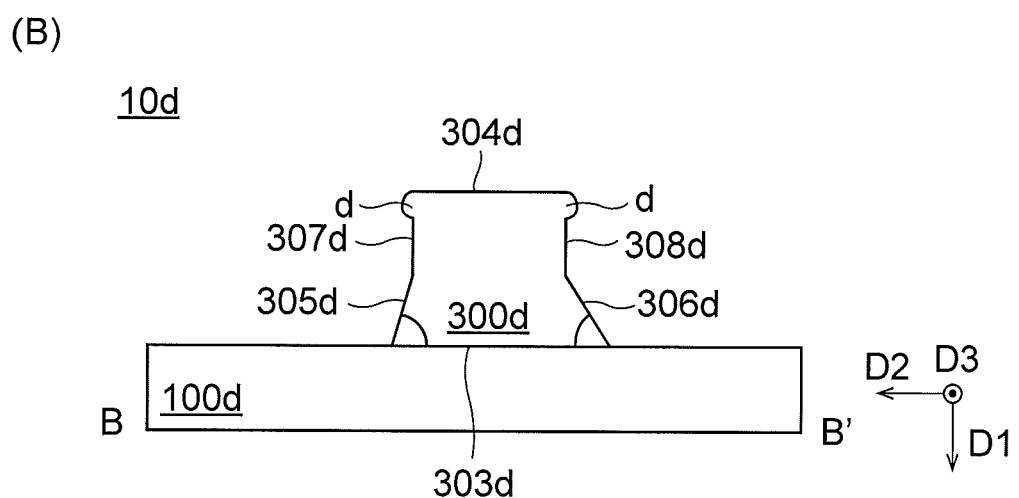

FIG. 6 is a cross-sectional view illustrating an example of the wiring board according to the present modification. The wiring board 10d according to the present modification includes a substrate 100d, a first wiring 200d, and the second wiring 300d, which is similar to the mode illustrated in FIG. 1. FIG. 6(A) is an enlarged cross-sectional view taken along the chain line A-A' of FIG. 1. FIG. 6(B) is an enlarged cross-sectional view taken along the chain line B-B' of FIG. 1.

As illustrated in FIG. 6(A), the first wiring 200d has a back surface (first surface) 201d in contact with the substrate 100d, and a front surface (second surface) 202d facing the opposite side of the back surface 201d. As illustrated in FIG. 6(B), the second wiring 300d has a back surface (third surface) 303d in contact with the substrate 100d and a front surface (fourth surface) 304d facing the opposite side of the back surface 303d. As illustrated in FIGS. 6(A) and 6(B), a line width of the front surface 304d of the second wiring 300d is smaller than a line width of the front surface 202d of the first wiring 200d. A line width of the back surface 303d of the second wiring 300d is smaller than a line width of the back surface 201d of the first wiring 200d. With the arrangement in which the line widths of the front surface 304d and the back surface 303d of the second wiring 300d are smaller than the line widths of the front surface 202d and the back surface 201d of the first wiring 200d, respectively, it is possible to suppress the visibility of the spare second wiring 300d corresponding to the disconnection of the first wiring 200d or the like while maintaining reliability of the first wiring 200d having a radio wave transmission/reception function. Thus, a conductivity and transparency of the wiring board 10d can be improved.

As illustrated in FIG. 6(A), the line width of the back surface 201d of the first wiring 200d is larger than the line width of the front surface 202d of the first wiring 200d. As illustrated in FIG. 6(B), the line width of the back surface 303d of the second wiring 300d is larger than the line width of the front surface 304d of the second wiring 300d. Since the first wiring 200d and the second wiring 300d are arranged such that the line width of the surface in contact with the substrate 100d is larger than the line width of the surface facing the side opposite to the surface in contact with the substrate 100d, the adhesion between the substrate 100d and each of the first wiring 200d and the second wiring 300d can be improved while suppressing the visibility of the first wiring 200d and the second wiring 300d in a plan view in the D1 direction. Furthermore, a wiring resistance can be suppressed by increasing the area of each cross section of the first wiring 200d and the second wiring 300d that intersects perpendicularly with the direction in which each wiring extends. Thus, the transparency, the reliability, and the conductivity of the wiring board 10d can be improved.

As illustrated in FIG. 6(A), the first wiring 200d has a pair of side surfaces (ninth and tenth surfaces) 209d and 210d which extend in the direction of the first wiring 200d and are adjacent to the back surface 201d. In the first wiring 200d, an angle between the back surface 201d and one side surface 209d and an angle between the back surface 201d and the other side surface 210d are acute angles. In the first wiring 200d, the angle between the back surface 201d and the one side surface 209d is the same as the angle between the back surface 201d and the other side surface 210d. The one side surface 209d of the first wiring 200d according to the present modification is recessed inward (toward the positive side in the D3 direction). The one side surface 209d includes an upper side surface (eleventh surface) 211d adjacent to the front surface 202d. The other side surface 210d of the first wiring 200d is recessed inward (toward the negative side in the D3 direction). The other side surface 210d includes an upper side surface (twelfth surface) 212d adjacent to the front surface 202d. In FIG. 6(A), an angle between the front surface 202d and the upper side surface 211d and an angle between the front surface 202d and the upper side surface 212d are approximately 90°. However, the configuration is not limited thereto, and the angle between the front surface 202d and the upper side surface 211d may be smaller than an external angle of the angle between the back surface 201d and the one side surface 209d. The angle between the front surface 202d and the upper side surface 211d is preferably in a range of 60° or more and 90° or less. It is sufficient for the angle between the front surface 202d and the upper side surface 212d to be smaller than the external angle of the angle between the back surface 201d and the other side surface 210d. The angle between the front surface 202d and the upper side surface 212d is preferably in a range of 60° or more and 90° or less. That is, the one side surface 209d of the first wiring 200d includes a shape (the upper side surface 211d) that is connected to the front surface 202d at an angle smaller than the external angle of the angle between the back surface 201d and the one side surface 209d. The other side surface 210d of the first wiring 200d includes a shape (the upper side surface 212d) that is connected to the front surface 202d at an angle smaller than the external angle of the angle between the back surface 201d and the other side surface 210d. However, the configuration is not limited thereto, and the one side surface 209d and the other side surface 210d may further include different surfaces, and the respective surfaces forming the one side surface 209d and the other side surface 210d may form a corner (intersection line) or may be continuously connected by a curved surface. The first wiring 200d according to the present modification further includes a protrusion d that extends in a direction orthogonal to the direction of the first wiring 200d and protrudes in a surface direction of the front surface between the front surface 202d and an adjacent surface. That is, the first wiring 200d has the protrusions d protruding in the D3 direction between the front surface 202d and the upper side surface 211d and between the front surface 202d and the upper side surface 212d. That is, in a cross section that intersects perpendicularly with a direction in which the first wiring 200d extends, the first wiring 200d is line-symmetric about the extending direction (the D2 direction). Since the angle between the front surface 202d and the upper side surface 211d is smaller than the external angle of the angle between the back surface 201d and the one side surface 209d, and the angle between the front surface 202d and the upper side surface 212d is smaller than the external angle of the angle between the back surface 201d and the other side surface 210d in the first wiring 200d, it is possible to suppress the visibility of the upper side surface 211d and the upper side surface 212d of the first wiring 200d in a plan view in the D1 direction. Furthermore, a wiring resistance can be suppressed by increasing a cross-sectional area of the first wiring 200d that intersects perpendicularly with the direction in which the wiring extends. Thus, the transparency, the reliability, and the conductivity of the wiring board 10d can be improved.

As illustrated in FIG. 6(B), the second wiring 300d has a pair of side surfaces (fifth and sixth surfaces) 305d and 306d which extend in the direction of the second wiring 300d and are adjacent to the back surface 303d. In the second wiring 300d, an angle between the back surface 303d and one side surface 305d and an angle between the back surface 303d and the other side surface 306d are acute angles. In the second wiring 300d, the angle between the back surface 303d and the other side surface 306d is smaller than the angle between the back surface 303d and the one side surface 305d. The one side surface 305d of the second wiring 300d according to the present modification is recessed inward (toward the negative side in the D2 direction). The one side surface 305d includes an upper side surface (seventh surface) 307d adjacent to the front surface 304d. The other side surface 306d of the second wiring 300d is recessed inward (toward the positive side in the D2 direction). The other side surface 306d includes an upper side surface (eighth surface) 308d adjacent to the front surface 304d. In FIG. 6(B), an angle between the front surface 304d and the upper side surface 307d and an angle between the front surface 304d and the upper side surface 308d are approximately 90°. However, the configuration is not limited thereto, and the angle between the front surface 304d and the upper side surface 307d may be smaller than an external angle of the angle between the back surface 303d and the one side surface 305d. The angle between the front surface 304d and the upper side surface 307d is preferably in a range of 60° or more and 90° or less. It is sufficient for the angle between the front surface 304d and the upper side surface 308d to be smaller than the external angle between the back surface 303d and the other side surface 306d. The angle between the front surface 304d and the upper side surface 308d is preferably in a range of 60° or more and 90° or less. That is, the one side surface 305d of the second wiring 300d includes a shape (the upper side surface 307d) that is connected to the front surface 304d at an angle smaller than the external angle of the angle between the back surface 303d and the one side surface 305d. The other side surface 306d of the second wiring 300d includes a shape (the upper side surface 308d) that is connected to the front surface 304d at an angle smaller than the external angle of the angle between the back surface 303d and the other side surface 306d. However, the configuration is not limited thereto, and the one side surface 305d and the other side surface 306d may further include different surfaces, and the respective surfaces forming the one side surface 305d and the other side surface 306d may form a corner (intersection line) or may be continuously connected by a curved surface. The second wiring 300d according to the present modification further includes the protrusion d that extends in a direction orthogonal to the direction of the second wiring 300d and protrudes in a surface direction of the front surface between the front surface 304d and an adjacent surface. That is, the second wiring 300d has the protrusions d protruding in the D2 direction between the front surface 304d and the upper side surface 307d and between the front surface 202d and the upper side surface 308d. In a cross section that intersects perpendicularly with a direction in which the second wiring 300d extends, the second wiring 300d is asymmetric about the extending direction (the D3 direction). With the arrangement in which the angle between the back surface 303d and the other side surface 306d is smaller than the angle between the back surface 303d and the one side surface 305d in the second wiring 300d, the line width of the back side 303d becomes large, and it is possible to improve the adhesion between the substrate 100d and the second wiring 300d while suppressing the visibility of the one side surface 305d of the second wiring 300d in a plan view in the D1 direction. Since the angle between the front surface 304d and the upper side surface 307d is smaller than the external angle of the angle between the back surface 303d and the one side surface 305d, and the angle between the front surface 304d and the upper side surface 308d is smaller than the external angle of the angle between the back surface 303d and the other side surface 306d in the second wiring 300d, it is possible to suppress the visibility of the upper side surface 307d and the upper side surface 308d of the second wiring 300d in a plan view in the D1 direction. Furthermore, a wiring resistance can be suppressed by increasing a cross-sectional area of the second wiring 300d that intersects perpendicularly with the direction in which the wiring extends. Thus, the transparency, the reliability, and the conductivity of the wiring board 10d can be improved.

As described above, the wiring board 10d according to the present modification is arranged such that the line width of the front surface 304d of the second wiring 300d of the substrate 100d is smaller than the line width of the front surface 202d of the first wiring 200d, and thus, it is possible to suppress the visibility of the second wiring 300d in a plan view in the D1 direction while maintaining the reliability of the first wiring 200d having the radio wave transmission/reception function. Since the first wiring 200d and the second wiring 300d are arranged such that the line width of the surface in contact with the substrate 100d is larger than the surface facing the side opposite to the surface in contact with the substrate 100d, the adhesion between the substrate 100d and each of the first wiring 200d and the second wiring 300d can be improved while suppressing the visibility of the first wiring 200d and the second wiring 300d in a plan view in the D1 direction. Since the angle between the front surface 202d and the upper side surface 211d is smaller than the external angle of the angle between the back surface 201d and the one side surface 209d, and the angle between the front surface 202d and the upper side surface 212d is smaller than the external angle of the angle between the back surface 201d and the other side surface 210d in the first wiring 200d, it is possible to suppress the visibility of the upper side surface 211d and the upper side surface 212d of the first wiring 200d in a plan view in the D1 direction. With the arrangement in which the angle between the back surface 303d and the other side surface 306d is smaller than the angle between the back surface 303d and the one side surface 305d in the second wiring 300d, it is possible to improve the adhesion between the substrate 100d and the second wiring 300d while suppressing the visibility of the one side surface 305d of the second wiring 300d in a plan view in the D1 direction. Since the angle between the front surface 304d and the upper side surface 307d is smaller than the external angle of the angle between the back surface 303d and the one side surface 305d, and the angle between the front surface 304d and the upper side surface 308d is smaller than the external angle of the angle between the back surface 303d and the other side surface 306d in the second wiring 300d, it is possible to suppress the visibility of the upper side surface 307d and the upper side surface 308d of the second wiring 300d in a plan view in the D1 direction. Furthermore, a wiring resistance can be suppressed by increasing each cross-sectional area of the first wiring 200d and the second wiring 300d that intersects perpendicularly with the direction in which each wiring extends. Thus, the transparency, the reliability, and the conductivity of the wiring board 10d can be improved.

The wiring board 10d according to the present modification can be mounted on a display device as a wireless communication module by being connected to a wireless communication circuit. The wiring board 10d is arranged on an upper surface of a display region such that the substrate 100d faces the display region of the display device so that it is possible to suppress the visibility of the first wiring 200d and the second wiring 300d in a plan view in the D1 direction. The wiring board 10d is arranged such that a direction of the first wiring 200 is a vertical direction of the display region and the upper side surface 307d of the second wiring 300d is in the upper direction of the display region (light incident direction) so that the reflection of light by the other side surface 306d of the second wiring 300d can be suppressed. When the wiring board 10d is arranged on an upper surface of the display region, a protective film is arranged so as to cover the upper surface of the substrate 100d. Since the first wiring 200d and the second wiring 300d have the protrusions d, the adhesion between each of the first wiring 200d and the second wiring 300d and the protective film can be improved. Thus, it is possible to provide the display device including the wiring board having the radio wave transmission/reception function with improved transparency, reliability, and conductivity.

<Fifth Modification>

A wiring board 10e according to the present modification includes a substrate 100e, a first wiring 200e, and a second wiring 300e, which is similar to the wiring board 10 according to the embodiment illustrated in FIGS. 1 and 2. The wiring board 10e according to the present modification includes a curved surface (curved portion) e at an intersection between the first wiring 200e and the second wiring 300e.

A configuration of the wiring board 10e according to the present modification will be described with reference to FIGS. 7 and 8. Here, the configuration of the wiring board 10e according to the present modification is the same as the configuration of the wiring board 10 illustrated in FIGS. 1 and 2 except for the curved surface e at the intersection between the first wiring 200e and the second wiring 300e. Thus, detailed descriptions of the same portions as those in the mode illustrated in FIGS. 1 and 2 will be omitted.

[Configuration of Wiring Board]

Figure 7:
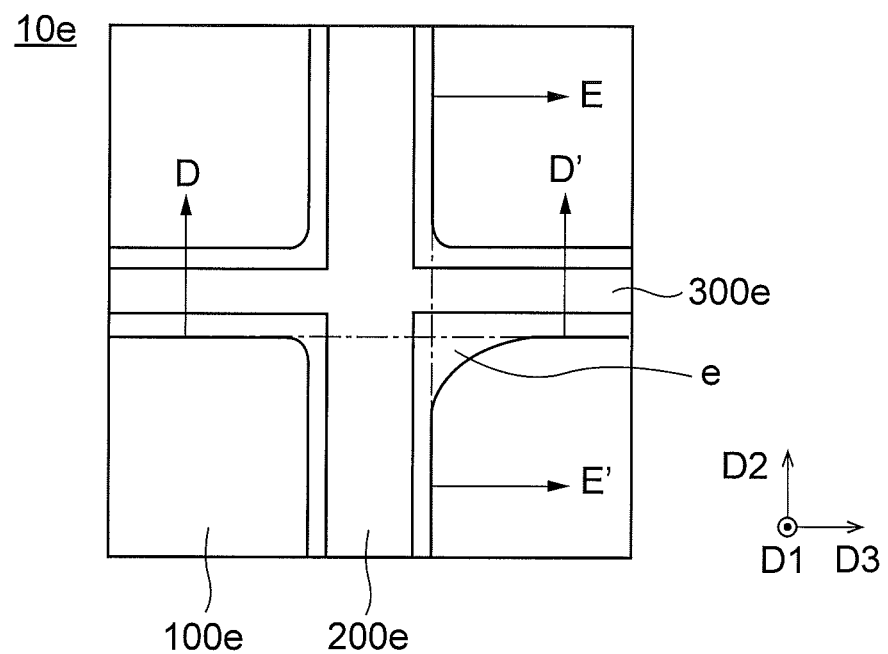
FIG. 7 is a top view illustrating a fifth modification of the wiring board according to the first embodiment of the present disclosure.
Figure 8:
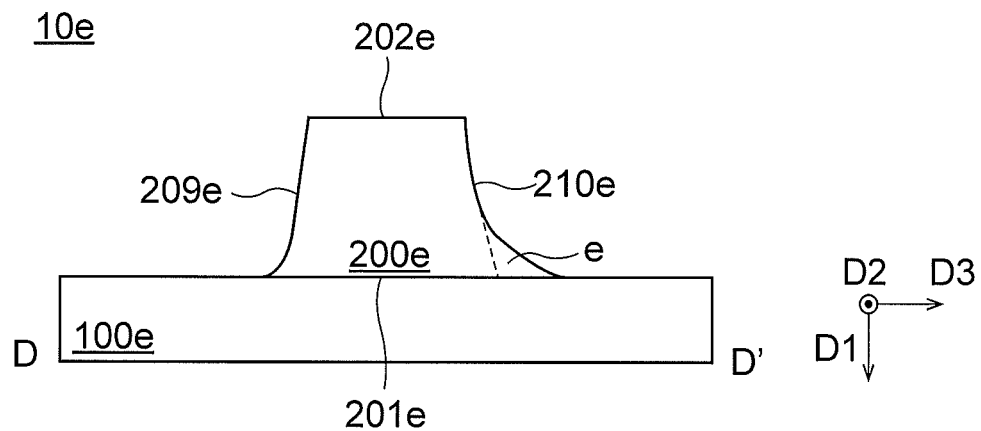
FIG. 8 is a cross-sectional view illustrating the fifth modification of the wiring board according to the first embodiment of the present disclosure.
Figure 8:
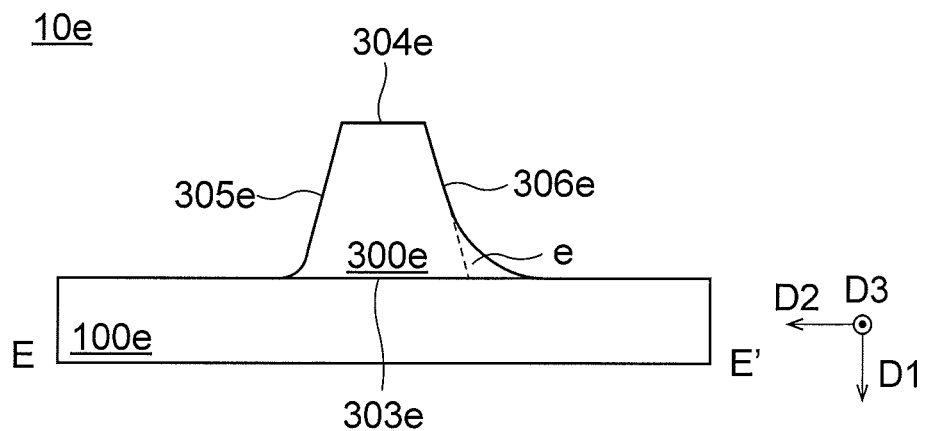

FIG. 7 is a top view illustrating an example of the wiring board according to the present modification. FIG. 7 is an enlarged top view in a region C of FIG. 1. FIG. 8 is a cross-sectional view illustrating an example of the wiring board according to the present modification. FIG. 8(A) is an enlarged cross-sectional view taken along a chain line D-D' of FIG. 7. FIG. 8(B) is an enlarged cross-sectional view taken along a chain line E-E' of FIG. 7.

As illustrated in FIG. 7, the wiring board 10e includes the substrate 100e, the first wiring 200e, and the second wiring 300e. In the present modification, the first wiring 200e is orthogonal to the second wiring 300e. However, it is sufficient for planar shapes of the first wiring 200e and the second wiring 300e to intersect or to be connected without being limited thereto. As illustrated in FIGS. 7 and 8, an upper surface of the substrate 100e, side surfaces adjacent to a back surface (first surface) 201e of the first wiring 200e, and side surfaces adjacent to a back surface (third surface) 303e of the second wiring 300e form four corners in a plan view. In the present modification, a corner formed by the upper surface of the substrate 100e, the other side surface (tenth surface) 210e of the first wiring 200e, and the other side surface (sixth surface) 306e of the second wiring 300e includes a curved surface e that is continuous with these surfaces. That is, the curved surface e continuously connects the other side surface 210e of the first wiring 200e and the other side surface 306e of the second wiring 300e. The curved surface e has a shape curved inward in both of a cross section perpendicular to a direction of the first wiring 200e and a cross section perpendicular to a direction of the second wiring 300e. However, the configuration is not limited thereto, and it is sufficient for the curved surface e to be arranged at one or more of four corners in a plan view formed by the upper surface of the substrate 100e, the side surfaces adjacent to the back surface 201e of the first wiring 200e, and the side surfaces adjacent to the back surface 303e of the second wiring 300e. That is, the first wiring 200e is asymmetric about a longitudinal direction (D2 direction) in the cross section that intersects perpendicularly with the direction of the first wiring 200e at the corner including the curved surface e. The second wiring 300e is asymmetric about a longitudinal direction (D3 direction) in the cross section that intersects perpendicularly with the direction of the second wiring 300e at the corner including the curved surface e. A radius of curvature of the curved surface e is preferably 20% or more of a height of the second wiring 300e in the cross section perpendicular to the direction of the second wiring 300e.

Since the curved surface e is provided at the corner formed by the upper surface of the substrate 100e, the side surface adjacent to the back surface 201e of the first wiring 200e, and the side surface adjacent to the back surface 303e of the second wiring 300e, line widths of the back surface 201e and the back surface 303e become large, and it is possible to improve the adhesion between the substrate 100e and the first wiring 200e and between the substrate 100e and the second wiring 300e. Furthermore, since each cross-sectional area of the first wiring 200e and the second wiring 300e that intersects perpendicularly with the direction in which each wiring extends increases, it is possible to suppress a wiring resistance while suppressing the visibility of a front surface (second surface) 202e of the first wiring 200e and a front surface (fourth surface) 304e of the second wiring 300e in a plan view in the D1 direction. Thus, the transparency, the reliability, and the conductivity of the wiring board 10e can be improved.

The wiring board 10e according to the present modification can be mounted on a display device as a wireless communication module by being connected to a wireless communication circuit. The wiring board 10e is arranged on an upper surface of a display region such that the substrate 100e faces the display region of the display device so that it is possible to suppress the visibility of the first wiring 200e and the second wiring 300e in a plan view in the D1 direction. Since the wiring board 10e is arranged such that a direction of the first wiring 200e is a vertical direction of the display region and the curved surface e is in the lower direction of the display region, it is possible to suppress reflection of light by the curved surface e. Thus, it is possible to provide the display device including the wiring board having the radio wave transmission/reception function with improved transparency, reliability, and conductivity.

<Sixth Modification>

A wiring board 10f according to the present modification includes a substrate 100f, a first wiring 200f, and a second wiring 300f, which is similar to the wiring board 10a (FIG. 3) according to the first modification. The wiring board 10f according to the present modification includes a curved surface f at an intersection between the first wiring 200f and the second wiring 300f.

A configuration of the wiring board 10f according to the present modification will be described with reference to FIGS. 9 and 10. Here, the configuration of the wiring board 10f according to the present modification is the same as the configuration of the wiring board 10a according to the first modification illustrated in FIG. 3 except for the curved surface f at the intersection between the first wiring 200f and the second wiring 300f. Thus, detailed descriptions of the same portions as those in the first modification will be omitted.

[Configuration of Wiring Board]

Figure 9:
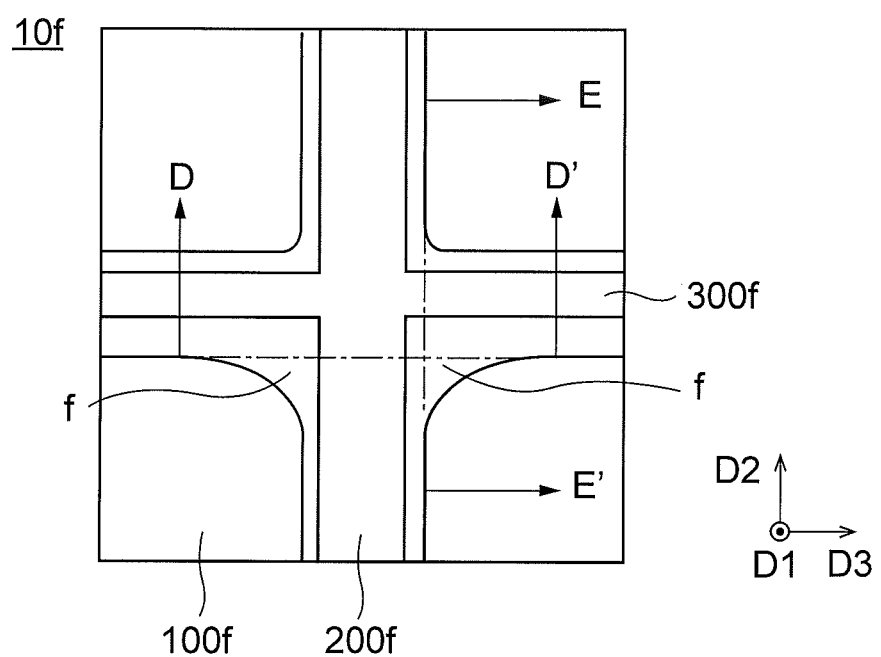
FIG. 9 is a top view illustrating a sixth modification of the wiring board according to the first embodiment of the present disclosure.
Figure 10:
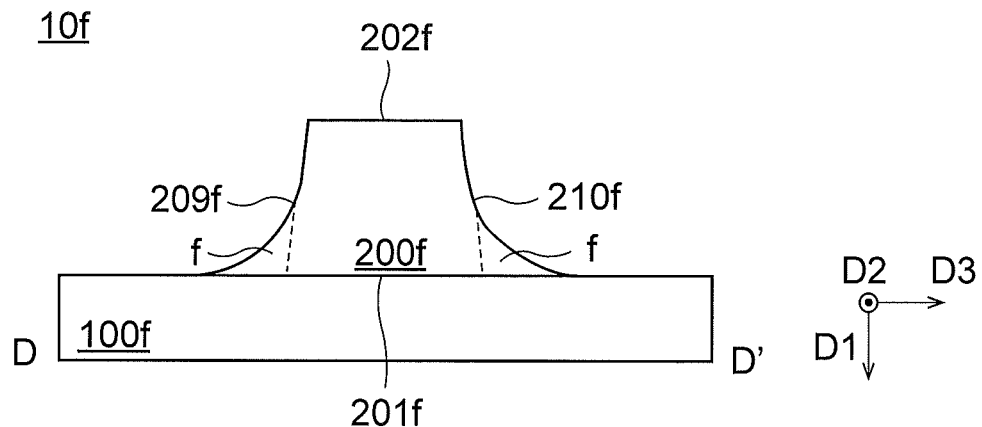
FIG. 10 is a cross-sectional view illustrating the sixth modification of the wiring board according to the first embodiment of the present disclosure.
Figure 10:
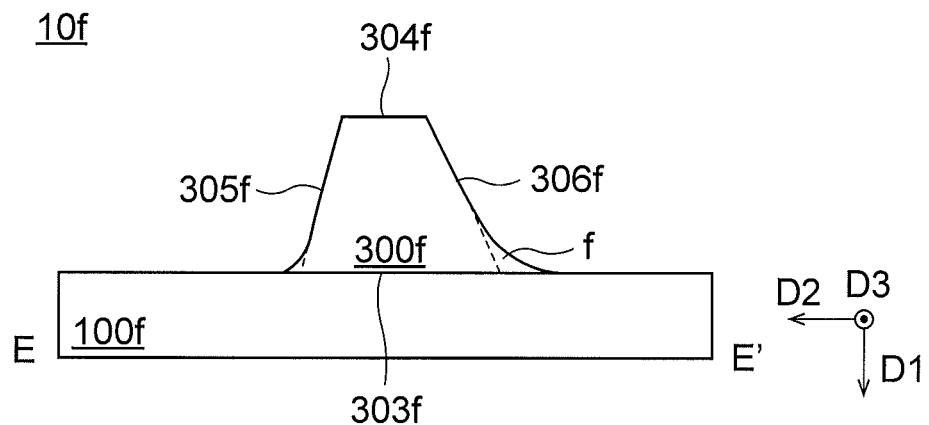

FIG. 9 is a top view illustrating an example of the wiring board according to the present modification. FIG. 9 is an enlarged top view in the region C of FIG. 1. FIG. 10 is a cross-sectional view illustrating an example of the wiring board according to the present modification. FIG. 10(A) is an enlarged cross-sectional view taken along a chain line D-D' of FIG. 9. FIG. 10(B) is an enlarged cross-sectional view taken along a chain line E-E' of FIG. 9.

As illustrated in FIG. 9, the wiring board 10f includes the substrate 100f, the first wiring 200f, and the second wiring 300f. In the present modification, the first wiring 200f is orthogonal to the second wiring 300f. However, it is sufficient for planar shapes of the first wiring 200f and the second wiring 300f to intersect or to be connected without being limited thereto. As illustrated in FIGS. 9 and 10, an upper surface of the substrate 100f, side surfaces adjacent to a back surface (first surface) 201f of the first wiring 200f, and side surfaces adjacent to a back surface (third surface) 303f of the second wiring 300f form four corners in a plan view. In the present modification, a corner formed by the upper surface of the substrate 100f, one side surface (ninth surface) 209f of the first wiring 200f, and the other side surface (sixth surface) 306f of the second wiring 300f includes a curved surface f that is continuous with these surfaces. That is, the curved surface f continuously connects the one side surface 209f of the first wiring 200f and the other side surface 306f of the second wiring 300f. Furthermore, a corner formed by the upper surface of the substrate 100f, the other side surface (tenth surface) 210f of the first wiring 200f, and the other side surface 306f of the second wiring 300f includes the curved surface f that is continuous with these surfaces. That is, the curved surface f continuously connects the other side surface 210f of the first wiring 200f and the other side surface 306f of the second wiring 300f. However, the configuration is not limited thereto, and it is sufficient for the curved surface f to be arranged at one or more of four corners in a plan view formed by the upper surface of the substrate 100f, the side surfaces adjacent to the back surface 201f of the first wiring 200f, and the side surfaces adjacent to the back surface 303f of the second wiring 300f. The curved surface f is preferably arranged at one or more of two corners formed by the upper surface of the substrate 100f, the side surface adjacent to the back surface 201f of the first wiring 200f, and the other side surface 306f of the second wiring 300f. That is, the first wiring 200f is line-symmetric about a longitudinal direction (D2 direction) in the cross section that intersects perpendicularly with the direction of the first wiring 200f at the corner including the curved surface f. That is, the second wiring 300f is asymmetric about a longitudinal direction (D3 direction) in the cross section that intersects perpendicularly with the direction of the second wiring 300f at the corner including the curved surface f. A radius of curvature of the curved surface f is preferably 20% or more of a height of the second wiring 300e in the cross section perpendicular to the direction of the second wiring 300e.

Since the curved surface f is provided at the corner formed by the upper surface of the substrate 100f, the side surface adjacent to the back surface 201f of the first wiring 200f, and the other side surface 306f of the second wiring 300f, line widths of the back surface 201f and the back surface 303f become large, and it is possible to improve the adhesion between the substrate 100f and the first wiring 200f and between the substrate 100f and the second wiring 300f. Furthermore, since each cross-sectional area of the first wiring 200f and the second wiring 300f that intersects perpendicularly with the direction in which each wiring extends increases, it is possible to suppress a wiring resistance while suppressing the visibility of a front surface (second surface) 202f of the first wiring 200f and a front surface (fourth surface) 304f of the second wiring 300f in a plan view in the D1 direction. Thus, the transparency, the reliability, and the conductivity of the wiring board 10f can be improved.

The wiring board 10f according to the present modification can be mounted on a display device as a wireless communication module by being connected to a wireless communication circuit. The wiring board 10f is arranged on an upper surface of a display region such that the substrate 100f faces the display region of the display device so that it is possible to suppress the visibility of the first wiring 200f and the second wiring 300f in a plan view in the D1 direction. Since the wiring board 10f is arranged such that a direction of the first wiring 200f is a vertical direction of the display region and the curved surface f is in the lower direction of the display region, it is possible to suppress reflection of light by the curved surface f. Thus, it is possible to provide the display device including the wiring board having the radio wave transmission/reception function with improved transparency, reliability, and conductivity.

[Method for Manufacturing Wiring Board 10]

Figure 11:
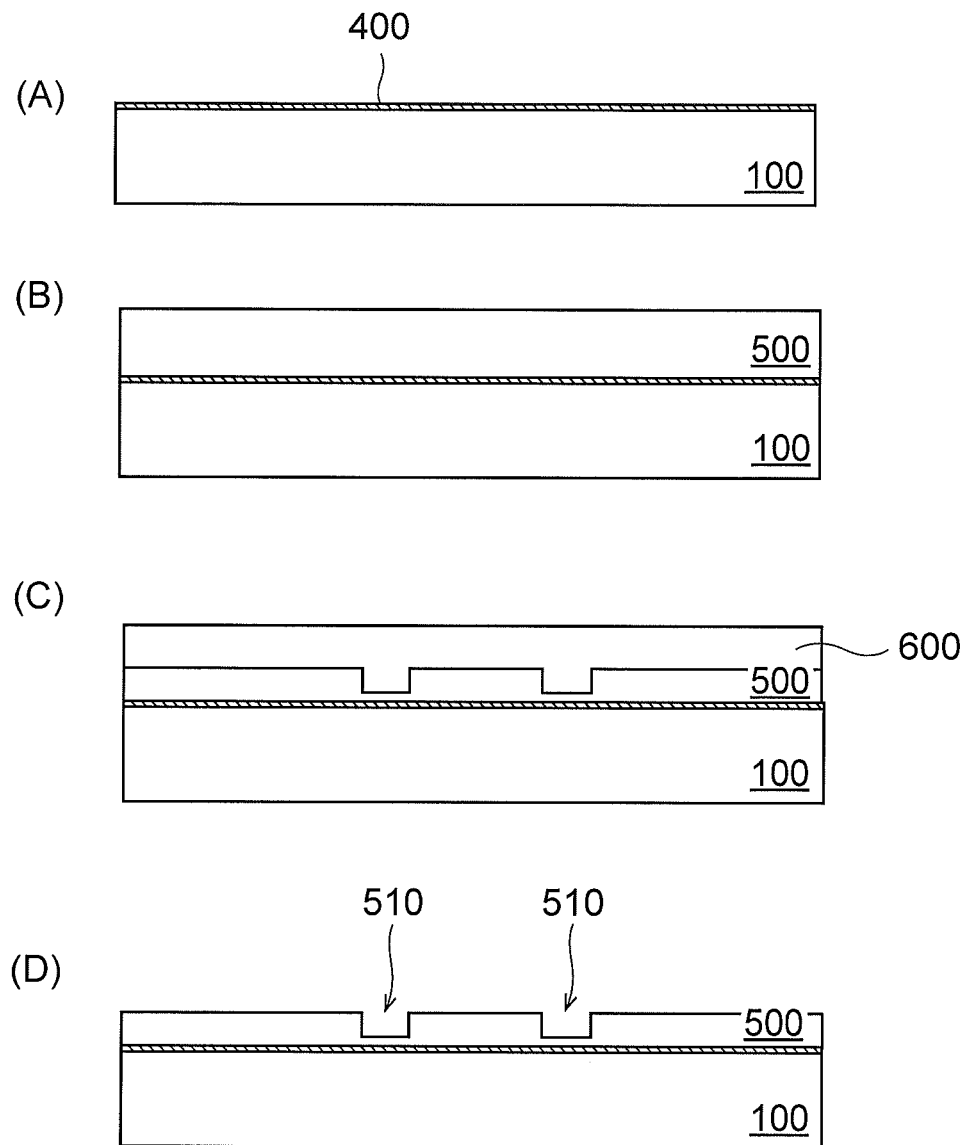
FIG. 11 is a cross-sectional view illustrating a method for manufacturing the wiring board according to the first embodiment of the present disclosure.
Figure 12:
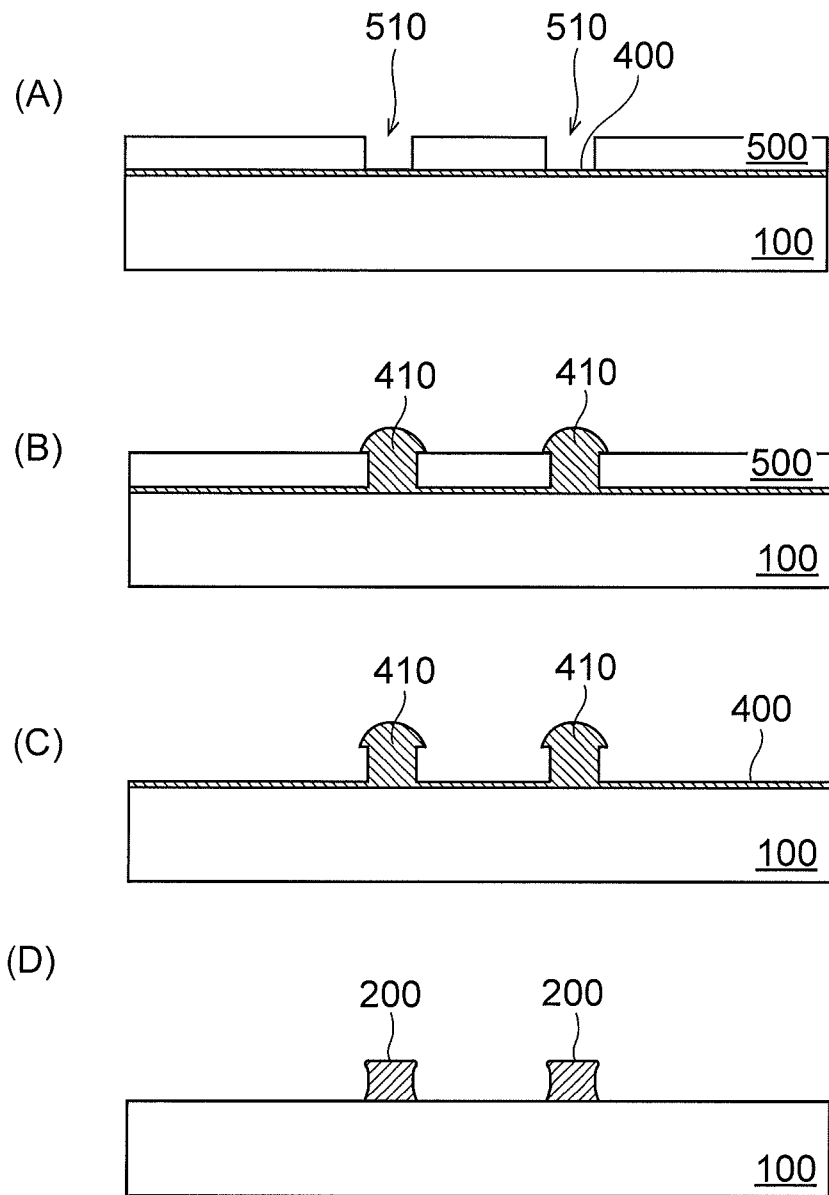
FIG. 12 is a cross-sectional view illustrating the method for manufacturing the wiring board according to the first embodiment of the present disclosure.
Figure 13:
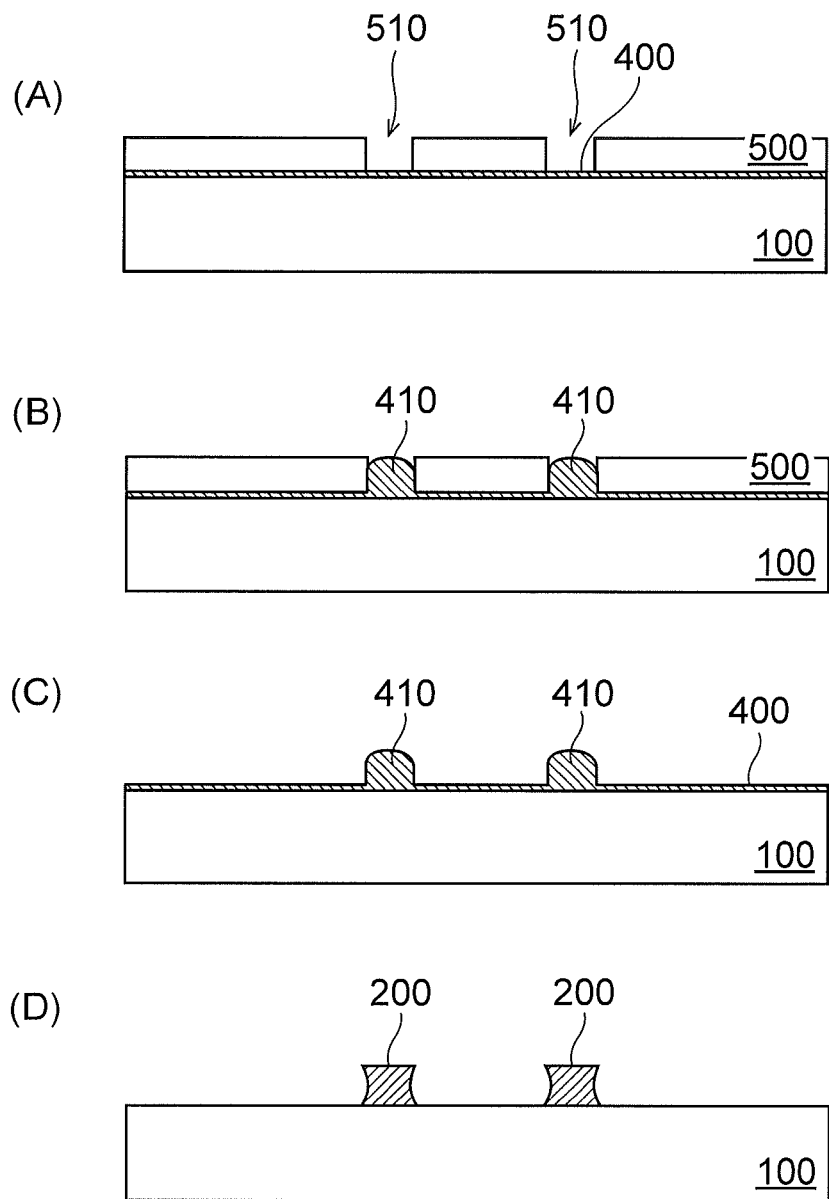
FIG. 13 is a cross-sectional view illustrating a modification of the method for manufacturing the wiring board according to the first embodiment of the present disclosure.

A method for manufacturing the wiring boards according to the present embodiment and the respective modifications will be described with reference to FIGS. 11 and 12. In FIGS. 11 and 12, the same elements as the elements described in the above-described embodiment and the respective modifications are denoted by the same reference signs. Here, detailed descriptions of the same portions as those in the modes illustrated in FIGS. 1 to 10 will be omitted.

FIG. 11(A) is a view illustrating a step of forming a conductive layer 400 on the upper surface of the substrate 100 in the method for manufacturing the wiring board according to the present embodiment. As illustrated in FIG. 11(A), the conductive layer 400 is formed over substantially the entire surface of the substrate 100. In the present embodiment, a thickness of the conductive layer 400 is 200 nm. However, the thickness of the conductive layer 400 can be appropriately selected in a range of 10 nm or more and 1000 nm or less without being limited thereto. In the present embodiment, the conductive layer 400 is formed by a sputtering method using copper. As a method for forming the conductive layer 400, a plasma CVD method can be also used.

FIG. 11(B) is a view illustrating a step of forming an insulating layer 500 on the upper surface of the substrate 100 in the method for manufacturing the wiring board according to the present embodiment. As illustrated in FIG. 11(B), the insulating layer 500 is formed over substantially the entire surface of the substrate 100. A thickness of the insulating layer 500 is 1200 nm. However, the thickness of the insulating layer 500 can be appropriately selected in a range of 500 nm or more and 2500 nm or less without being limited thereto. The insulating layer 500 may be a material having an electrical insulating property.

FIG. 11(C) is a view illustrating a step of forming a first trench 510 in which the first wiring 200 is arranged and a second trench 520 (not illustrated) in which the second wiring 300 is arranged on an upper surface of the insulating layer 500 in the method for manufacturing the wiring board according to the present embodiment. As illustrated in FIG. 11(C), the first trench 510 and the second trench 520 are formed by an imprinting method in the present embodiment. The insulating layer 500 is softened, and a mold 600 having protruding portions corresponding to the first trench 510 and the second trench 520 is press-fitted thereto. In this state, the insulating layer 500 is cured and the mold 600 is separated from the insulating layer 500, whereby the insulating layer 500 having a cross-sectional structure illustrated in FIG. 11(D) can be obtained.

The first trench 510 corresponds to the first wiring 200, and the second trench 520 corresponds to the second wiring 300. Therefore, the first trench 510 extending in the first direction is orthogonal to the second trench 520 extending in the second direction. Further, the first trench 510 is longer than the second trench 520, and an opening width of the first trench 510 is formed to be larger than an opening width of the second trench 520. Here, the opening width means a width of an opening portion parallel to the upper surface of the substrate 100 in a cross section that intersects perpendicularly with a direction in which each trench extends. Each aspect ratio of the first trench 510 and the second trench 520 can be appropriately selected according to the application. Here, the aspect ratio of each of the first trench 510 and the second trench 520 is defined as a depth with respect to the opening portion width. If the aspect ratio of each of the first trench 510 and the second trench 520 is too small, it becomes difficult to form a fine pattern of the first wiring 200 and the second wiring 300 on the wiring board 10. When the aspect ratio of each of the first trench 510 and the second trench 520 is too large, it becomes difficult to fill the first trench 510 and the second trench 520 with a conductor. Note that the opening width of the first trench 510 may be the same as the opening width of the second trench 520.

When forming the first trench 510 and the second trench 520 by the imprinting method, a direction in which the mold 600 is separated from the insulating layer 500 is preferably a direction in which the longer first wiring 200 (first trench 510) extends. The direction in which the mold 600 is separated from the insulating layer 500 is more preferably a direction from one side surface 305 to the other side surface 306 of the second wiring 300. That is, the direction in which the mold 600 is separated from the insulating layer 500 is more preferably from the first side 102 to the second side 104 of the substrate 100 (the direction of the first wiring 200, the first direction, and the opposite direction of D2). When the insulating layer 500 is formed in this manner, the cross-sectional shapes of the first wiring 200 and the second wiring 300 according to the above-described embodiment and the respective modifications can be formed. However, the method is not limited thereto, and the insulating layer 500 may be formed by a photolithography method in the method for manufacturing the wiring board 10 according to the above-described embodiment and the respective modifications. In this case, a resist pattern is formed by the photolithography method so as to expose the conductive layer 400 in a region where the first wiring 200 and the second wiring 300 are formed.

As illustrated in FIG. 11(D), there is a case where a residue of an insulating material remain at each bottom of the first trench 510 and the second trench 520 formed in the insulating layer 500. Thus, the residue of the insulating material is removed by performing a wet treatment using a permanganate solution or N-methyl-2-pyrrolidone or a dry treatment using oxygen plasma. As the residue of the insulating material is removed, the first trench 510 and the second trench 520 exposing the conductive layer 400 can be formed as illustrated in FIG. 12(A).

FIG. 12(B) is a view illustrating a step of forming a first conductor 410 corresponding to the first wiring 200 and a second conductor 420 (not illustrated) corresponding to the second wiring 300 in the method for manufacturing the wiring board according to the present embodiment. The first trench 510 and the second trench 520 of the insulating layer 500 formed in FIG. 12(A) are filled with the first conductor 410 and the second conductor 420. In the present embodiment, the first trench 510 and the second trench 520 of the insulating layer 500 are filled with copper by an electrolytic plating method using the conductive layer 400 as a seed layer. Furthermore, the first conductor 410 and the second conductor 420 are formed so as to protrude from the upper surface of the insulating layer 500 (on the opposite side of the substrate 100). The first conductor 410 and the second conductor 420 are formed on the upper surface of the insulating layer 500 to be larger than the opening width of the first trench 510 and the opening width of the second trench 520. In the present embodiment, each protruding portion of the first conductor 410 and the second conductor 420 is formed in a semicircular shape in a cross-sectional view, and each cross-sectional shape of the first conductor 410 and the second conductor 420 is formed in a mushroom shape. However, the configuration is not limited thereto, and it is sufficient for the first conductor 410 and the second conductor 420 to protrude in a surface direction of the insulating layer 500 more than the opening width and protrude in a stacking direction on the upper surface of the insulating layer 500. For example, each protruding portion of the first conductor 410 and the second conductor 420 may be formed in a rectangular parallelepiped, and each cross-sectional shape of the first conductor 410 and the second conductor 420 may be formed in a T shape. Each height of the first conductor 410 and the second conductor 420 on the upper surface of the insulating layer 500 in the stacking direction (D1 direction) is preferably 5% or more and 80% or less of a height of the first trench 510 in the stacking direction (D1 direction) of the second trench 520.

FIG. 12(C) is a view illustrating a step of removing the insulating layer 500 in the method for manufacturing the wiring board according to the present embodiment. As illustrated in FIG. 12(C), the wet treatment using a permanganate solution or N-methyl-2-pyrrolidone or the dry treatment using oxygen plasma is performed to remove the insulating layer 500 on the substrate 100.

FIG. 12(D) is a view illustrating a step of removing the conductive layer 400 in the method for manufacturing the wiring board according to the present embodiment. As illustrated in FIG. 12(D), the conductive layer 400 is etched so as to expose the upper surface of the substrate 100 by performing a wet treatment using a hydrogen peroxide solution. At this time, the first conductor 410 and the second conductor 420 are also molded by etching. As the first conductor 410 and the second conductor 420 are molded in this manner, the cross-sectional shapes of the first wiring 200 and the second wiring 300 according to the above-described embodiment and the respective modifications can be formed.

Although not illustrated in the drawing, it is preferable that the first wiring 200 and the second wiring 300 be subjected to a blackening treatment on surfaces other than the surface in contact with the substrate 100. In the present embodiment, the front surface (second surface) 202 of the first wiring 200, and the front surface (fourth surface) 304 of the second wiring 300 are subjected to a blackening treatment by forming copper oxide which is an oxide film of each wiring material. Since the front surfaces of the first wiring 200 and the second wiring 300 are subjected to the blackening treatment, it is possible to suppress light reflection of the first wiring 200 and the second wiring 300, and to achieve absorption of external light of the wiring board 10 and contrast improvement.

As described above, with the method for manufacturing the wiring board 10 according to the present embodiment, the cross-sectional shapes of the first wiring 200 and the second wiring 300 according to the above-described embodiment and the respective modifications can be formed by the simple method of forming the conductor to be thicker than the insulating layer in the stacking direction and performing molding by wet etching. Thus, it is possible to manufacture the wiring board 10 with the improved transparency, reliability, and conductivity.

Next, a modification of the method for manufacturing the wiring board will be described with reference to FIGS. 13(A) to 13(D). FIGS. 13(A) to 13(D) are views illustrating the modification of the method for manufacturing the wiring board, and are views corresponding to FIGS. 12(A) to 12(D).

First, the first trench 510 and the second trench 520 exposing the conductive layer 400 are formed in the same manner as the steps illustrated in FIGS. 11(A) to 11(D) (FIG. 13(A)).

Next, the first conductor 410 corresponding to the first wiring 200 and the second conductor 420 (not illustrated) corresponding to the second wiring 300 are formed as illustrated in FIG. 13(B). That is, the first trench 510 and the second trench 520 of the insulating layer 500 are filled with copper by an electrolytic plating method using the conductive layer 400 as a seed layer. In this case, the first conductor 410 and the second conductor 420 are formed to be lower than the upper surface of the insulating layer 500 (on the opposite side of the substrate 100). At this time, each upper surface of the first conductor 410 and the second conductor 420 is formed in a semicircular shape in a cross-sectional view.

Subsequently, for example, a wet treatment using a permanganate solution or N-methyl-2-pyrrolidone or a dry treatment using oxygen plasma is performed to remove the insulating layer 500 on the substrate 100 as illustrated in FIG. 13(C).

Thereafter, the conductive layer 400 is etched so as to expose the upper surface of the substrate 100, for example, by performing a wet treatment using a hydrogen peroxide solution as illustrated in FIG. 13(D). At this time, the first conductor 410 and the second conductor 420 are also molded by etching. Specifically, shapes of the first conductor 410 and the second conductor 420 (a shape of the side surface, a shape of the curved surface, and the like) can be adjusted by appropriately setting etching conditions (a type of an etching solution, a concentration, and an etching time) and the like. In this manner, the cross-sectional shapes of the first wiring 200 and the second wiring 300 according to the above-described embodiment and the respective modifications can be formed.

Next, a description will be given regarding an example of a wireless communication module in which a wireless communication circuit is connected to the wiring boards according to the above-described embodiment and the respective modifications. A configuration of a wireless communication module 20A according to the present embodiment will be described with reference to FIG. 14. Here, detailed descriptions of the same portions as those in the modes illustrated in FIGS. 1 to 13 will be omitted.

[Configuration of Wireless Communication Module]

Figure 14:
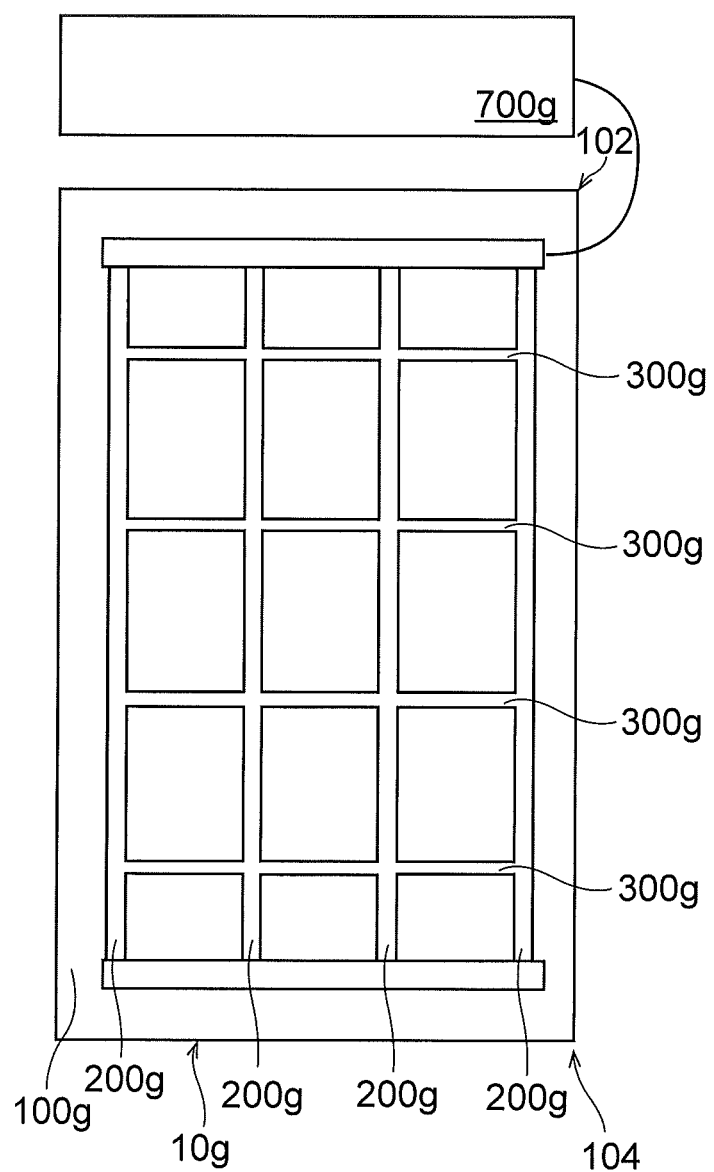
FIG. 14 is a top view illustrating a wireless communication module according to the first embodiment of the present disclosure.

FIG. 14 is a top view illustrating an example of the wireless communication module according to the present embodiment. As illustrated in FIG. 14, the wireless communication module 20A includes a wiring board 10g and a circuit 700g. The circuit 700g is a wireless communication circuit, and is connected to a plurality of first wirings 200g of the wiring board 10g.

The wiring board 10g includes a substrate 100g, the first wirings 200g, and second wirings 300g. The first wiring 200g and the second wiring 300g are arranged on an upper surface of the substrate 100g. In the present embodiment, four first wirings 200g and four second wirings 300g are arranged, but the configuration is not limited thereto. It is sufficient that two or more first wirings 200g and one or more second wirings 300g are provided.

As illustrated in FIG. 14, a line-and-space shape in which a plurality of lines extend independently from a first side 102 of the substrate 100g toward a second side 104 opposite to the first side 102 (in a longitudinal direction of the first wiring 200g, a first direction, and an opposite direction of D2) is illustrated as a planar shape of the first wiring 200g as viewed in a D1 direction. A line-and-space shape in which a plurality of lines extend independently in a direction orthogonal to the direction of the first wiring 200g (a longitudinal direction of the second wiring 300g, a second direction, and a D3 direction) is illustrated as a planar shape of the second wiring 300g as viewed in a D1 direction. That is, a regular grid or mesh shape is formed by the first wiring 200g extending in the first direction and the second wiring 300g extending in the second direction. The plurality of first wirings 200g are orthogonal to the plurality of second wirings 300g. The first wiring 200g is longer than the second wiring 300g. Further, an interval between the plurality of second wirings 300g is larger than an interval between the plurality of first wirings 200g. However, it is sufficient that a plurality of lines intersect or are connected with each other in the planar shape of the first wiring 200g and the second wiring 300g without being limited to such a shape. For example, a direction of the first wiring 200g and a direction of the second wiring 300g may intersect at an acute angle or may intersect at an obtuse angle. Further, the repetitive shape is not necessarily uniform on the substrate 100g. Here, when a region where the plurality of first wirings 200g and the plurality of second wirings 300g are not arranged is set as an opening of the wiring board 10g on the upper surface of the substrate 100g, an aperture ratio (visible light transmissivity) is preferably 80% or more. If the aperture ratio is less than 80%, the transmittance of the wiring board 10g deteriorates With the arrangement in which the interval between the plurality of second wirings 300g is larger than the interval between the plurality of first wirings 200g, it is possible to suppress the visibility of the spare second wiring 300g corresponding to the disconnection of the first wiring 200g or the like while maintaining a conductivity of the first wiring 200g having a radio wave transmission/reception function. Thus, a conductivity and transparency of the wiring board 10g can be improved.

Figure 15:
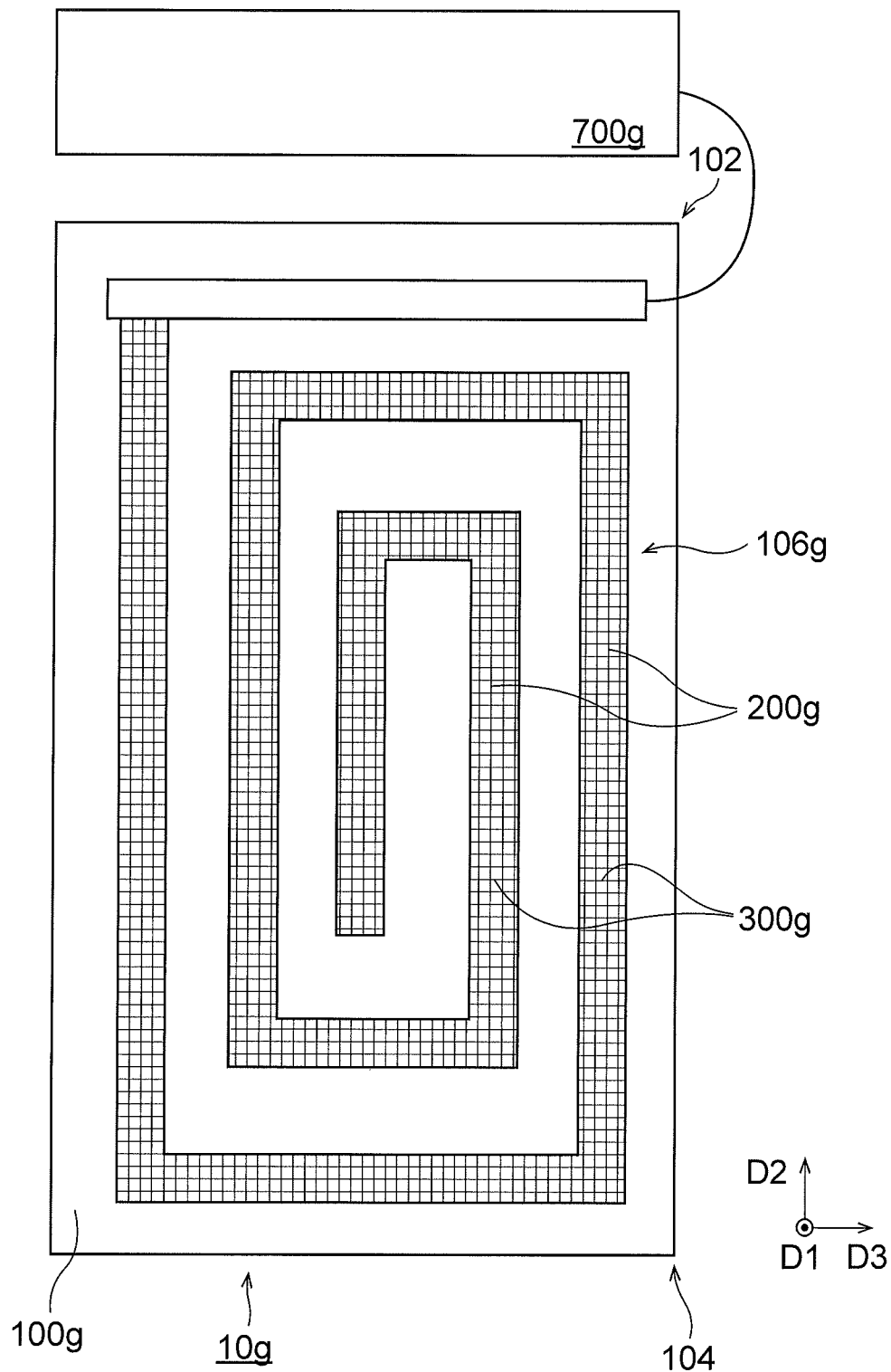
FIG. 15 is a top view illustrating a modification of the wireless communication module according to the first embodiment of the present disclosure.

FIG. 15 is a top view illustrating an example of a wireless communication module according to a modification. As illustrated in FIG. 15, the wireless communication module 20A is, for example, a module for NFC (Near Field Communication), and includes the wiring board 10g and the circuit 700g. In this case, the wiring board 10g has a wiring region 106g formed in a spiral shape as a whole in a plan view. The wiring region 106g includes the plurality of first wirings 200g and the plurality of second wirings 300g. That is, the first wiring 200g and the second wiring 300g are formed in a mesh shape or a grid shape inside the wiring region 106g. In this case, the transparency of the wiring board 10g is enhanced, and thus, for example, the wiring board 10g for NFC can be also arranged on a display screen.

Note that the present disclosure is not limited to the above-described embodiments, and can be appropriately changed within a scope not departing from a gist. The respective embodiments described above as embodiments of the present disclosure can be implemented appropriately in combinations as long as there is no confliction with each other. Further, one that is obtained by addition, deletion, or a design change of a component appropriately performed based on the wiring board of each of the embodiments by a person skilled in the art or one that is obtained by adding or omitting a step or changing a condition is also included in the scope of the present invention as long as having the gist of the present invention.

Even operations and effects that are different from those brought by the modes of each of the above-described embodiments but are evident from the description of the specification or can be easily predicted by a person skilled in the art are construed as those naturally brought by the present invention.

EXAMPLES

Structures of the first wiring 200 and the second wiring 300 included in the wiring board according to the embodiment of the present disclosure described above will be described in more detail.

Reference Example 1

Parameters of the first wiring 200 and the second wiring 300 in a wiring board according to Reference Example 1 are given as follows.
 Width of the first wiring 200: 1 μm
 Height of the first wiring 200: 1 μm
 Interval between the first wirings 200: 20 μm
 Width of second wiring 300: 2 μm
 Height of second wiring 300: 1 μm
 Interval between the second wirings 300: 20 μm The wiring board according to Reference Example 1 of the present disclosure is the same as the wiring board according to the sixth modification (FIGS. 9 and 10) except for the width and interval (pitch) of each wiring, and thus, a detailed description thereof will be omitted. Manufacturing steps of the wiring board are the same as those of the mode illustrated in FIGS. 11 to 13, and thus a description will be omitted.

Figure 16:
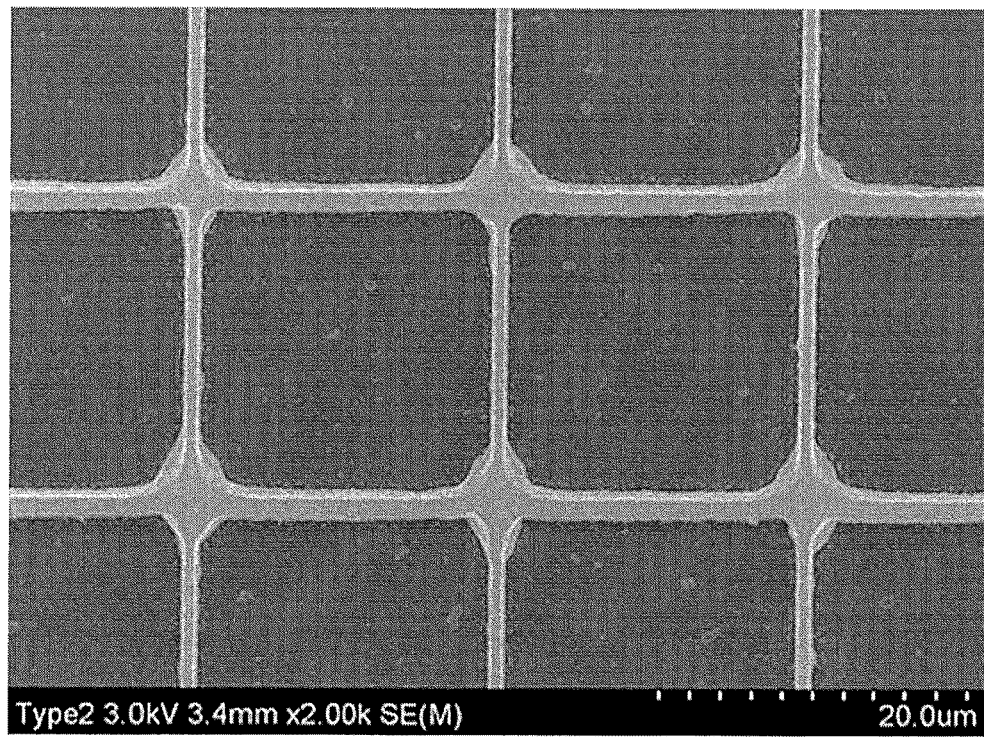
FIG. 16 is an electron microscope (SEM) image of a cross section of the wiring board according to the first embodiment of the present disclosure.
Figure 16:
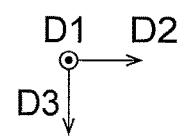
Figure 17:
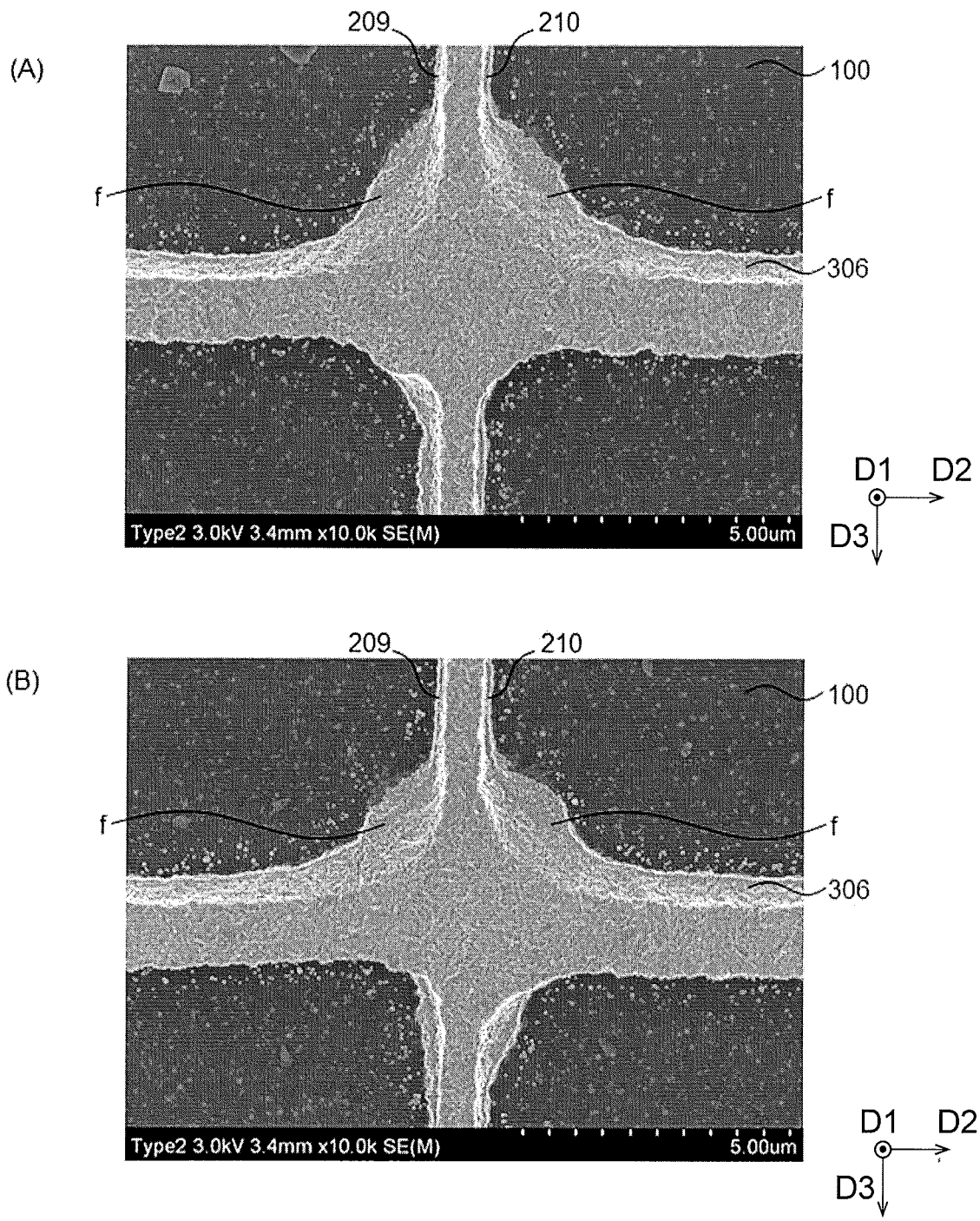
FIG. 17 is an electron microscope (SEM) image of the cross section of the wiring board according to the first embodiment of the present disclosure.

An intersection between the first wiring 200 and the second wiring 300 was observed with an electron microscope (SEM) using the wiring board of Reference Example 1. FIG. 16 illustrates an image of an upper surface of the wiring board of Reference Example 1 observed using the electron microscope (SEM). FIG. 17 illustrates an image of the intersection between the first wiring 200 and the second wiring 300 in Reference Example 1 observed using the electron microscope (SEM).

FIG. 17 is the electron microscope image of the intersection between the first wiring 200 and the second wiring 300 in Reference Example 1. As illustrated in FIGS. 17(A) and 17(B), the wiring board 10 according to the reference example 1 includes two curved surfaces at the intersection between the first wiring 200 and the second wiring 300. It has been observed that the corner formed by the upper surface of the substrate 100, the one side surface 209 of the first wiring 200, and the other side surface 306 of the second wiring 300 includes the curved surface f that is continuous with these surfaces. Furthermore, it has been observed that the corner formed by the upper surface of the substrate 100, the other side surface 210 of the first wiring 200, and the other side surface 306 of the second wiring 300 includes the curved surface f that is continuous with these surfaces.

Second Embodiment

Next, a second embodiment will be described with reference to FIGS. 18 to 37. FIGS. 18 to 37 are views illustrating the second embodiment.

In the present embodiment, an "X direction" is a direction perpendicular to a longitudinal direction of the antenna pattern region, and is a direction perpendicular to a direction of a length corresponding to a frequency band of an antenna wiring. A "Y direction" is a direction perpendicular to the X direction and parallel to the longitudinal direction of the antenna pattern region, and is a direction parallel to the direction of the length corresponding to the frequency band of the antenna wiring. A "Z direction" is a direction perpendicular to both the X direction and the Y direction and parallel to a thickness direction of a wiring board. Further, a "front surface" refers to a surface on the positive side in the Z direction, and is a surface on which the antenna wiring is provided on the substrate. A "back surface" refers to a surface on the negative side in the Z direction, and is a surface on the opposite side of the surface on which the antenna wiring is provided on the substrate. Note that a description is given by exemplifying a case where the wiring pattern region 20 is the antenna pattern region 20 having a radio wave transmission/reception function (function as an antenna) in the present embodiment, but the wiring pattern region 20 does not necessarily have the radio wave transmission/reception function (function as the antenna).

[Configuration of Wiring Board]

A configuration of the wiring board according to the present embodiment will be described with reference to FIGS. 18 to 22. FIGS. 18 to 22 are views illustrating the wiring board according to the present embodiment.

Figure 18:
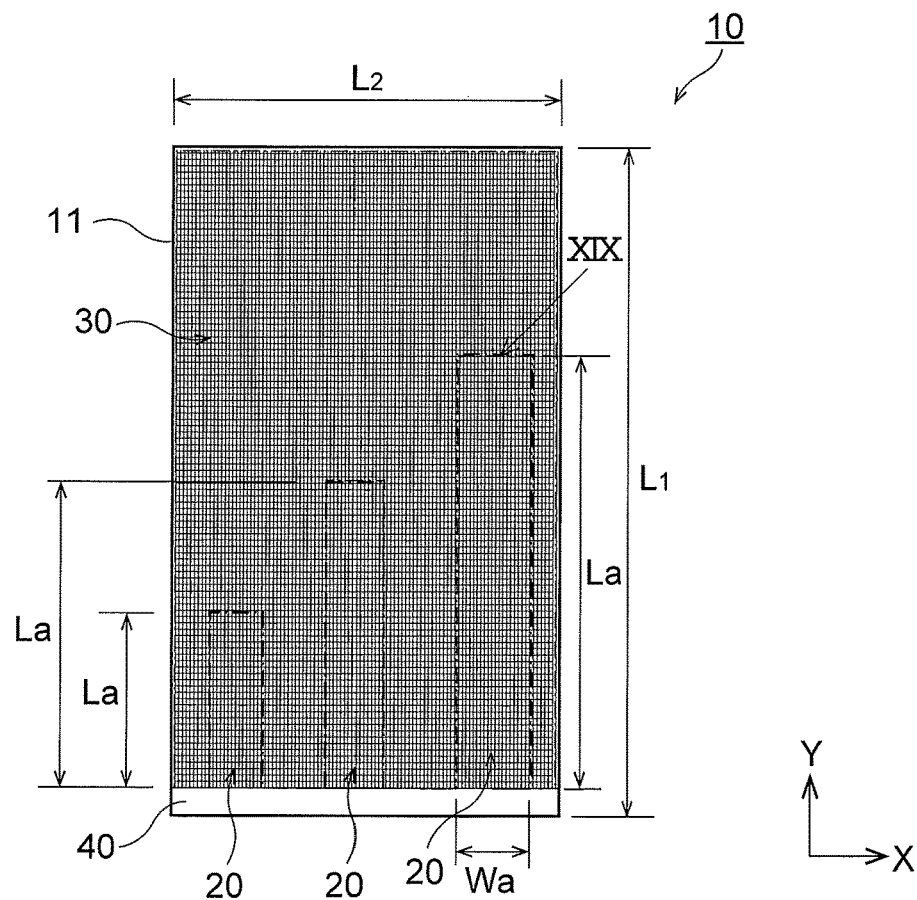
FIG. 18 is a plan view illustrating a wiring board according to a second embodiment.

As illustrated in FIG. 18, the wiring board 10 according to the present embodiment is arranged, for example, on a display of an image display device. Such a wiring board 10 includes: a substrate 11 having transparency, an antenna pattern region (wiring pattern region) 20 arranged on the substrate 11; and a dummy pattern region 30 arranged around the antenna pattern region 20 on the substrate 11. Further, a power feeding unit 40 is electrically connected to the antenna pattern region 20.

Among them, the substrate 11 has a substantially rectangular shape in a plan view, and has a longitudinal direction parallel to the Y direction and a lateral direction parallel to the X direction. The substrate 11 has transparency and a substantially flat shape, and has a substantially uniform thickness as a whole. A length $L_1$ of the substrate 11 in the longitudinal direction (Y direction) can be selected, for example, in a range of 100 mm or more and 200 mm or less, and a length $L_2$ of the substrate 11 in the lateral direction (X direction) can be selected, for example, in a range of 50 mm or more and 100 mm or less.

It is sufficient that a material of the substrate 11 is a material having transparency and an electrical insulating property in a visible light region. In the present embodiment, the material of the substrate 11 is polyethylene terephthalate, but is not limited thereto. As the material of the substrate 11, it is preferable to use, for example, an organic insulating material such as a polyester resin such as polyethylene terephthalate, an acrylic resin such as pomethylmethacrylate, a polycarbonate resin, a polyimide resin, a polyolefin resin such as a cycloolefin polymer, and a cellulosic resin material such as triacetyl cellulose. Further, glass, ceramics, or the like can be appropriately selected as the material of the substrate 11 according to the application. Note that the example in which the substrate 11 is constituted by a single layer is illustrated, but a structure in which a plurality of base materials or layers are stacked may be adopted without being limited thereto. Further, the substrate 11 may be in the form of a film or a plate. Thus, the thickness of the substrate 11 is not particularly limited and can be appropriately selected according to the application, and a thickness (in the Z direction) $T_1$ of the substrate 11 (see FIG. 20) can be set, for example, in a range of 10 μm or more and 200 μm or less in one example.

In FIG. 18, a plurality of (three) antenna pattern regions 20 are formed on the substrate 11 and correspond to different frequency bands, respectively. In other words, the plurality of antenna pattern regions 20 have different lengths (lengths in the Y direction) $L_a$, and have the lengths corresponding to specific frequency bands, respectively. Note that the length $L_a$ of the antenna pattern region 20 increases as the corresponding frequency band is lower. When the wiring board 10 is arranged on a display 91 of an image display device 90 (see FIG. 24 to be described later), for example, each of the antenna pattern regions 20 may correspond to any of a telephone antenna, a WiFi antenna, a 3G antenna, a 4G antenna, an LTE antenna, a Bluetooth (registered trademark) antenna, an NFC antenna, and the like in the case of having the radio wave transmission/reception function. Alternatively, when the wiring board 10 does not have the radio wave transmission/reception function, and each of the wiring pattern regions 20 may serve a function, for example, hovering (a function that enables operation without requiring a user to directly touch a display), fingerprint authentication, a heater, noise cut (shield), or the like Each of the antenna pattern regions 20 is substantially rectangular in a plan view. Each of the antenna pattern regions 20 has a longitudinal direction parallel to the Y direction and a lateral direction parallel to the X direction. A length $L_a$ of each of the antenna pattern regions 20 in the longitudinal direction (Y direction) can be selected, for example, in a range of 3 mm or more and 100 mm or less, and a width $W_a$ of each of the antenna pattern regions 20 in the lateral direction (X direction) can be selected, for example, in a range of 1 mm or more and 10 mm or less.

The antenna pattern region 20 has metal lines formed in a lattice shape or a mesh shape, and has a uniform repetitive pattern in the X direction and the Y direction. That is, as illustrated in FIG. 19, the antenna pattern region 20 is configured by repeating an L-shaped unit pattern shape 20a constituted by a portion extending in the X direction (a part of an antenna connection wiring 22 to be described later) and a portion extending in the Y direction (a part of an antenna wiring 21 to be described later).

Figure 19:
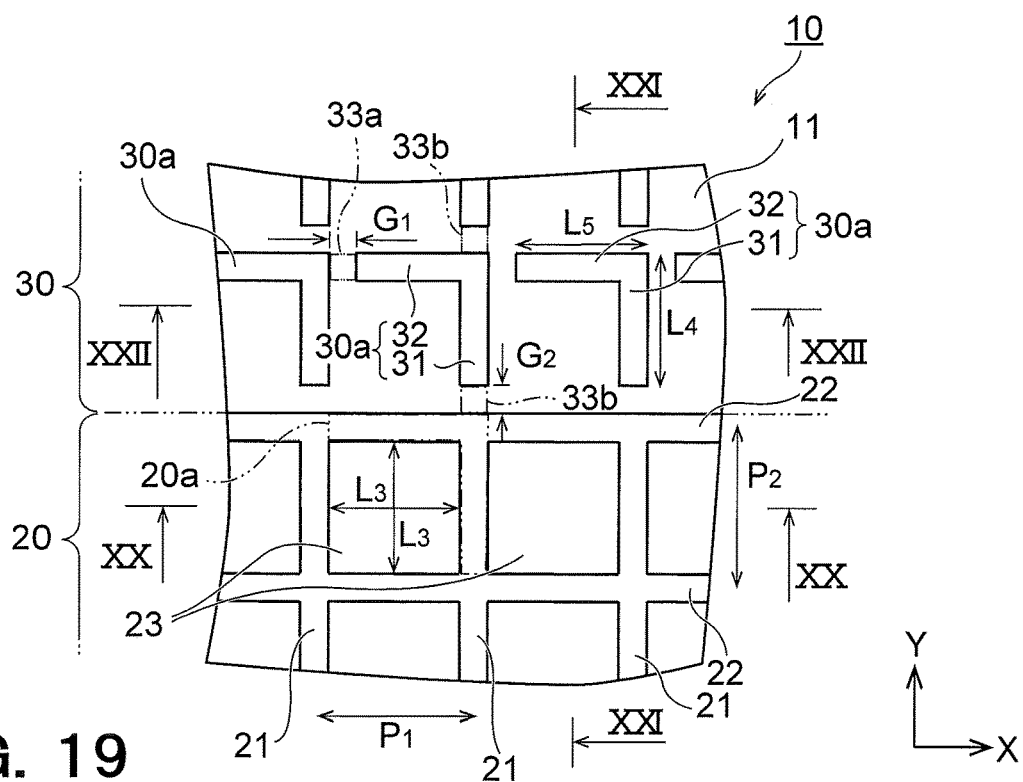
FIG. 19 is an enlarged plan view (enlarged view of Part XIX of FIG. 18) illustrating the wiring board according to the second embodiment.

As illustrated in FIG. 19, each of the antenna pattern regions 20 includes the plurality of antenna wirings (wirings) 21 each having a function as an antenna, and the plurality of antenna connection wirings (connection wirings) 22 that connect the plurality of antenna wirings 21. Specifically, the plurality of antenna wirings 21 and the plurality of antenna connection wirings 22 are integrally formed as a whole to form a regular lattice shape or mesh shape. Each of the antenna wirings 21 extends in the direction corresponding to the frequency band of the antenna (Y direction), and each of the antenna connection wirings 22 extends in a direction (X direction) orthogonal to the antenna wiring 21. The antenna wiring 21 mainly functions as the antenna by having the length $L_a$ (the length of the above-described antenna pattern region 20) corresponding to a predetermined frequency band. On the other hand, the antenna connection wiring 22 connects these antenna wirings 21 to each other, thereby serving a role of suppressing a problem such as the disconnection of the antenna wiring 21 or failure in electrical connection between the antenna wiring 21 and the power feeding unit 40.

In each of the antenna pattern regions 20, a plurality of opening portions 23 are formed by being surrounded by the antenna wirings 21 adjacent to each other and the antenna connection wirings 22 adjacent to each other. Further, the antenna wiring 21 and the antenna connection wiring 22 are arranged at equal intervals from each other. That is, the plurality of antenna wirings 21 are arranged at equal intervals from each other, and a pitch $P_1$ thereof can be set, for example, in a range of 0.01 mm or more and 1 mm or less. Further, the plurality of antenna connection wirings 22 are arranged at equal intervals to each other, and a pitch $P_2$ thereof can be set, for example, in a range of 0.01 mm or more and 1 mm or less. Since the plurality of antenna wirings 21 and the plurality of antenna connection wirings 22 are arranged at equal intervals in this manner, there is no variation in size of the opening portion 23 in each of the antenna pattern regions 20, and it is possible to make the antenna pattern region 20 less visible with the naked eye. Further, the pitch $P_1$ of the antenna wiring 21 is equal to the pitch $P_2$ of the antenna connection wiring 22. Thus, each of the opening portions 23 has a substantially square shape in a plan view, and the substrate 11 having transparency is exposed from each of the opening portions 23. Thus, the transparency as the entire wiring board 10 can be increased by increasing the area of each of the opening portions 23. Note that a length $L_3$ of one side of each of the opening portions 23 can be set, for example, in a range of 0.01 μm or more and 1 μm or less. Note that the antenna wirings 21 and the antenna connection wirings 22 are orthogonal to each other, but are not limited thereto, and may intersect with each other at an acute angle or an obtuse angle. Further, a shape of the opening portion 23 preferably has the same shape and the same size over the entire surface, but is not necessarily uniform over the entire surface, for example, depending on a location.

Figure 20:
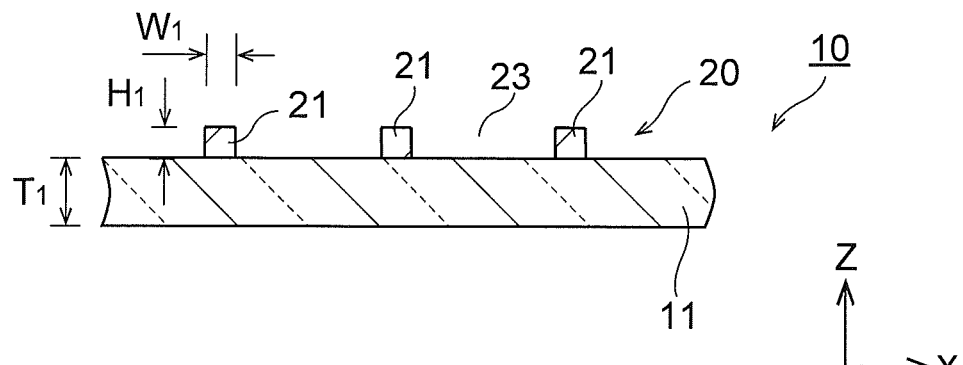
FIG. 20 is a cross-sectional view (cross-sectional view taken along a line XX-XX of FIG. 19) illustrating the wiring board according to the second embodiment.
Figure 21:
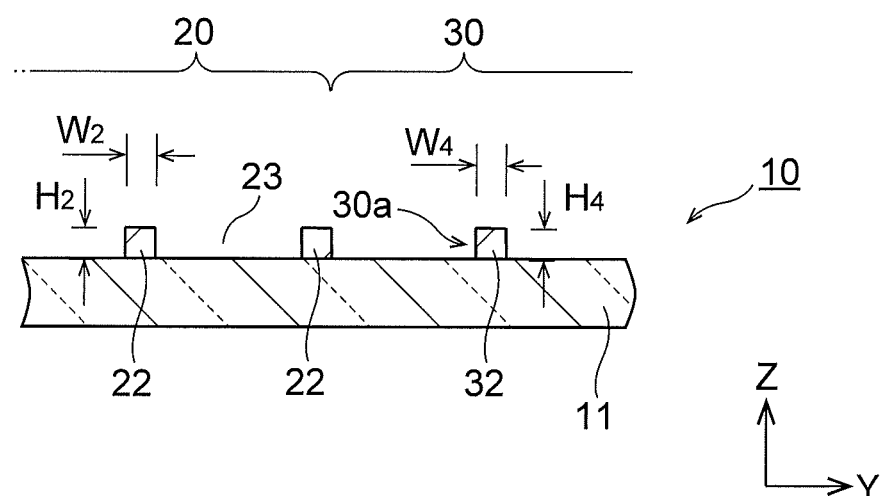
FIG. 21 is a cross-sectional view (cross-sectional view taken along a line XXI-XXI of FIG. 19) illustrating the wiring board according to the second embodiment.

As illustrated in FIG. 20, each of the antenna wirings 21 has a substantially rectangular shape or a substantially square shape in a cross section perpendicular to the longitudinal direction (a cross section in the X direction). In this case, a cross-sectional shape of the antenna wiring 21 is substantially uniform along the longitudinal direction (Y direction) of the antenna wiring 21. Further, as illustrated in FIG. 21, a shape of a cross section (cross section in the Y direction) perpendicular to the longitudinal direction of each of the antenna connection wirings 22 is a substantially rectangular shape or a substantially square shape, and is substantially the same as the shape of the cross section (cross section in the X direction) of the antenna wiring 21 described above. In this case, the cross-sectional shape of the antenna connection wiring 22 is substantially uniform along the longitudinal direction (X direction) of the antenna connection wiring 22. The cross-sectional shapes of the antenna wiring 21 and the antenna connection wiring 22 are not necessarily the substantially rectangular shape or the substantially square shape, and may be, for example, a substantially trapezoidal shape in which the front surface side (positive side in the Z direction) is narrower than the back surface side (negative side in the Z direction), or a shape in which side surfaces located on both sides in the longitudinal direction are curved.

In the present embodiment, a line width $W_1$ of the antenna wiring 21 (a length in the X direction, see FIG. 20) and a line width $W_2$ of the antenna connection wiring 22 (a length in the Y direction, see FIG. 21) are not particularly limited, and can be appropriately selected according to the application. For example, the line width $W_1$ of the antenna wiring 21 can be selected in a range of 0.1 μm or more and 5.0 μm or less, and the line width $W_2$ of the antenna connection wiring 22 can be selected in a range of 0.1 μm or more and 5.0 μm or less. Further, a height $H_1$ of the antenna wiring 21 (a length in the Z direction, see FIG. 20) and a height $H_2$ of the antenna connection wiring 22 (a length in the Z direction, see FIG. 21) are not particularly limited, and can be appropriately selected according to the application, and, for example, can be selected in a range of 0.1 μm or more and 5.0 μm or less.

It is sufficient that each material of the antenna wiring 21 and the antenna connection wiring 22 is a metal material having a conductivity. In the present embodiment, the materials of the antenna wiring 21 and the antenna connection wiring 22 are copper, but are not limited thereto. As the materials of the antenna wiring 21 and the antenna connection wiring 22, for example, a metal material (including an alloy) such as gold, silver, copper, platinum, tin, aluminum, iron, and nickel can be used.

Referring again to FIG. 18, the dummy pattern region 30 is provided so as to surround the periphery of each of the antenna pattern regions 20, and is formed to surround the entire circumferential region (the positive side in the X direction, the negative side in the X direction, and the positive side in the Y direction) excluding the power feeding unit 40 side (the negative side in the Y direction) in each of the antenna pattern regions 20. In this case, the dummy pattern region 30 is arranged on the substrate 11 and over substantially the entire region excluding the antenna pattern region 20 and the power feeding unit 40. The dummy pattern region 30 does not substantially function as an antenna, which is different from the antenna pattern region 20.

As illustrated in FIG. 19, the dummy pattern region 30 is configured by repeating a dummy wiring 30a having a predetermined unit pattern shape. That is, the dummy pattern region 30 includes a plurality of the dummy wirings 30a each having the same shape, and each of the dummy wirings 30a is electrically independent of the antenna pattern region 20 (the antenna wiring 21 and the antenna connection wiring 22). Further, the plurality of dummy wirings 30a are regularly arranged over the entire region of the dummy pattern region 30. The plurality of dummy wirings 30a are spaced apart from each other in a plane direction, and are arranged in an island shape to protrude above the substrate 11. That is, each of the dummy wirings 30a is electrically independent of the antenna pattern region 20, the power feeding unit 40, and the other dummy wirings 30a. Each of the dummy wirings 30a is substantially L shape in a plan view, and has a first dummy wiring portion 31 extending in the Y direction and a second dummy wiring portion 32 extending in the X direction. Among these, the first dummy wiring portion 31 has a predetermined length $L_4$ (length in the Y direction), and the second dummy wiring portion 32 has a predetermined length $L_5$ (length in the X direction), and these lengths are equal ($L_4 = L_5$).

A void portion 33a is formed between the dummy wirings 30a adjacent to each other in the X direction, and a void portion 33b is formed between the dummy wirings 30a adjacent to each other in the Y direction. In this case, the dummy wirings 30a are arranged at equal intervals. That is, the dummy wirings 30a adjacent to each other in the X direction are arranged at equal intervals, and a gap $G_1$ thereof can be set, for example, in a range of 1 μm or more and 20 μm or less. Similarly, the dummy wirings 30a adjacent to each other in the Y direction are arranged at equal intervals, and a gap $G_2$ thereof can be set, for example, in a range of 1 μm or more and 20 μm or less. Note that the maximum values of the gaps $G_1$ and $G_2$ may be 0.8 times or less of the above-described pitches $P_1$ and $P_2$, respectively. In this case, the gap $G_1$ of the dummy wirings 30a in the X direction is equal to the gap $G_2$ of the dummy wirings 30a in the Y direction ($G_1 = G_2$).

In the present embodiment, the dummy wiring 30a has a shape in which a part of the above-described unit pattern shape 20a of the antenna pattern region 20 is missing. That is, the shape of the dummy wiring 30a is a shape obtained by removing the above-described void portions 33a and 33b from the L-shaped unit pattern shape 20a of the antenna pattern region 20. That is, the shape in which the plurality of dummy wirings 30a of the dummy pattern region 30 and the plurality of void portions 33a and 33b are combined corresponds to the lattice shape or the mesh shape forming the antenna pattern region 20. Since the dummy wiring 30a of the dummy pattern region 30 is formed into the shape in which a part of the unit pattern shape 20a of the antenna pattern region 20 is missing in this manner, it is possible to make it difficult to visually recognize a difference between the antenna pattern region 20 and the dummy pattern region 30, and to make the antenna pattern region 20 arranged on the substrate 11 hardly visible.

In FIG. 19, the antenna pattern region 20 and the dummy pattern region 30 are adjacent to each other in the Y direction. The first dummy wiring portion 31 is formed on an extension of the antenna wiring 21 near a boundary between the antenna pattern region 20 and the dummy pattern region 30. Thus, it is difficult to visually recognize the difference between the antenna pattern region 20 and the dummy pattern region 30. Further, for the same reason, it is preferable that the second dummy wiring portion 32 be formed on an extension of the antenna connection wiring 22 even in a place where the antenna pattern region 20 and the dummy pattern region 30 are adjacent to each other in the X direction although not illustrated.

Figure 22:
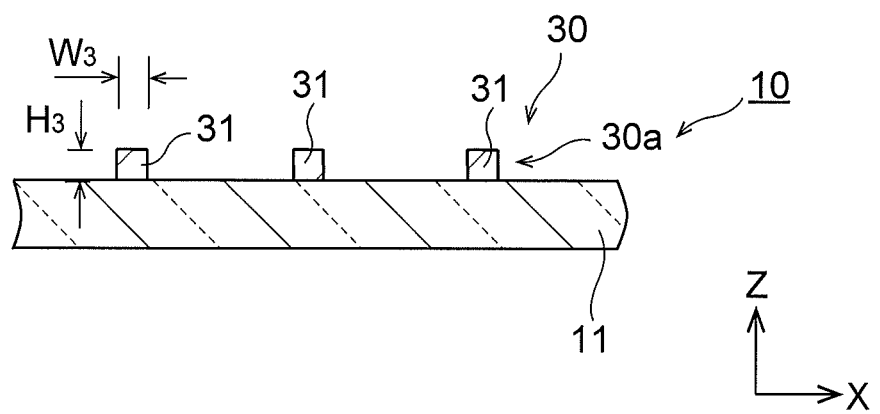
FIG. 22 is a cross-sectional view (cross-sectional view taken along a line XXII-XXII of FIG. 19) illustrating the wiring board according to the second embodiment.
Figure 23:
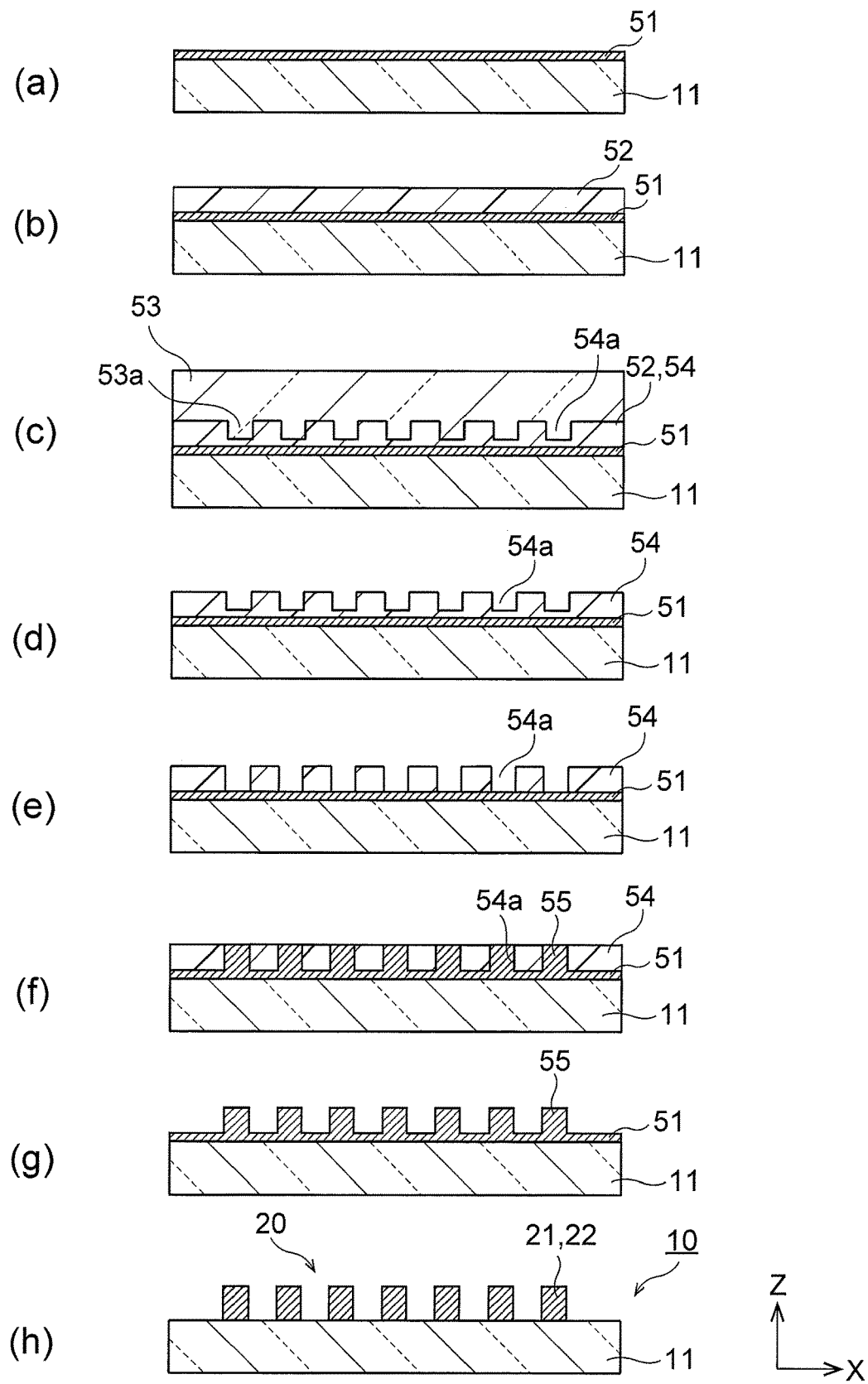
FIGS. 23(*a*) to 23(*h*) are cross-sectional views illustrating a method for manufacturing the wiring board according to the second embodiment.

As illustrated in FIG. 22, the first dummy wiring portion 31 of each of the dummy wirings 30a has a substantially rectangular or substantially square cross section (cross section in the X direction) perpendicular to a longitudinal direction thereof (the Y direction). As illustrated in FIG. 21, the second dummy wiring portion 32 of each of the dummy wirings 30a has a substantially rectangular or substantially square cross section (cross section in the Y direction) perpendicular to a longitudinal direction thereof (the X direction). In this case, the cross-sectional shape of the first dummy wiring portion 31 is substantially the same as the cross-sectional shape of the antenna wiring 21, and the sectional shape of the second dummy wiring portion 32 is substantially the same as the sectional shape of the antenna connection wiring 22.

In the present embodiment, a line width $W_3$ of the first dummy wiring portion 31 (a length in the X direction, see FIG. 22) is substantially the same as the line width $W_1$ of the antenna wiring 21, and a line width $W_4$ of the second dummy wiring portion 32 (a length in the Y direction, see FIG. 21) is substantially the same as the line width $W_2$ of the antenna connection wiring 22. Further, a height $H_3$ of the first dummy wiring portion 31 (a length in the Z direction, see FIG. 22) and a height $H_4$ of the second dummy wiring portion 32 (a length in the Z direction, see FIG. 21) are substantially the same as the height $H_1$ of the antenna wiring 21 and the height $H_2$ of the antenna connection wiring 22, respectively.

As a material of the dummy wiring 30a, the same metal material as the material of the antenna wiring 21 and the material of the antenna connection wiring 22 can be used.

Meanwhile, in the present embodiment, the antenna pattern region 20 and the dummy pattern region 30 have predetermined aperture ratios A1 and A2, respectively. Among these, the aperture ratio A1 of the antenna pattern region 20 can be set, for example, in a range of 85% or more and 99.9% or less. Further, the aperture ratio A2 of the dummy pattern region 30 can be set, for example, in a range of 87% or more and less than 100%. In this case, the aperture ratio A2 of the dummy pattern region 30 is higher than the aperture ratio A1 of the antenna pattern region 20 (A2>A1). As a result, the transparency of the wiring board 10 can be ensured. Note that the configuration is not limited thereto, and the aperture ratio A2 of the dummy pattern region 30 may be lower than the aperture ratio A1 of the antenna pattern region 20 (A2<A1).

Further, a difference between the aperture ratio A2 of the dummy pattern region 30 and the aperture ratio A1 of the antenna pattern region 20 (|A2−A1|) is preferably in a range of more than 0% and 7% or less, and is more preferably in a range of more than 0% and 1% or less. As the difference between the aperture ratio A2 of the dummy pattern region 30 and the aperture ratio A1 of the antenna pattern region 20 is set to be small in this manner, the boundary between the antenna pattern region 20 and the dummy pattern region 30 can be made hardly visible, and the presence of the antenna pattern region 20 can be made hardly recognizable with the naked eye.

Further, a total aperture ratio A3 of the antenna pattern region 20 and the dummy pattern region 30 (a combined aperture ratio of the antenna pattern region 20 and the dummy pattern region 30) can be set, for example, in a range of 87% or more and less than 100%. As the total aperture ratio A3 of the wiring board 10 is set in this range, the conductivity and transparency of the wiring board 10 can be ensured.

Note that the aperture ratio refers to a ratio (%) of an area of an opening region (region where the metal portions such as the antenna wiring 21, the antenna connection wiring 22, and the dummy wiring 30a are not present and the substrate 11 is exposed) accounting for a unit area of a predetermined region (the antenna pattern region 20, the dummy pattern region 30, or the antenna pattern region 20 and the dummy pattern region 30).

Referring again to FIG. 18, the power feeding unit 40 is electrically connected to the antenna pattern region 20. The power feeding unit 40 is made of a conductive thin plate member having a substantially rectangular shape. A longitudinal direction of the power feeding unit 40 is parallel to the X direction, and a lateral direction of the power feeding unit 40 is parallel to the Y direction. Further, the power feeding unit 40 is arranged at a longitudinal end of the substrate 11 (an end on the negative side in the Y direction). As a material of the power feeding unit 40, for example, a metal material (including an alloy) such as gold, silver, copper, platinum, tin, aluminum, iron, and nickel can be used. The power feeding unit 40 is electrically connected to the wireless communication circuit 92 of the image display device 90 when the wiring board 10 is incorporated in the image display device 90 (see FIG. 24). Note that the power feeding unit 40 is provided on the front surface of the substrate 11, but is not limited thereto, and the power feeding unit 40 may be partially or entirely located outside a peripheral edge of the substrate 11.

[Method for Manufacturing Wiring Board]

Next, a method for manufacturing the wiring board according to the present embodiment will be described with reference to FIGS. 23(a) to 23(h). FIGS. 23(a) to 23(h) are cross-sectional views illustrating the method for manufacturing the wiring board according to the present embodiment.

First, the substrate 11 is prepared, and a conductive layer 51 is formed on substantially the entire front surface of the substrate 11 as illustrated in FIG. 23(a). In the present embodiment, a thickness of the conductive layer 51 is 200 nm. However, the thickness of the conductive layer 51 can be appropriately selected in a range of 10 nm or more and 1000 nm or less without being limited thereto. In the present embodiment, the conductive layer 51 is formed by a sputtering method using copper. As a method for forming the conductive layer 51, a plasma CVD method may be used.

Next, a photocurable insulating resist 52 is supplied to substantially the entire front surface of the substrate 11 as illustrated in FIG. 23(b). Examples of the photocurable insulating resist 52 include an organic resin such as an epoxy resin.

Subsequently, a transparent mold 53 for imprinting having a protrusion 53a is prepared (FIG. 23(c)), and the mold 53 and the substrate 11 are brought close to each other, and the photocurable insulating resist 52 is developed between the mold 53 and the substrate 11. Next, light irradiation is performed from the mold 53 side to cure the photocurable insulating resist 52, thereby forming an insulating layer 54. As a result, a trench 54a having a shape in which the protrusion 53a has been transferred is formed on a front surface of the insulating layer 54. The trench 54a has a planar shape pattern corresponding to the antenna wiring 21, the antenna connection wiring 22, and the dummy wiring 30a.

Thereafter, the mold 53 is separated from the insulating layer 54 to obtain the insulating layer 54 having a cross-sectional structure illustrated in FIG. 23(d). A direction in which the mold 53 is separated from the insulating layer 54 is preferably the Y direction in which the longer antenna wiring 21 extends.

As the trench 54a is formed on the front surface of the insulating layer 54 by the imprinting method in this manner, a fine shape of the trench 54a can be made. Note that the insulating layer 54 may be formed by a photolithography method without being limited thereto. In this case, a resist pattern is formed by the photolithography method so as to expose the conductive layer 51 corresponding to the antenna wiring 21, the antenna connection wiring 22, and the dummy wiring 30a.

As illustrated in FIG. 23(d), a residue of an insulating material may remain at a bottom of the trench 54a of the insulating layer 54. Thus, the residue of the insulating material is removed by performing a wet treatment using a permanganate solution or N-methyl-2-pyrrolidone or a dry treatment using oxygen plasma. As the residue of the insulating material is removed in this manner, the trench 54a exposing the conductive layer 51 can be formed as illustrated in FIG. 23(e).

Next, the trench 54a of the insulating layer 54 is filled with a conductor 55 as illustrated in FIG. 23(f). In the present embodiment, the trench 54a of the insulating layer 54 is filled with copper by an electrolytic plating method using the conductive layer 51 as a seed layer.

Subsequently, the insulating layer 54 is removed as illustrated in FIG. 23(g). In this case, the wet treatment using a permanganate solution or N-methyl-2-pyrrolidone or the dry treatment using oxygen plasma is performed to remove the insulating layer 54 on the substrate 11.

Thereafter, the conductive layer 51 on the front surface of the substrate 11 is removed as illustrated in FIG. 23(h). At this time, the conductive layer 51 is etched so as to expose the front surface of the substrate 11 by performing a wet process using a hydrogen peroxide solution. In this manner, the wiring board 10, which includes the substrate 11, the antenna pattern region 20 and the dummy pattern region 30 arranged on the substrate 11, is obtained. In this case, the antenna pattern region 20 includes the antenna wiring 21 and the antenna connection wiring 22, and the dummy pattern region 30 includes the dummy wiring 30a. The above-described conductor 55 includes the antenna wiring 21, the antenna connection wiring 22, and the dummy wiring 30a.

[Operation of Present Embodiment]

Next, an operation of the wiring board having such a configuration will be described.

Figure 24:
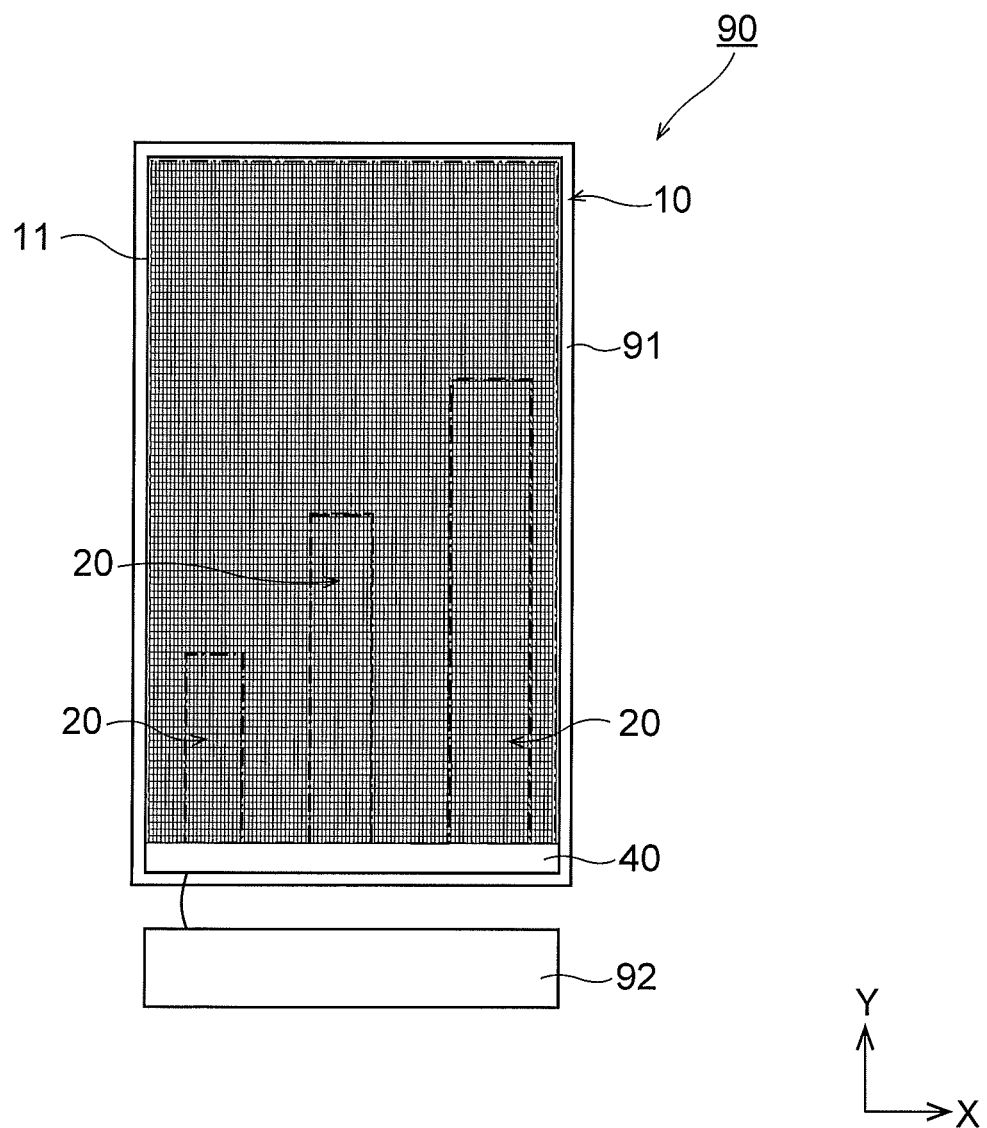
FIG. 24 is a plan view illustrating an image display device according to the second embodiment.

As illustrated in FIG. 24, the wiring board 10 is incorporated in an image display device 90 including the display 91. The wiring board 10 is arranged on the display 91. Examples of such an image display device 90 include a mobile terminal device such as a smartphone and a tablet. The antenna pattern region 20 of the wiring board 10 is electrically connected to the wireless communication circuit 92 of the image display device 90 via the power feeding unit 40. In this manner, radio waves of a predetermined frequency can be transmitted and received via the antenna pattern region 20 so that communication can be performed using the image display device 90. Note that the dummy pattern region 30 is separated from the antenna pattern region 20 and is electrically independent, and thus, there is no possibility that the transmission and reception of radio waves are affected by the provision of the dummy pattern region 30.

According to the present embodiment, the wiring board 10 includes: the substrate 11 having transparency and the antenna pattern region 20 including the plurality of antenna wirings 21 each of which is arranged on the substrate 11 and has the function as the antenna, and thus, the transparency of the wiring board 10 is ensured. As a result, when the wiring board 10 is arranged on the display 91, the display 91 can be seen through the opening portion 23 of the antenna pattern region 20, so that the visibility of the display 91 is not hindered.

Further, the dummy pattern region 30 including the plurality of dummy wirings 30a electrically independent of the antenna wiring 21 is arranged around the antenna pattern region 20 according to the present embodiment. Since the dummy pattern region 30 is arranged around the antenna pattern region 20 in this manner, a boundary between the antenna pattern region 20 and the other region can be made obscure. As a result, it is possible to make the antenna pattern region 20 hardly visible on the front surface of the display 91, and to make it difficult for a user of the image display device 90 to recognize the antenna pattern region 20 with the naked eye.

Further, according to the present embodiment, each of the antenna pattern region 20 and the dummy pattern region 30 is formed by repeating the predetermined unit pattern shape, and the unit pattern shape (the dummy wiring 30a) of the dummy pattern region 30 is the shape in which a part of the unit pattern shape 20a of the antenna pattern region 20 is missing. As a result, it is possible to make the boundary between the antenna pattern region 20 and the dummy pattern region 30 obscure, and to make it difficult to recognize the antenna pattern region 20 with the naked eye on the front surface of the display 91.

Further, the aperture ratio A2 of the dummy pattern region 30 is higher than the aperture ratio A1 of the antenna pattern region 20 according to the present embodiment. As a result, it is possible to ensure the transparency of the wiring board 10 while making it difficult to recognize the antenna pattern region 20.

Further, the antenna pattern region 20 includes the plurality of antenna connection wirings 22 connecting the plurality of antenna wirings 21 according to the present embodiment. As a result, it is possible to make the disconnection of the antenna wiring 21 difficult, and to suppress a decrease in the function of the antenna wiring 21 as the antenna.

[Modifications]

Next, various modifications of the wiring board will be described with reference to FIGS. 25 to 37. FIGS. 25 to 37 are views illustrating the various modifications of the wiring board. The respective modifications illustrated in FIGS. 25 to 37 are different in terms of the configuration of the antenna pattern region 20 and/or the dummy pattern region 30, and the other configurations thereof are substantially the same as those of the above-described embodiment. In FIGS. 25 to 37, the same portions as those of the modes illustrated in FIG. 18 to FIG. 24 are denoted by the same reference signs, and detailed descriptions thereof will be omitted.

[First Modification]

Figure 25:
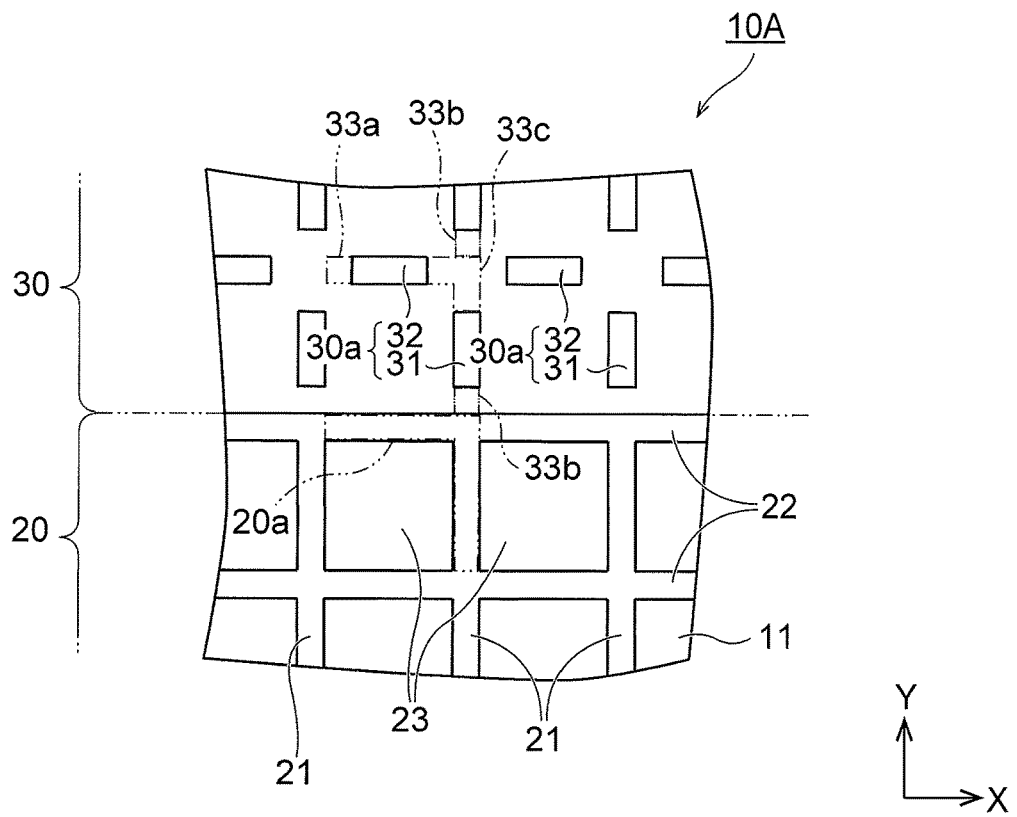
FIG. 25 is an enlarged plan view (view corresponding to FIG. 19) illustrating a modification of the wiring board according to the second embodiment.

FIG. 25 illustrates a wiring board 10A according to a first modification. In FIG. 25, the dummy pattern region 30 of the wiring board 10A includes the plurality of dummy wirings 30a each having a predetermined unit pattern shape. Each of the dummy wirings 30a is electrically independent of the antenna pattern region 20 (the antenna wiring 21 and the antenna connection wiring 22). Each of the dummy wirings 30a has the first dummy wiring portion 31 extending in the Y direction and the second dummy wiring portion 32 extending in the X direction. In this case, the first dummy wiring portion 31 and the second dummy wiring portion 32 of each of the dummy wirings 30a are arranged apart from each other in a plane direction.

The void portion 33c is formed between the first dummy wiring portion 31 and the second dummy wiring portion 32 of each of the dummy wirings 30a. Further, when assuming a case where the dummy wiring 30a is supplemented with the void portion 33c, the void portions 33a and 33b are formed, respectively, between the dummy wirings 30a adjacent to each other in the X direction and between the dummy wirings 30a adjacent to each other in the Y direction.

The dummy wiring 30a in the dummy pattern region 30 has a shape in which a part of the unit pattern shape 20a in the antenna pattern region 20 is missing. That is, the shape of the dummy wiring 30a is a shape obtained by removing the void portions 33a, 33b, and 33c from the L-shaped unit pattern shape 20a of the antenna pattern region 20. Note that the aperture ratio A2 of the dummy pattern region 30 can be set, for example, in a range of 85% or more and less than 100%.

As the first dummy wiring portion 31 and the second dummy wiring portion 32 of each of the dummy wirings 30a are arranged apart from each other in the plane direction in this manner, an aperture ratio of the dummy pattern region 30 can be further increased, and the transparency of the wiring board 10A can be improved.

[Second Modification]

Figure 26:
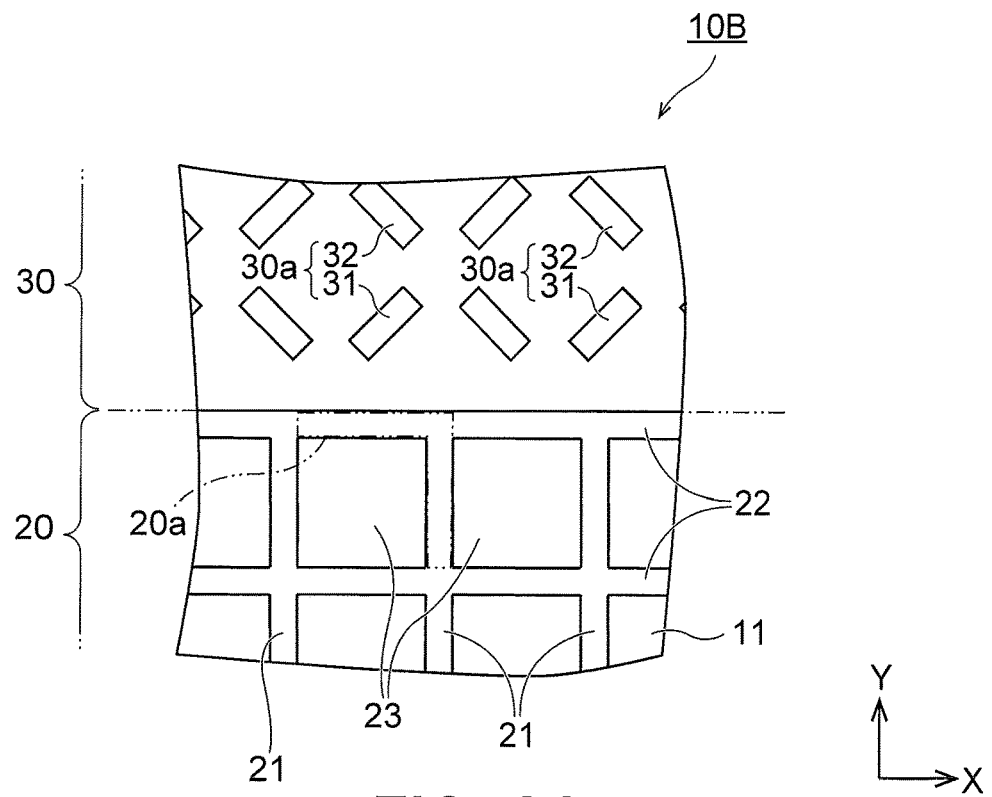
FIG. 26 is an enlarged plan view (view corresponding to FIG. 19) illustrating a modification of the wiring board according to the second embodiment.

FIG. 26 illustrates a wiring board 1013 according to a second modification. In FIG. 26, the dummy pattern region 30 of the wiring board 1013 includes the plurality of dummy wirings 30a each having a predetermined unit pattern shape. Each of the dummy wirings 30a is electrically independent of the antenna pattern region 20 (the antenna wiring 21 and the antenna connection wiring 22). The dummy wiring 30a has the first dummy wiring portion 31 and the second dummy wiring portion 32 extending obliquely with respect to the X direction and the Y direction, respectively. The first dummy wiring portion 31 and the second dummy wiring portion 32 of each of the dummy wirings 30a are arranged apart from each other in a plane direction. In this case, a longitudinal direction of the first dummy wiring portion 31 is arranged to be inclined by 45° with respect to a longitudinal direction of the antenna wiring 21. Further, a longitudinal direction of the second dummy wiring portion 32 is located in a direction orthogonal to the longitudinal direction of the first dummy wiring portion 31. Note that the aperture ratio A2 of the dummy pattern region 30 can be set, for example, in a range of 85% or more and less than 100%.

As the first dummy wiring portion 31 and the second dummy wiring portion 32 of each of the dummy wirings 30a are arranged obliquely with respect to the antenna wiring 21 in this manner, it is possible to suppress generation of an interference fringe caused by a diffraction grating.

[Third Modification]

Figure 27:
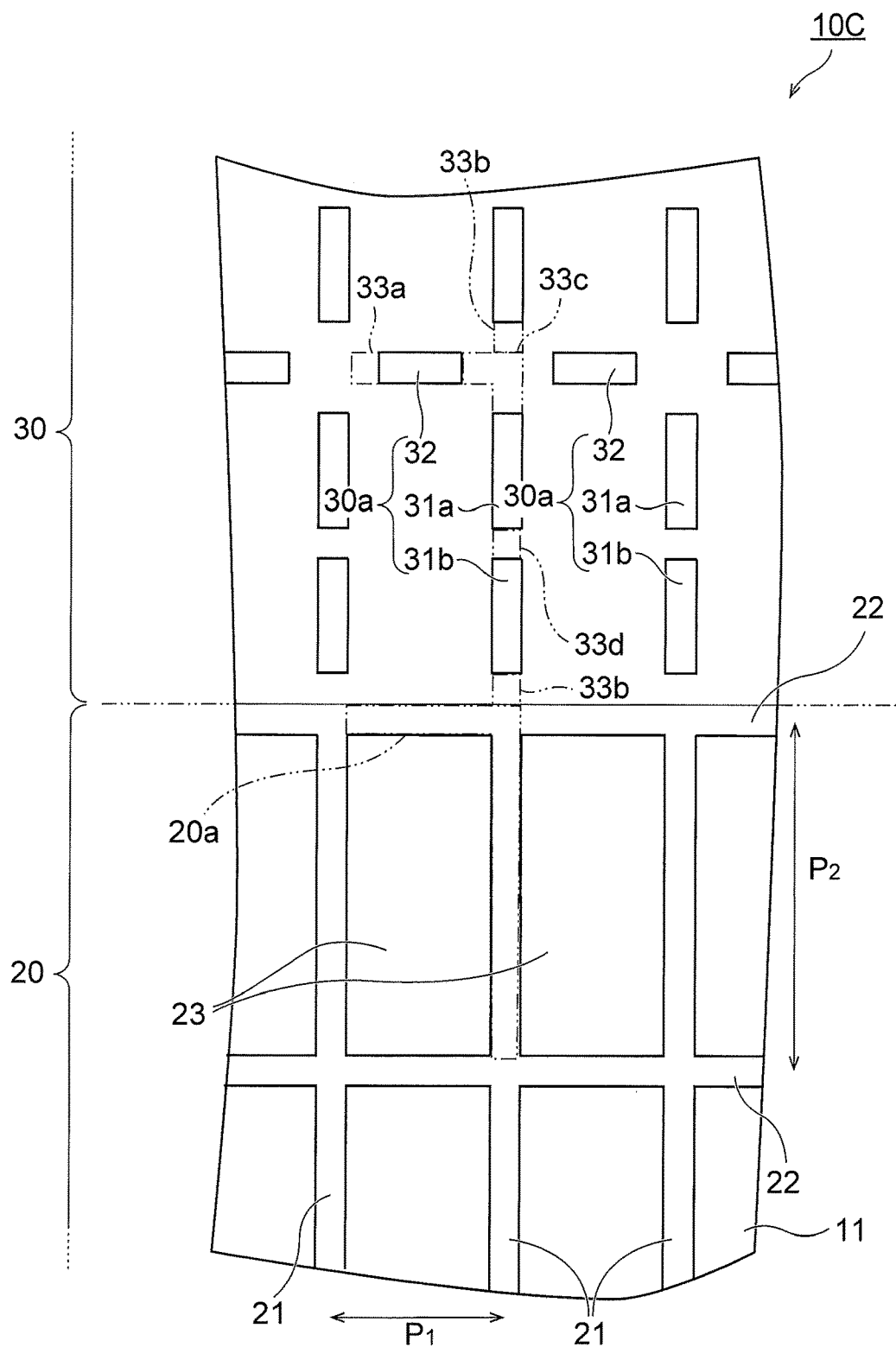
FIG. 27 is an enlarged plan view (view corresponding to FIG. 19) illustrating a modification of the wiring board according to the second embodiment.

FIG. 27 illustrates a wiring board 10C according to a third modification. In FIG. 27, the antenna pattern region 20 of the wiring board 10C includes the plurality of antenna wirings 21 each having a function as an antenna and the plurality of antenna connection wirings 22 that connect the plurality of antenna wirings 21. In this case, the pitch $P_1$ of the antenna wiring 21 is smaller than the pitch $P_2$ of the antenna connection wiring 22 ($P_1 < P_2$). The pitch $P_1$ of the antenna wiring 21 can be set, for example, in a range of 0.01 mm or more and 1 mm or less, and the pitch $P_2$ of the antenna connection wiring 22 can be set, for example, in a range of 0.03 mm or more and 1 mm or less. Each of the opening portions 23 has a substantially rectangular shape that is longer in the Y direction than in the X direction in a plan view. As described above, the transparency of the entire wiring board 10C can be further increased by increasing the area of each of the opening portions 23.

Further, the dummy pattern region 30 includes the plurality of dummy wirings 30a each having a predetermined unit pattern shape. Each of the dummy wirings 30a is electrically independent of the antenna pattern region 20 (the antenna wiring 21 and the antenna connection wiring 22). The dummy wiring 30a includes a pair of first dummy wiring portions 31a and 31b each extending in the Y direction, and the second dummy wiring portion 32 extending in the X direction. In this case, the first dummy wiring portion 31a, the first dummy wiring portion 31b, and the second dummy wiring portion 32 of each of the dummy wirings 30a are arranged apart from each other in a plane direction.

The void portion 33c is formed between the first dummy wiring portion 31a and the second dummy wiring portion 32 of each of the dummy wirings 30a. Further, a void portion 33d is formed between the first dummy wiring portions 31a and 31b. Furthermore, when assuming a case where the dummy wiring 30a is supplemented with the void portions 33c and 33d, the void portions 33a and 33b are formed, respectively, between the dummy wirings 30a adjacent to each other in the X direction and between the dummy wirings 30a adjacent to each other in the Y direction. In this case, the dummy wiring 30a in the dummy pattern region 30 has a shape in which a part of the unit pattern shape 20a in the antenna pattern region 20 is missing. That is, the shape of the dummy wiring 30a is a shape obtained by removing the void portions 33a to 33d from the L-shaped unit pattern shape 20a of the antenna pattern region 20. Note that the aperture ratio A2 of the dummy pattern region 30 can be set, for example, in a range of 90% or more and less than 100%.

The transparency of the wiring board 10C can be improved by increasing an opening region of the antenna pattern region 20 and the dummy pattern region 30 (a region where metal portions such as the antenna wiring 21, the antenna connection wiring 22, and the dummy wiring 30a are not present and the substrate 11 is exposed) in this manner.

[Fourth Modification]

Figure 28:
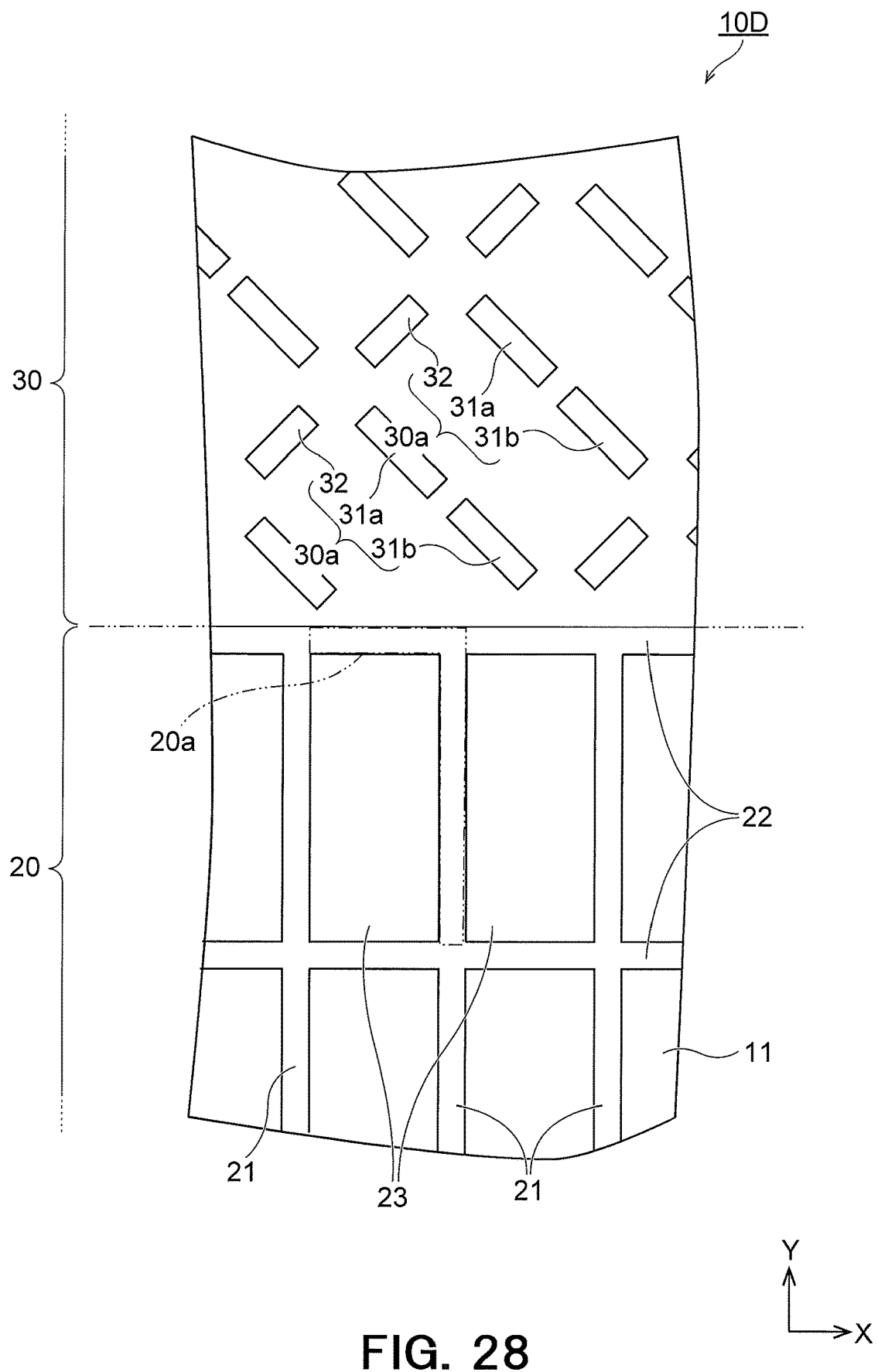
FIG. 28 is an enlarged plan view (view corresponding to FIG. 19) illustrating a modification of the wiring board according to the second embodiment.

FIG. 28 illustrates a wiring board 10D according to a fourth modification. In FIG. 28, the dummy pattern region 30 of the wiring board 10D includes the plurality of dummy wirings 30a each having a predetermined unit pattern shape. Each of the dummy wirings 30a is electrically independent of the antenna pattern region 20 (the antenna wiring 21 and the antenna connection wiring 22). The dummy wiring 30a includes the pair of first dummy wiring portions 31a and 31b extending obliquely with respect to the X direction and the Y direction, respectively, and the second dummy wiring portion 32 extending obliquely with respect to the X direction and the Y direction. The first dummy wiring portion 31a, the first dummy wiring portion 31b, and the second dummy wiring portion 32 of each of the dummy wirings 30a are arranged apart from each other in a plane direction. In this case, longitudinal directions of the pair of first dummy wiring portions 31a and 31b are arranged to be inclined by 45° with respect to a longitudinal direction of the antenna wiring 21. Further, a longitudinal direction of the second dummy wiring portion 32 is located in a direction orthogonal to the longitudinal direction of each of the first dummy wiring portions 31a and 31b. Note that the aperture ratio A2 of the dummy pattern region 30 can be set, for example, in a range of 90% or more and less than 100%.

As the first dummy wiring portions 31a and 31b and the second dummy wiring portion 32 of each of the dummy wirings 30a are arranged obliquely with respect to the antenna wiring 21 in this manner, it is possible to suppress generation of an interference fringe caused by a diffraction grating.

[Fifth Modification]

Figure 29:
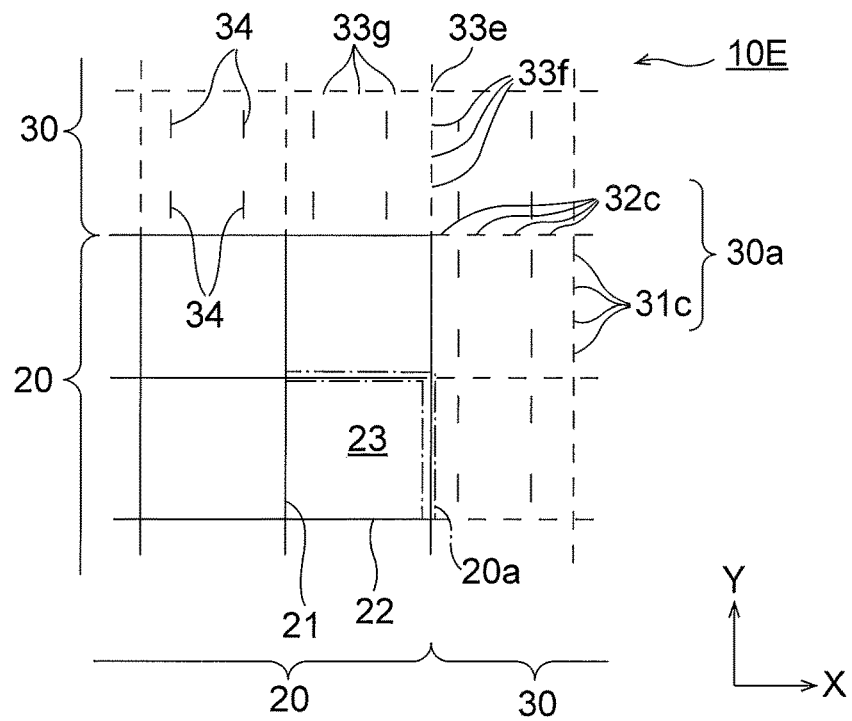
FIG. 29 is an enlarged plan view illustrating a modification of the wiring board according to the second embodiment.

FIG. 29 illustrates a wiring board 10E according to a fifth modification. In FIG. 29, the dummy pattern region 30 of the wiring board 10E includes the plurality of dummy wirings 30a each having a predetermined unit pattern shape. Each of the dummy wirings 30a is electrically independent of the antenna pattern region 20 (the antenna wiring 21 and the antenna connection wiring 22). The dummy wiring 30a includes a plurality of (four) first dummy wiring portions 31c each extending in the Y direction and a plurality of (four) second dummy wiring portions 32c extending in the X direction. In this case, the plurality of first dummy wiring portions 31c are arranged apart from each other in the Y direction, and the plurality of second dummy wiring portions 32c are arranged apart from each other in the X direction.

A void portion 33e is formed at an intersection portion between the first dummy wiring portion 31a and the second dummy wiring portion 32c of the dummy wiring 30a. Further, a void portion 33f is formed between the plurality of first dummy wiring portions 31c. Further, a void portion 33g is formed between each of the plurality of second dummy wiring portions 32c. In this case, the dummy wiring 30a in the dummy pattern region 30 has a shape in which a part of the unit pattern shape 20a in the antenna pattern region 20 is missing. That is, the shape of the dummy wiring 30a is a shape obtained by removing the void portions 33e to 33g from the L-shaped unit pattern shape 20a of the antenna pattern region 20.

In the present modification, an additional pattern 34 apart from the dummy wiring 30a of the dummy pattern region 30 is arranged in the dummy pattern region 30. In this case, the additional pattern 34 is arranged apart from the plurality of first dummy wiring portions 31c and the plurality of second dummy wiring portions 32c in both the X direction and the Y direction. In this case, each of the additional patterns 34 extends linearly in parallel with the Y direction. Further, a plurality of (four) additional patterns 34 are arranged for one dummy wiring 30a. It is preferable that the total area of the plurality of (four) additional patterns 34 be close to the area of the void portions 33e to 33g of each of the dummy wirings 30a. Note that a material of the additional pattern 34 can be the same metal material as the material of the dummy wiring 30a.

As the additional pattern 34 is arranged in the dummy pattern region 30 in this manner, a difference (|A2−A1|) between the aperture ratio A2 of the dummy pattern region 30 and the aperture ratio A1 of the antenna pattern region 20 can be made close to zero. Specifically, the difference between the aperture ratio A2 and the aperture ratio A1 can be set in a range of 0% or more and 1% or less. As a result, it is possible to make the boundary between the antenna pattern region 20 and the dummy pattern region 30 obscure, and to make it difficult to recognize the antenna pattern region 20 with the naked eye.

[Sixth Modification]

Figure 30:
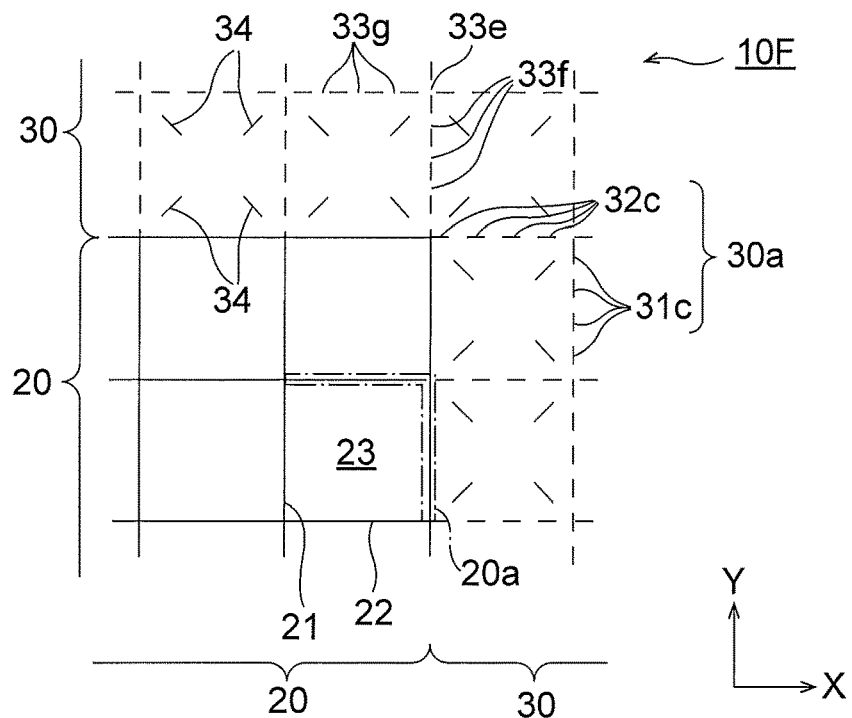
FIG. 30 is an enlarged plan view illustrating a modification of the wiring board according to the second embodiment.

FIG. 30 illustrates a wiring board 10F according to a sixth modification. In FIG. 30, the additional patterns 34 apart from the dummy wiring 30a of the dummy pattern region 30 are arranged in the dummy pattern region 30. In this case, each of the additional patterns 34 extends linearly to be inclined with respect to each of the X direction and the Y direction. In FIG. 30, a plurality of (four) additional patterns 34 are arranged for one dummy wiring 30a. The other configurations are substantially the same as those of the wiring board 10E (fifth modification) illustrated in FIG. 29.

[Seventh Modification]

Figure 31:
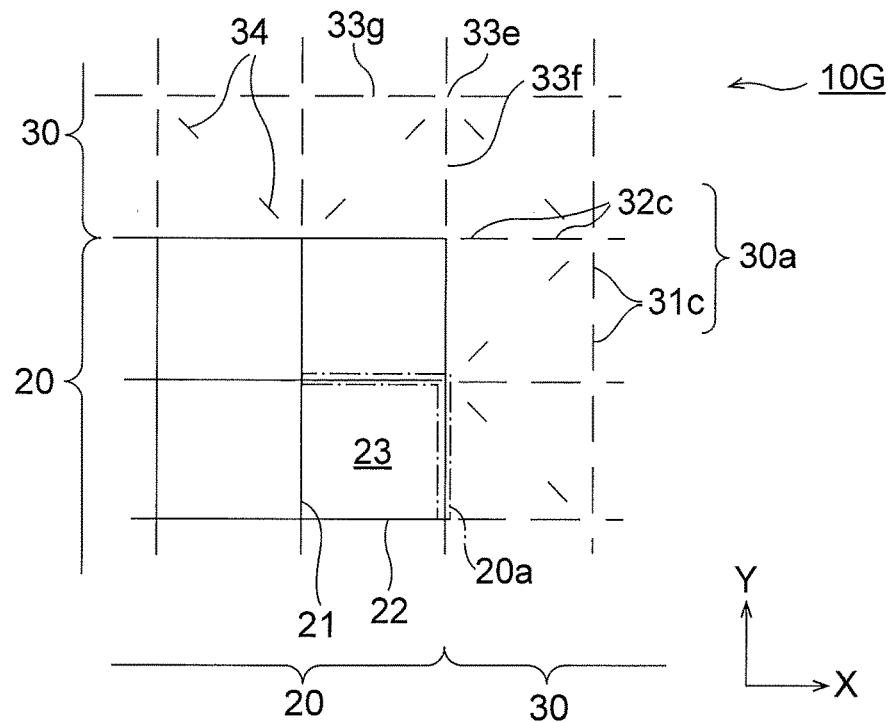
FIG. 31 is an enlarged plan view illustrating a modification of the wiring board according to the second embodiment.

FIG. 31 illustrates a wiring board 10G according to a seventh modification. In FIG. 31, the dummy wiring 30a includes a plurality of (two) first dummy wiring portions 31c each extending in the Y direction and a plurality of (two) second dummy wiring portions 32c extending in the X direction. Further, each of the additional patterns 34 extends linearly to be inclined with respect to each of the X direction and the Y direction. In this case, a plurality of (two) additional patterns 34 are arranged for one dummy wiring 30a. The other configurations are substantially the same as those of the wiring board 10E (fifth modification) illustrated in FIG. 29.

[Eighth Modification]

Figure 32:
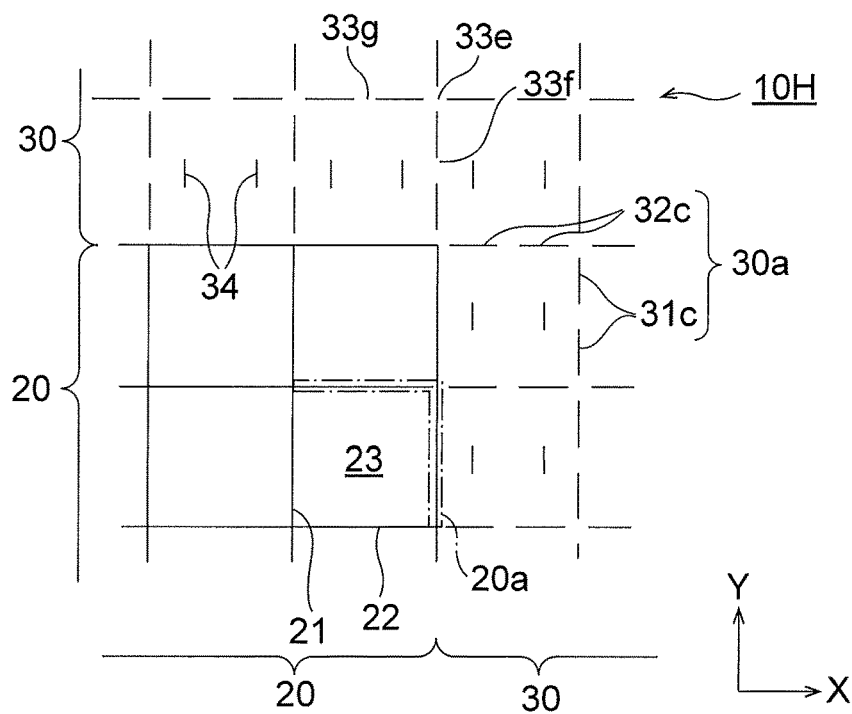
FIG. 32 is an enlarged plan view illustrating a modification of the wiring board according to the second embodiment.

FIG. 32 illustrates a wiring board 10H according to an eighth modification. In FIG. 32, the dummy wiring 30a includes the plurality of (two) first dummy wiring portions 31c each extending in the Y direction and the plurality of (two) second dummy wiring portions 32c extending in the X direction. Among them, one first dummy wiring portion 31c and one second dummy wiring portion 32c are connected to each other to form an L-shaped portion in a plan view. In this case, each of the additional patterns 34 extends linearly in parallel with respect to the Y direction. Further, a plurality of (two) additional patterns 34 are arranged for one dummy wiring 30a. The other configurations are substantially the same as those of the wiring board 10E (fifth modification) illustrated in FIG. 29.

[Ninth Modification]

Figure 33:
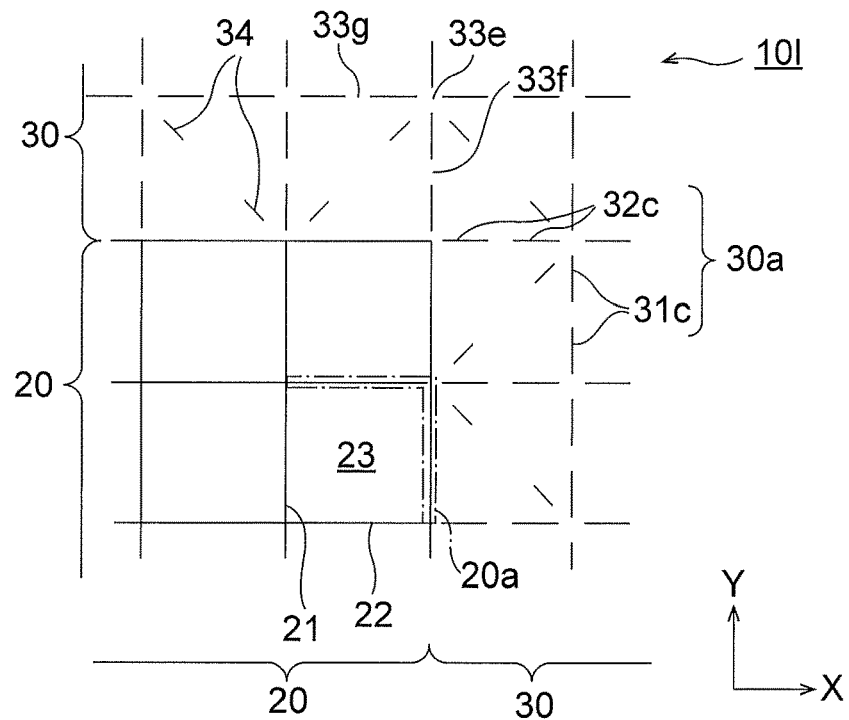
FIG. 33 is an enlarged plan view illustrating a modification of the wiring board according to the second embodiment.

FIG. 33 illustrates a wiring board 10I according to a ninth modification. In FIG. 33, each of the additional patterns 34 extends linearly to be inclined with respect to each of the X direction and the Y direction. In this case, a plurality of (two) additional patterns 34 are arranged for one dummy wiring 30a. The other configurations are substantially the same as those of the wiring board 10H (eighth modification) illustrated in FIG. 32.

[Tenth Modification]

Figure 34:
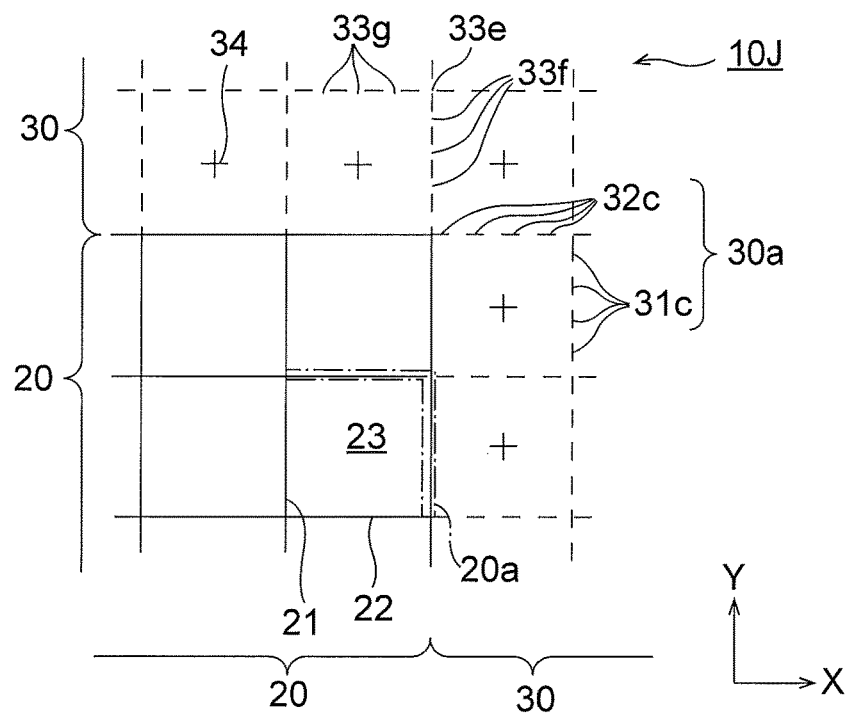
FIG. 34 is an enlarged plan view illustrating a modification of the wiring board according to the second embodiment.

FIG. 34 illustrates a wiring board 10J according to a tenth modification. In FIG. 34, each of the additional patterns 34 has a cross shape in a plan view. In this case, one additional pattern 34 is arranged for one dummy wiring 30a. The other configurations are substantially the same as those of the wiring board 10E (fifth modification) illustrated in FIG. 29.

[Eleventh Modification]

Figure 35:
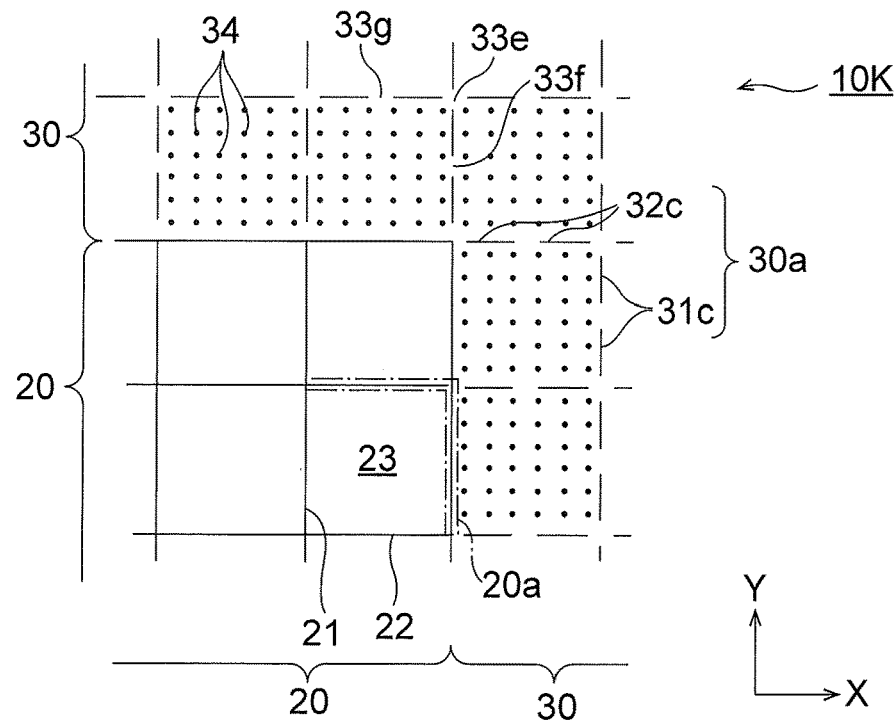
FIG. 35 is an enlarged plan view illustrating a modification of the wiring board according to the second embodiment.

FIG. 35 illustrates a wiring board 10K according to an eleventh modification. In FIG. 35, each of the additional patterns 34 has a dot shape in a plan view. In this case, a plurality of dot-shaped additional patterns 34 are arranged for one dummy wiring 30a, and the plurality of additional patterns 34 are aligned in both the X direction and the Y direction. The other configurations are substantially the same as those of the wiring board 10G (seventh modification) illustrated in FIG. 31.

[Twelfth Modification]

Figure 36:
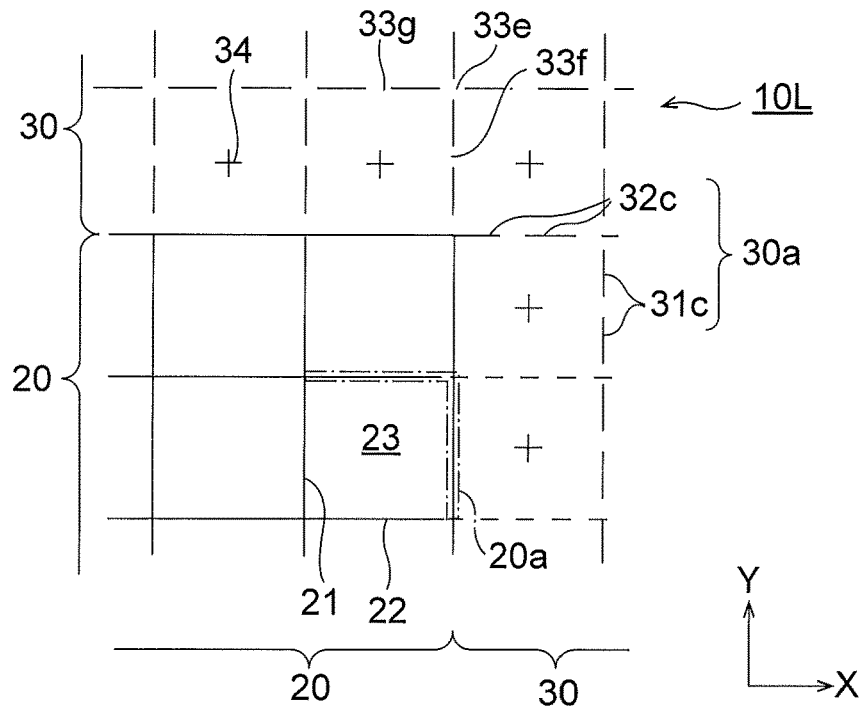
FIG. 36 is an enlarged plan view illustrating a modification of the wiring board according to the second embodiment.
Figure 37:
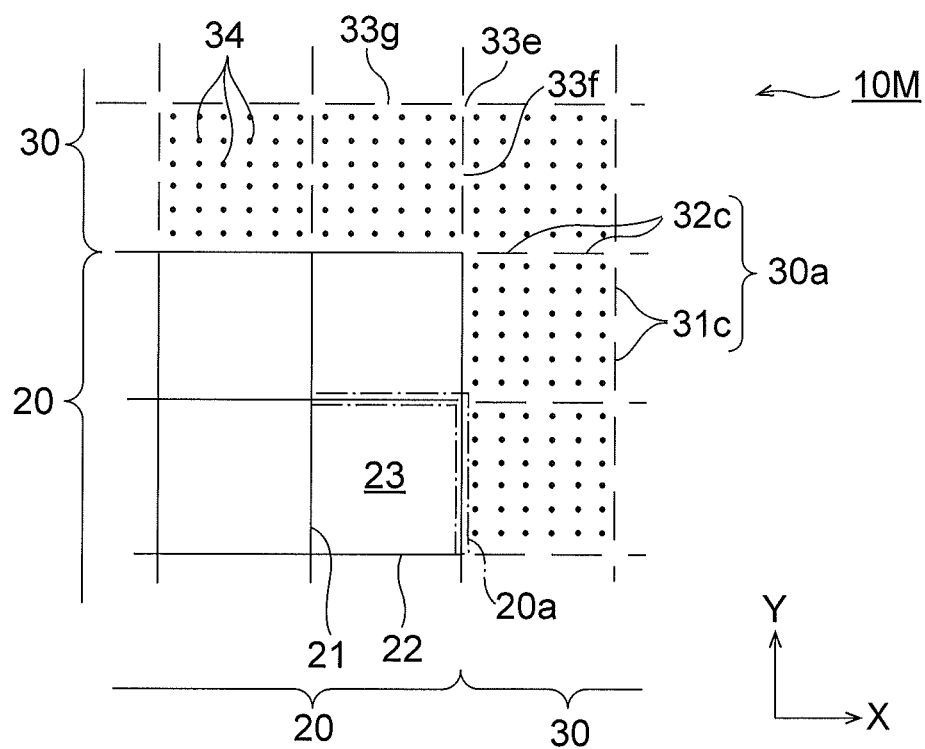
FIG. 37 is an enlarged plan view illustrating a modification of the wiring board according to the second embodiment.

FIG. 36 illustrates a wiring board 10L according to a twelfth modification. In FIG. 36, each of the additional patterns 34 has a cross shape in a plan view. In this case, one additional pattern 34 is arranged for one dummy wiring 30a. The other configurations are substantially the same as those of the wiring board 10H (eighth modification) illustrated in FIG. 32.

[Thirteenth Modification]

FIG. 36 illustrates a wiring board 10M according to a thirteenth modification. In FIG. 36, each of the additional patterns 34 has a dot shape in a plan view. In this case, a plurality of dot-shaped additional patterns 34 are arranged for one dummy wiring 30a, and the plurality of additional patterns 34 are aligned in both the X direction and the Y direction. The other configurations are substantially the same as those of the wiring board 10H (eighth modification) illustrated in FIG. 32.

Note that the additional pattern 34 may be provided in the dummy pattern region 30 even in each of the wiring boards 10 and 10A to 10D illustrated in FIGS. 18 to 28 although not illustrated.

Third Embodiment

Next, a third embodiment will be described with reference to FIGS. 38 to 51. FIGS. 38 to 51 are views illustrating the third embodiment. In FIGS. 38 to 51, the same portions as those of the second embodiment illustrated in FIG. 18 to FIG. 37 are denoted by the same reference signs, and detailed descriptions thereof will be omitted.

[Configuration of Wiring Board]

A configuration of the wiring board according to the present embodiment will be described with reference to FIGS. 38 to 42. FIGS. 38 to 42 are views illustrating the wiring board according to the present embodiment.

Figure 38:
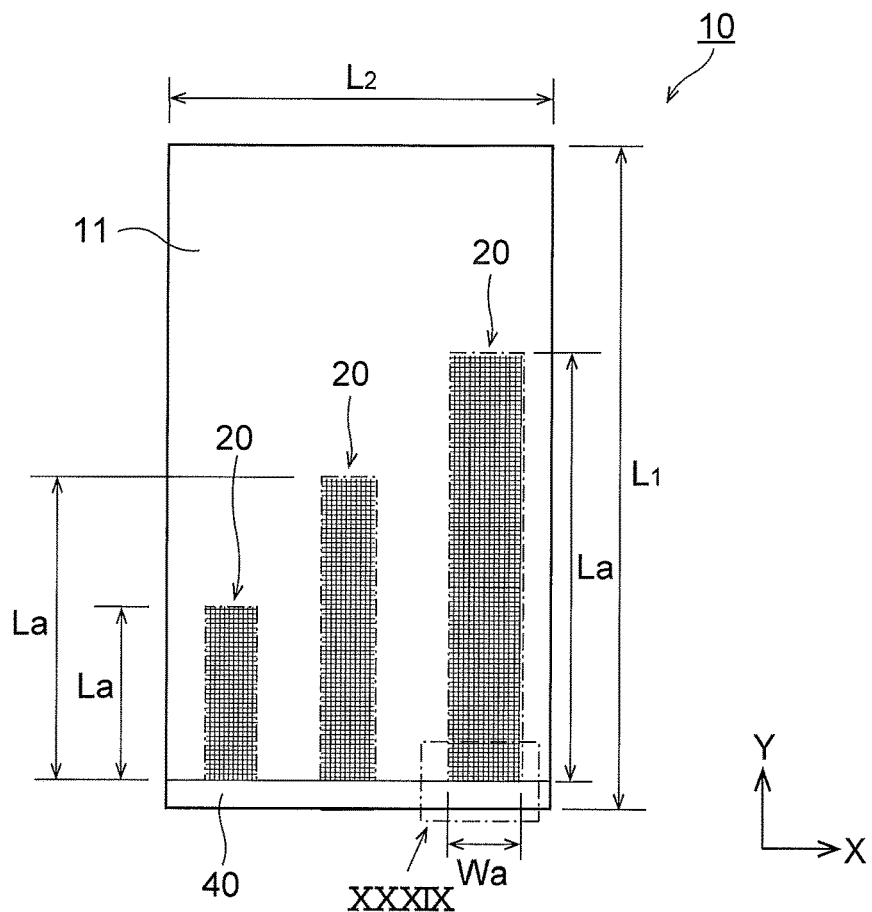
FIG. 38 is a plan view illustrating a wiring board according to a third embodiment.

As illustrated in FIG. 38, the wiring board 10 according to the present embodiment is arranged, for example, on a display of an image display device. Such a wiring board 10 includes the substrate 11 having transparency and the antenna pattern region 20 arranged on the substrate 11. Further, a power feeding unit 40 is electrically connected to the antenna pattern region 20.

The configuration of the substrate 11 is substantially the same as that in the case of the second embodiment.

Each of the antenna pattern regions 20 is substantially rectangular in a plan view. Each of the antenna pattern regions 20 has a longitudinal direction parallel to the Y direction and a lateral direction (width direction) parallel to the X direction. The length $L_a$ of each of the antenna pattern regions 20 in the longitudinal direction (Y direction) can be selected, for example, in a range of 3 mm or more and 100 mm or less, and the width $W_a$ of each of the antenna pattern regions 20 in the lateral direction (width direction) can be selected, for example, in a range of 1 mm or more and 10 mm or less.

The antenna pattern region 20 has metal lines formed in a lattice shape or a mesh shape, and has a repetitive pattern in the X direction and the Y direction. That is, the antenna pattern region 20 is configured by repeating the L-shaped unit pattern shape 20a (see FIG. 40) constituted by a portion extending in the X direction (a part of the antenna connection wiring 22 to be described later) and a portion extending in the Y direction (a part of the antenna wiring 21 to be described later).

Figure 39:
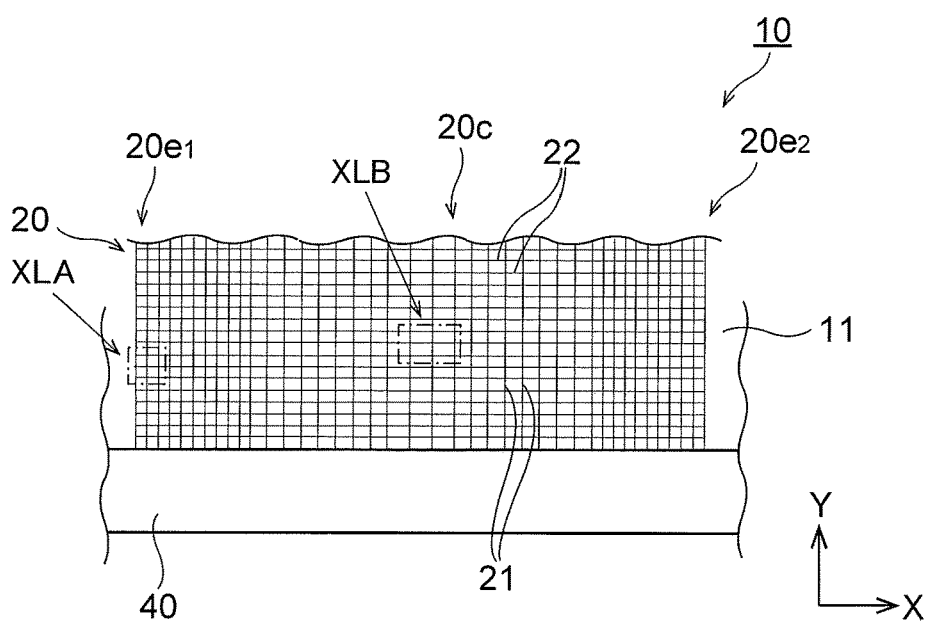
FIG. 39 is an enlarged plan view (enlarged view of Part XXXIX of FIG. 38) illustrating the wiring board according to the third embodiment.
Figure 40:
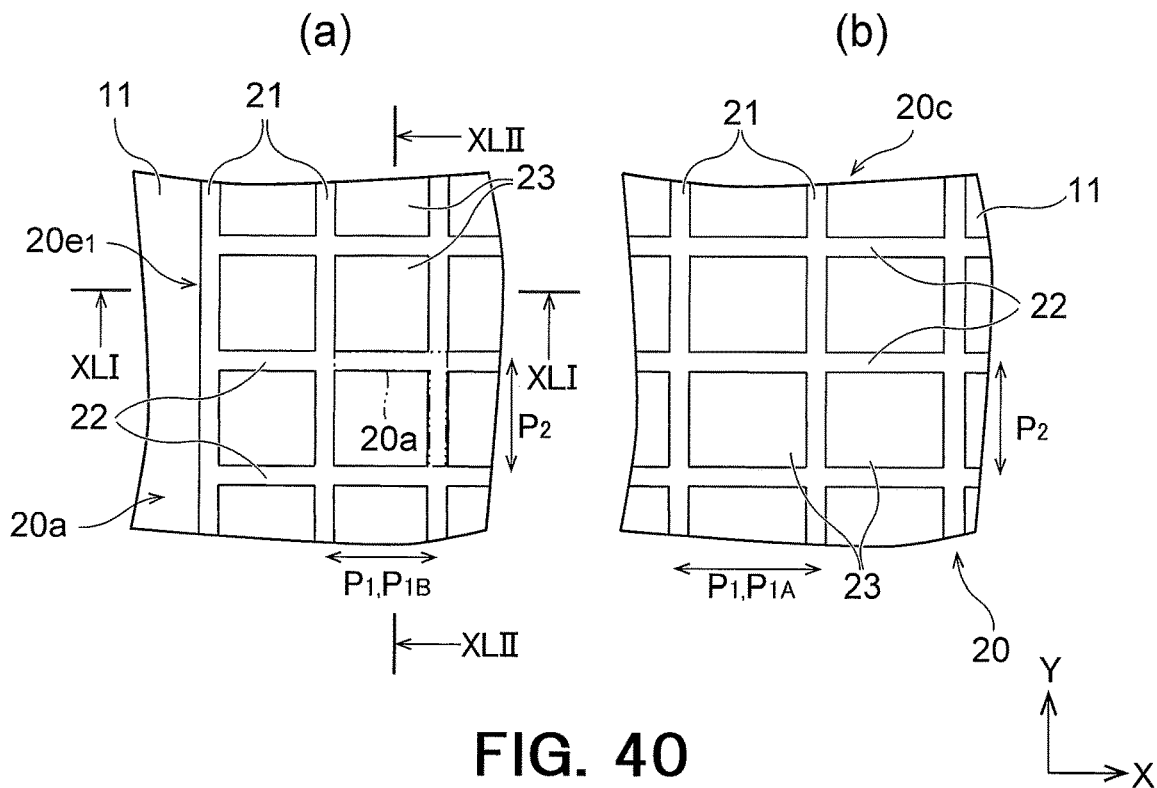
FIGS. 40(*a*) and 40(*b*) are enlarged plan views (enlarged views of Parts XLA and XLB of FIG. 39) illustrating the wiring board according to the third embodiment.

As illustrated in FIG. 39, each of the antenna pattern regions 20 includes the plurality of antenna wirings 21 each having a function as an antenna and the plurality of antenna connection wirings 22 that connect the plurality of antenna wirings 21. Specifically, the plurality of antenna wirings 21 and the plurality of antenna connection wirings 22 are integrally formed as a whole to form a lattice shape or a mesh shape. Each of the antenna wirings 21 extends in the direction corresponding to the frequency band of the antenna (the longitudinal direction and the Y direction), and each of the antenna connection wirings 22 extends in a direction (the width direction and the X direction) orthogonal to the antenna wiring 21. The antenna wiring 21 mainly functions as the antenna by having the length $L_a$ (the length of the above-described antenna pattern region 20, see FIG. 38) corresponding to a predetermined frequency band. On the other hand, the antenna connection wiring 22 connects these antenna wirings 21 to each other, thereby serving a role of suppressing a problem such as the disconnection of the antenna wiring 21 or failure in electrical connection between the antenna wiring 21 and the power feeding unit 40.

In each of the antenna pattern regions 20, a plurality of opening portions 23 are formed by being surrounded by the antenna wirings 21 adjacent to each other and the antenna connection wirings 22 adjacent to each other. Further, the antenna pattern region 20 has a central portion 20c in the width direction (X direction) and a pair of edge portions $20e_1$ and $20e_2$ in the width direction (X direction). The widthwise central portion 20c refers to a portion that is equidistant along the width direction from both end edges in the width direction (X direction) of the antenna pattern region 20. Note that each of the widthwise central portion 20c and the widthwise edge portions $20e_1$ and $20e_2$ may have a certain width (length in the X direction). For example, the widthwise central portion 20c and the widthwise edge portions $20e_1$ and $20e_2$ may be regions each having a width (length in the X direction) of about 5% or more and 30% or less of the width $W_a$ of the antenna pattern region 20.

As illustrated in FIGS. 40(a) and 40(b), the plurality of antenna wirings 21 are arranged at an interval (the pitch $P_1$) in the width direction (X direction) of the antenna pattern region 20. In this case, the plurality of antenna wirings 21 are arranged at intervals different from each other between the central portion 20c in the width direction (X direction) of the antenna pattern region 20 and the edge portions $20e_1$ and $20e_2$ in the width direction (X direction). That is, the plurality of antenna wirings 21 are arranged at a wide pitch $P_{1A}$ in the widthwise central portion 20c of the antenna pattern region 20, and are arranged at a pitch $P_{1B}$ narrower than the pitch $P_{1A}$ in the widthwise edge portions $20e_1$ and $20e_2$ ($P_{1A} > P_{1B}$). Note that the pitch $P_1$ of the plurality of antenna wirings 21 is the widest in the widthwise central portion 20c of the antenna pattern region 20 (the pitch $P_{1A}$), and is the narrowest in the widthwise edge portions $20e_1$ and $20e_2$ (the pitch $P_{1B}$). Specifically, the pitch $P_{1A}$ of the antenna wiring 21 in the widthwise central portion 20c of the antenna pattern region 20 can be set, for example, in a range of 0.05 mm or more and 1 mm or less. The pitch $P_{1B}$ of the antenna wiring 21 in the widthwise edge portions $20e_1$ and $20e_2$ of the antenna pattern region 20 can be set, for example, in a range of 0.01 mm or more and 0.3 mm or less.

The pitch $P_1$ of the plurality of antenna wirings 21 may be gradually changed from the pitch $P_{1B}$ in each of the widthwise edge portions $20e_1$ and $20e_2$ to the pitch $P_{1A}$ in the widthwise central portion 20c. Alternatively, the plurality of antenna wirings 21 may be arranged at the uniform pitch $P_{1B}$ in a region near each of the widthwise edge portions $20e_1$ and $20e_2$, and arranged at the uniform pitch $P_{1A}$ in a region near the widthwise central portion 20c. Further, the pitch $P_{1B}$ of the antenna wiring 21 in one widthwise edge portion $20e_1$ is equal to the pitch $P_{1B}$ of the antenna wiring 21 in the other widthwise edge portion $20e_2$ in the present embodiment. However, the pitch $P_{1B}$ of the antenna wiring 21 may be different between the one widthwise edge portion $20e_1$ and the other widthwise edge portion $20e_2$ without being limited thereto.

The plurality of antenna connection wirings 22 are arranged at equal intervals in the longitudinal direction (Y direction) of the antenna pattern region 20. The pitch $P_2$ of the plurality of antenna connection wirings 22 can be set, for example, in a range of 0.01 mm or more and 1 mm or less. Each of the opening portions 23 has a substantially rectangular shape or a substantially square shape in a plan view, and the area of the opening portion 23 located on the widthwise central portion 20c side is larger than the area of the opening portion 23 located on the widthwise edge portions $20e_1$ and $20e_2$ side. Further, the substrate 11 having transparency is exposed from each of the opening portions 23. Thus, the transparency as the entire wiring board 10 can be increased by increasing the area of each of the opening portions 23. Note that the antenna wirings 21 and the antenna connection wirings 22 are orthogonal to each other, but are not limited thereto, and may intersect with each other at an acute angle or an obtuse angle. Further, the pitch $P_2$ of the antenna connection wiring 22 is uniform in the longitudinal direction of the antenna pattern region 20 (Y direction), but is not limited thereto, and may be non-uniform in the longitudinal direction (Y direction).

Figure 41:
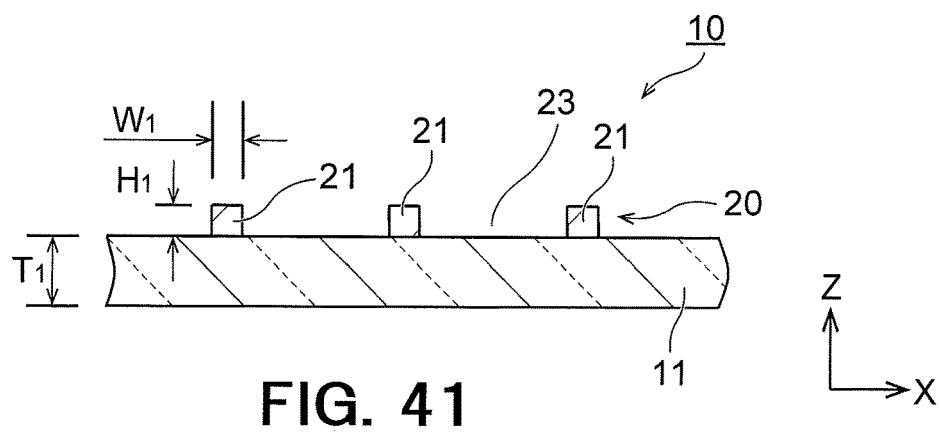
FIG. 41 is a cross-sectional view (cross-sectional view taken along a line XLI-XLI of FIG. 40) illustrating the wiring board according to the third embodiment.
Figure 42:
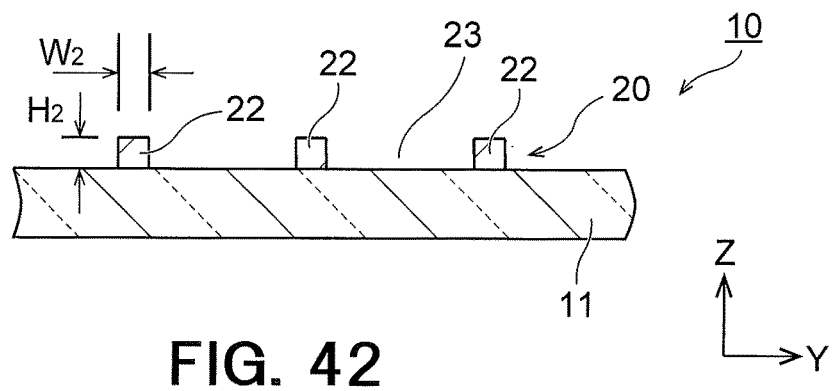
FIG. 42 is a cross-sectional view (cross-sectional view taken along a line XLII-XLII of FIG. 40) illustrating the wiring board according to the third embodiment.
Figure 43:
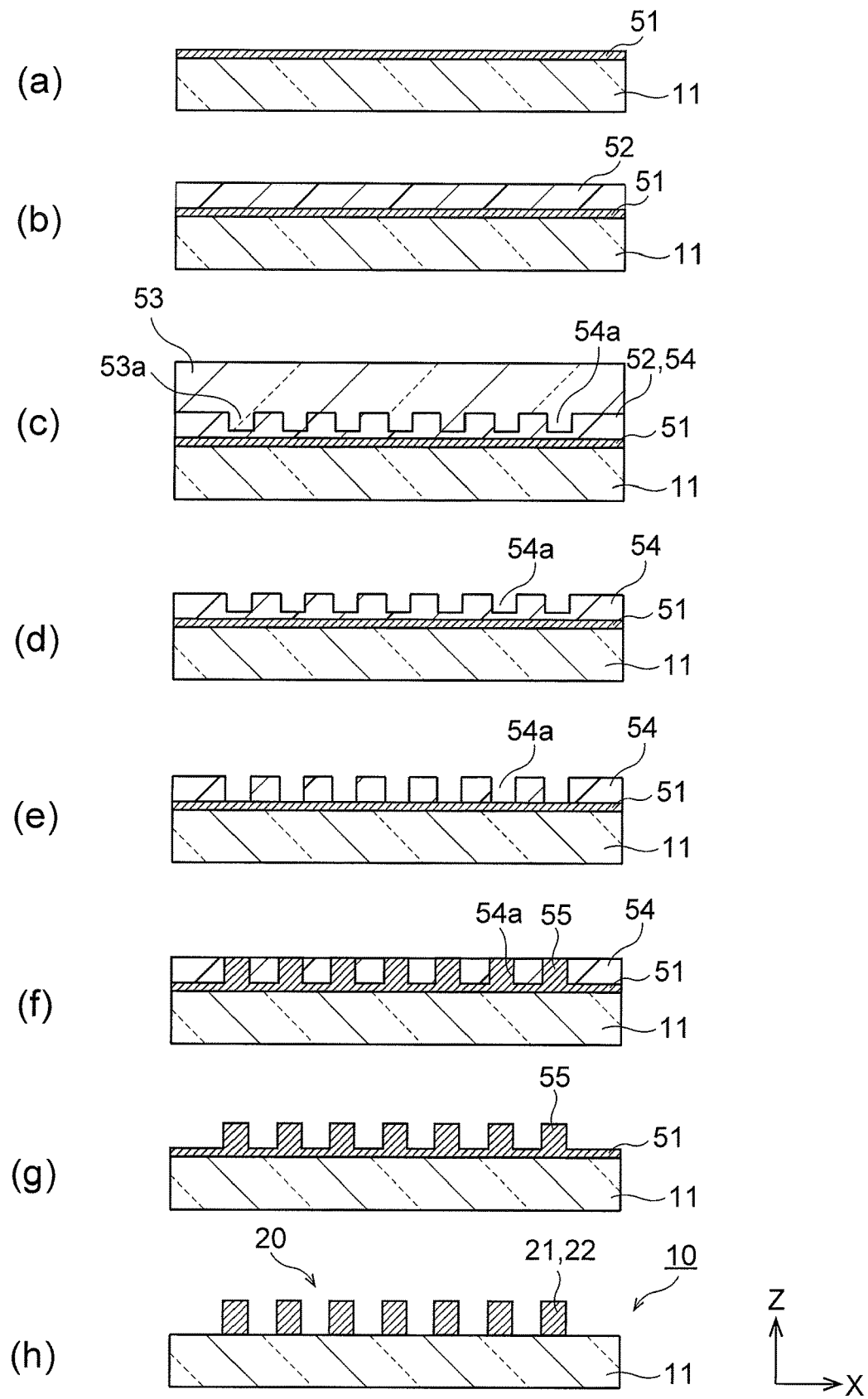
FIGS. 43(*a*) to 43(*h*) are cross-sectional views illustrating a method for manufacturing the wiring board according to the third embodiment.

As illustrated in FIGS. 41 and 42, a cross-sectional shape of each of the antenna wirings 21 and each of the antenna connection wirings 22 is substantially the same as that in the case of the second embodiment. Further, the same material as that in the case of the second embodiment can be used as each material of the antenna wiring 21 and the antenna connection wiring 22.

Meanwhile, in the present embodiment, the widthwise central portion 20c of the antenna pattern region 20 has a predetermined aperture ratio Ac, and each of the widthwise edge portions $20e_1$ and $20e_2$ of the antenna pattern region 20 has a predetermined aperture ratio Ae. Among these, the aperture ratio Ac in the widthwise central portion 20c can be set, for example, in a range of 87% or more and less than 100%. Further, the aperture ratio Ae in the widthwise edge portions $20e_1$ and $20e_2$ can be set, for example, in a range of 85% or more and 99% or less. As described above, the plurality of antenna wirings 21 are arranged at the relatively wide pitch $P_{1A}$ in the widthwise central portion 20c of the antenna pattern region 20, and arranged at the relatively narrow pitch $P_{1B}$ in the widthwise edge portions $20e_1$ and $20e_2$. Thus, the aperture ratio Ac in the widthwise central portion 20c of the antenna pattern region 20 is higher than the aperture ratio Ae in the widthwise edge portions $20e_1$ and $20e_2$ of the antenna pattern region 20 (Ac>Ae). As a result, a current distribution in the antenna pattern region 20 can be made more uniform as will be described later, and antenna characteristics can be improved.

Further, a difference between the aperture ratio Ac in the widthwise central portion 20c of the antenna pattern region 20 and the aperture ratio Ae in the widthwise edge portions $20e_1$ and $20e_2$ of the antenna pattern region 20 (|Ac−Ae|) is preferably set in a range of more than 0% and 15% or less. As the difference between the aperture ratio Ac and the aperture ratio Ae is set in the above range in this manner, it is possible to make the current distribution in the antenna pattern region 20 more uniform while maintaining the function as the antenna in the antenna pattern region 20.

Furthermore, a total aperture ratio At of the antenna pattern region 20 can be set, for example, in a range of 87% or more and less than 100%. As the total aperture ratio At of the wiring board 10 is set in this range, the conductivity and transparency of the wiring board 10 can be ensured.

Note that the aperture ratio refers to a ratio (%) of an area of an opening region (region where the metal portions such as the antenna wiring 21 and the antenna connection wiring 22 are not present and the substrate 11 is exposed) accounting for a unit area of a predetermined region (for example, a part of the antenna pattern region 20).

Further, a configuration of the power feeding unit 40 is substantially the same as that in the case of the second embodiment.

[Method for Manufacturing Wiring Board]

Next, a method for manufacturing the wiring board according to the present embodiment will be described with reference to FIGS. 43(a) to 43(h). FIGS. 43(a) to 43(h) are cross-sectional views illustrating the method for manufacturing the wiring board according to the present embodiment.

First, the substrate 11 is prepared, and the conductive layer 51 is formed on substantially the entire front surface of the substrate 11 as illustrated in FIG. 43(a). In the present embodiment, a thickness of the conductive layer 51 is 200 nm.

However, the thickness of the conductive layer 51 can be appropriately selected in a range of 10 nm or more and 1000 nm or less without being limited thereto. In the present embodiment, the conductive layer 51 is formed by a sputtering method using copper. As a method for forming the conductive layer 51, a plasma CVD method may be used.

Next, the photocurable insulating resist 52 is supplied to substantially the entire front surface of the substrate 11 as illustrated in FIG. 43(b). Examples of the photocurable insulating resist 52 include an organic resin such as an epoxy resin.

Subsequently, the transparent mold 53 for imprinting having the protrusion 53a is prepared (FIG. 43(c)), and the mold 53 and the substrate 11 are brought close to each other, and the photocurable insulating resist 52 is developed between the mold 53 and the substrate 11. Next, light irradiation is performed from the mold 53 side to cure the photocurable insulating resist 52, thereby forming an insulating layer 54. As a result, a trench 54a having a shape in which the protrusion 53a has been transferred is formed on a front surface of the insulating layer 54. The trench 54a has a planar shape pattern corresponding to the antenna wiring 21 and the antenna connection wiring 22.

Thereafter, the mold 53 is separated from the insulating layer 54 to obtain the insulating layer 54 having a cross-sectional structure illustrated in FIG. 43(d). A direction in which the mold 53 is separated from the insulating layer 54 is preferably the Y direction in which the longer antenna wiring 21 extends.

As the trench 54a is formed on the front surface of the insulating layer 54 by the imprinting method in this manner, a fine shape of the trench 54a can be made. Note that the insulating layer 54 may be formed by a photolithography method without being limited thereto. In this case, a resist pattern is formed by the photolithography method so as to expose the conductive layer 51 corresponding to the antenna wiring 21 and the antenna connection wiring 22.

As illustrated in FIG. 43(d), a residue of an insulating material may remain at a bottom of the trench 54a of the insulating layer 54. Thus, the residue of the insulating material is removed by performing a wet treatment using a permanganate solution or N-methyl-2-pyrrolidone or a dry treatment using oxygen plasma. As the residue of the insulating material is removed in this manner, the trench 54a exposing the conductive layer 51 can be formed as illustrated in FIG. 43(e).

Next, the trench 54a of the insulating layer 54 is filled with the conductor 55 as illustrated in FIG. 43(f). In the present embodiment, the trench 54a of the insulating layer 54 is filled with copper by an electrolytic plating method using the conductive layer 51 as a seed layer.

Subsequently, the insulating layer 54 is removed as illustrated in FIG. 43(g). In this case, the wet treatment using a permanganate solution or N-methyl-2-pyrrolidone or the dry treatment using oxygen plasma is performed to remove the insulating layer 54 on the substrate 11.

Thereafter, the conductive layer 51 on the front surface of the substrate 11 is removed as illustrated in FIG. 43(h). At this time, the conductive layer 51 is etched so as to expose the front surface of the substrate 11 by performing a wet process using a hydrogen peroxide solution. In this manner, the wiring board 10, which includes the substrate 11 and the antenna pattern region 20 arranged on the substrate 11, is obtained. In this case, the antenna pattern region 20 includes the antenna wiring 21 and the antenna connection wiring 22. The above-described conductor 55 includes the antenna wiring 21 and the antenna connection wiring 22. At this time, the power feeding unit 40 may be formed by a part of the conductor 55.

Alternatively, the power feeding unit 40 having a flat plate shape may be separately prepared, and this power feeding unit 40 may be electrically connected to the antenna pattern region 20.

[Operation of Present Embodiment]

Next, an operation of the wiring board having such a configuration will be described.

Figure 44:
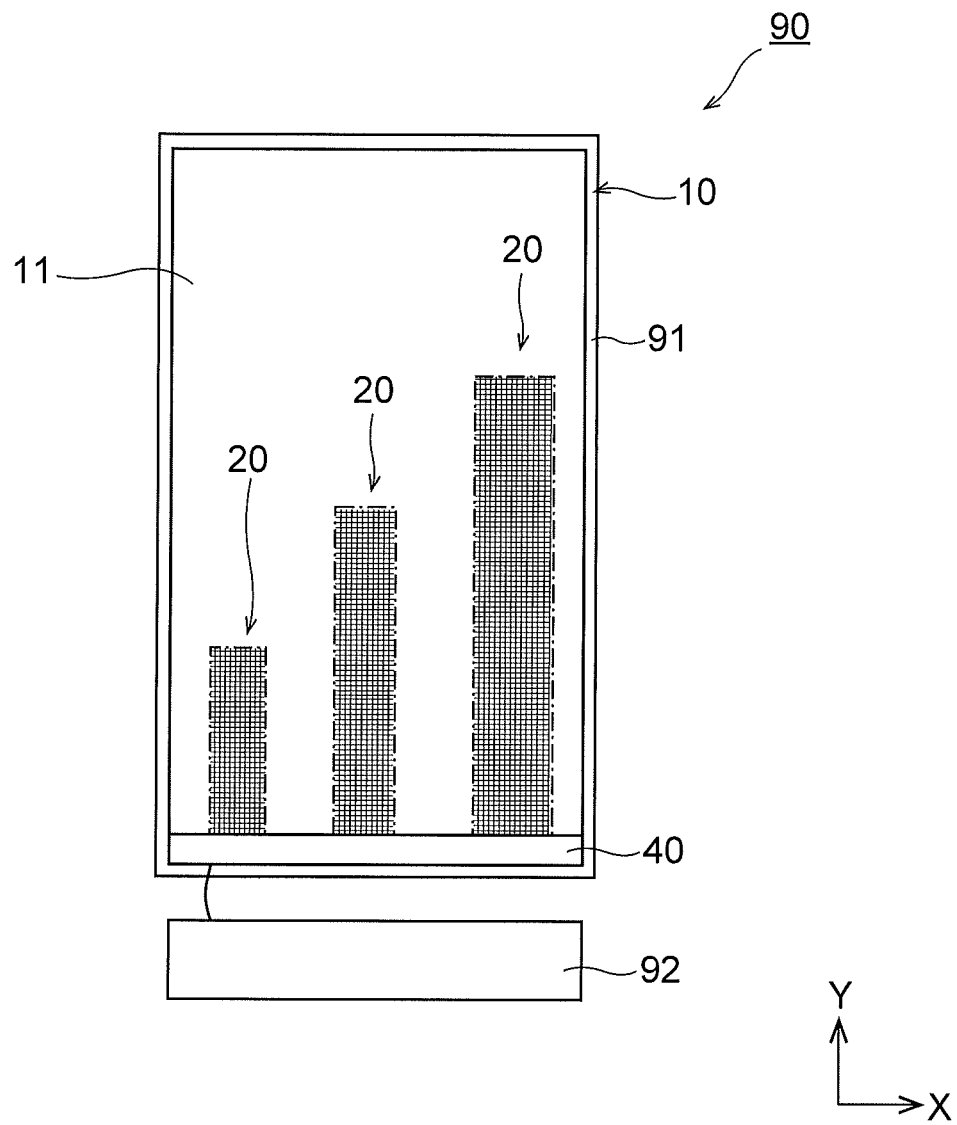
FIG. 44 is a plan view illustrating an image display device according to the third embodiment.

As illustrated in FIG. 44, the wiring board 10 is incorporated in the image display device 90 including the display 91. The wiring board 10 is arranged on the display 91. Examples of such an image display device 90 include a mobile terminal device such as a smartphone and a tablet. The antenna pattern region 20 of the wiring board 10 is electrically connected to the wireless communication circuit 92 of the image display device 90 via the power feeding unit 40. In this manner, radio waves of a predetermined frequency can be transmitted and received via the antenna pattern region 20 so that communication can be performed using the image display device 90.

Meanwhile, in general, a current value flowing through the antenna pattern region 20 is not uniform in the width direction (X direction) during transmission and reception of a radio wave using the antenna pattern region 20. Specifically, a current value flowing through the widthwise edge portions $20e_1$ and $20e_2$ of the antenna pattern region 20 is larger than a current value flowing through the widthwise central portion 20c of the antenna pattern region 20.

Figure 51:
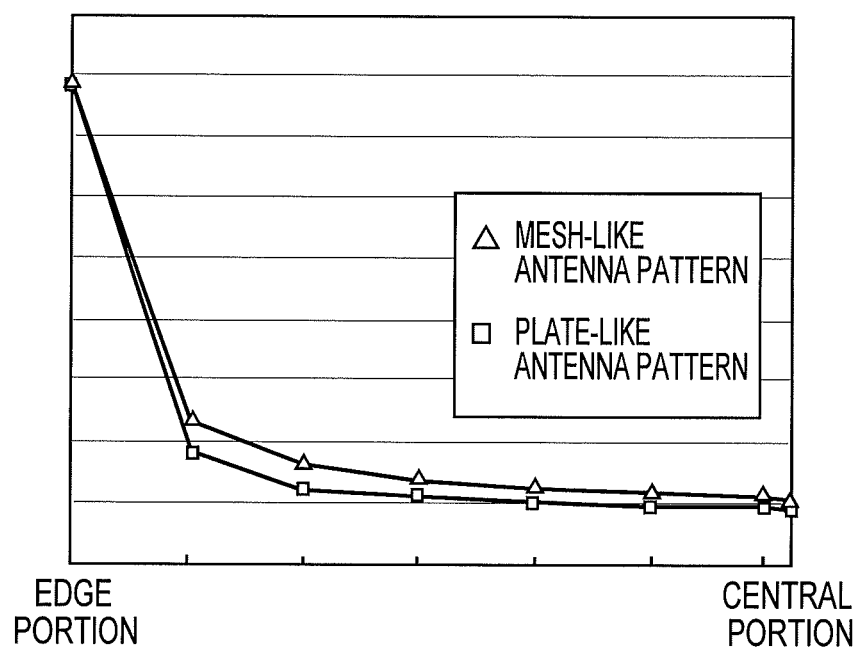
FIG. 51 is a graph illustrating current values flowing through a uniform mesh-like antenna pattern and a uniform plate-like antenna pattern in the third embodiment.

FIG. 51 illustrates, as a reference example, a value of a flowing current calculated with a uniform mesh-like antenna pattern and a uniform plate-like antenna pattern. In FIG. 51, the horizontal axis represents a position in the width direction of the antenna pattern, the left end of the horizontal axis indicates the widthwise edge portion of the antenna pattern, and the right end of the horizontal axis indicates the widthwise central portion of the antenna pattern. Further, the vertical axis represents a value of a current flowing through the antenna pattern. As apparent from FIG. 51, when the antenna pattern is the uniform mesh shape and the uniform plate shape, the current value is larger in the widthwise edge portion of the antenna pattern than in the widthwise central portion of the antenna pattern in both the cases. In this case, it is difficult to sufficiently improve antenna characteristics since the current distribution in the antenna pattern is not uniform.

In the present embodiment, however, the aperture ratio Ac in the widthwise central portion 20c of the antenna pattern region 20 is set to be higher than the aperture ratio Ae in the widthwise edge portions $20e_1$ and $20e_2$ of the antenna pattern region 20 (Ac>Ae). That is, the density (the pitch $P_{1A}$) of the antenna wirings 21 in the widthwise edge portions $20e_1$ and $20e_2$ having the high current value is set to be higher than the density (the pitch $P_{1B}$) of the antenna wirings 21 in the widthwise central portion 20c having the lower current value. As a result, as compared to the case where the mesh of the antenna pattern is uniform, the current distribution is made uniform between the widthwise central portion 20c and the widthwise edge portions $20e_1$ and $20e_2$ of the antenna pattern region 20 so that the antenna characteristics can be further improved.

Further, according to the present embodiment, the wiring board 10 includes: the substrate 11 having transparency and the antenna pattern region 20 including the plurality of antenna wirings 21 each of which is arranged on the substrate 11 and has the function as the antenna, and thus, the transparency of the wiring board 10 is ensured. As a result, when the wiring board 10 is arranged on the display 91, the display 91 can be seen through the opening portion 23 of the antenna pattern region 20, so that the visibility of the display 91 is not hindered.

Further, the antenna pattern region 20 includes the plurality of antenna connection wirings 22 connecting the plurality of antenna wirings 21 according to the present embodiment. As a result, it is possible to make the disconnection of the antenna wiring 21 difficult, and to suppress a decrease in the function of the antenna wiring 21 as the antenna.

[Modifications]

Next, various modifications of the wiring board will be described with reference to FIGS. 45 to 50. FIGS. 45 to 50 are views illustrating the various modifications of the wiring board. The modifications illustrated in FIGS. 45 to 50 are different in terms of the configuration of the antenna pattern region 20 and/or the power feeding unit 40, and the other configurations thereof are substantially the same as those of the above-described embodiment illustrated in FIGS. 38 to 44. In FIGS. 45 to 50, the same portions as those of the modes illustrated in FIG. 38 to FIG. 44 are denoted by the same reference signs, and detailed descriptions thereof will be omitted.

[First Modification]

Figure 45:
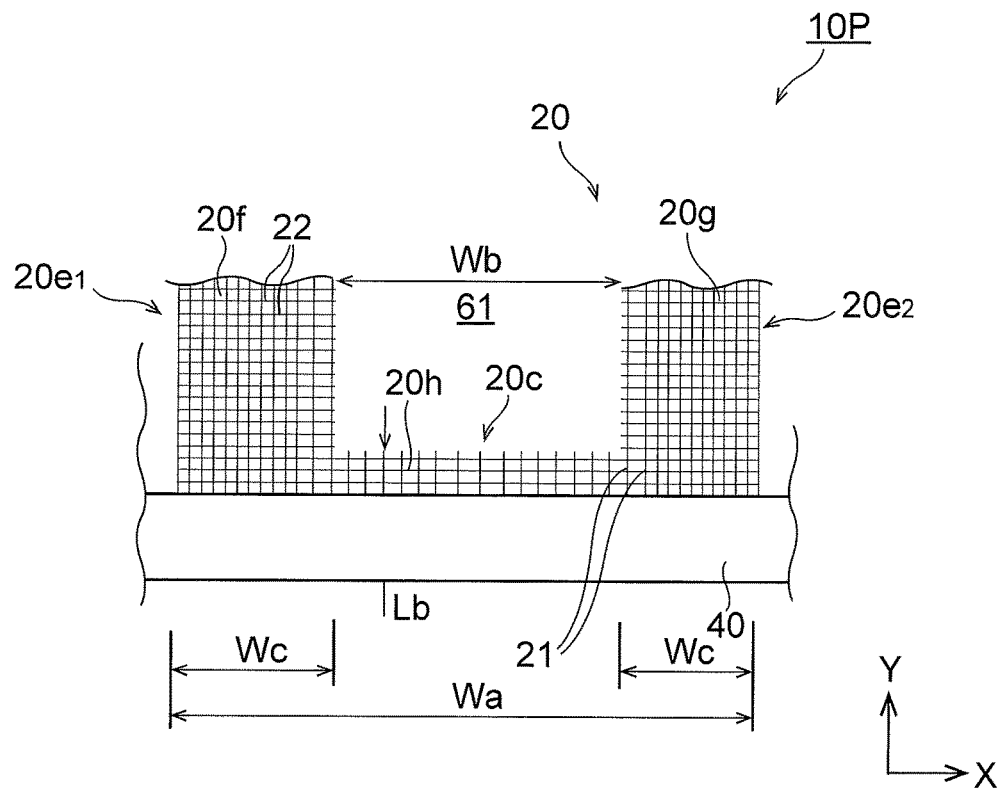
FIG. 45 is an enlarged plan view (view corresponding to FIG. 39) illustrating a wiring board according to a first modification of the third embodiment.

FIG. 45 illustrates a wiring board 10P according to a first modification. In FIG. 45, a void portion 61 is formed in the widthwise central portion 20c of the antenna pattern region 20. The void portion 61 has a substantially rectangular shape in a plan view, and has a longitudinal direction parallel to the Y direction. In the void portion 61, the antenna wiring 21 and the antenna connection wiring 22 are not provided, and the substrate 11 is exposed. A width $W_b$ (length in the X direction) of the void portion 61 may be set, for example, in a range of about 20% or more and 80% or less of the width $W_a$ of the antenna pattern region 20.

The antenna pattern region 20 has a first pattern region 20f and a second pattern region 20g separated with the void portion 61 therebetween. In the first pattern region 20f and the second pattern region 20g, metal lines are formed in a lattice shape or a mesh shape, respectively. Each of the first pattern region 20f and the second pattern region 20g includes the plurality of antenna wirings 21 and the plurality of antenna connection wirings 22.

Both the widthwise edge portions $20e_1$ and $20e_2$ of the antenna pattern region 20 are arranged in the first pattern region 20f and the second pattern region 20g, respectively. That is, the widthwise edge portion $20e_1$ on the negative side in the X direction is arranged in the first pattern region 20f, and the widthwise edge portion $20e_2$ on the positive side in the X direction is arranged in the second pattern region 20g. The width $W_c$ (length in the X direction) of each of the first pattern region 20f and the second pattern region 20g may be set, for example, in a range of about 10% or more and 40% or less of the width $W_a$ of the antenna pattern region 20. Note that the width $W_c$ of the first pattern region 20f and the width $W_c$ of the second pattern region 20g are equal to each other in FIG. 45, but may be different from each other.

Further, the first pattern region 20f and the second pattern region 20g are electrically connected to each other by a central pattern region 20h. In the central pattern region 20h, the respective metal lines are formed in a lattice shape or a mesh shape. The central pattern region 20h includes the plurality of antenna wirings 21 and the plurality of antenna connection wirings 22. Further, the central pattern region 20h is arranged in the widthwise central portion 20c of the antenna pattern region 20. A width (length in the X direction) of the central pattern region 20h is equal to the width $W_b$ of the void portion 61. Further, a length $L_b$ in the Y direction of the central pattern region 20h can be selected, for example, in the range of 0.05 mm or more and 5.0 mm or less.

In FIG. 45, the aperture ratio Ac in the widthwise central portion 20c of the antenna pattern region 20 is higher than the aperture ratio Ae in the widthwise edge portions $20e_1$ and $20e_2$. That is, a pitch of the antenna wiring 21 in the widthwise central portion 20c of the antenna pattern region 20 (the central pattern region 20h) is wider than a pitch of the antenna wiring 21 in the widthwise edge portions $20e_1$ and $20e_2$ of the antenna pattern region 20 (the first pattern region 20f and the second pattern region 20g). As a result, a current distribution can be made uniform between the widthwise central portion 20c and the widthwise edge portions $20e_1$ and $20e_2$ of the antenna pattern region 20. Furthermore, the transparency of the wiring board 10 can be improved since the void portion 61 is formed in the widthwise central portion 20c of the antenna pattern region 20.

[Second Modification]

Figure 46:
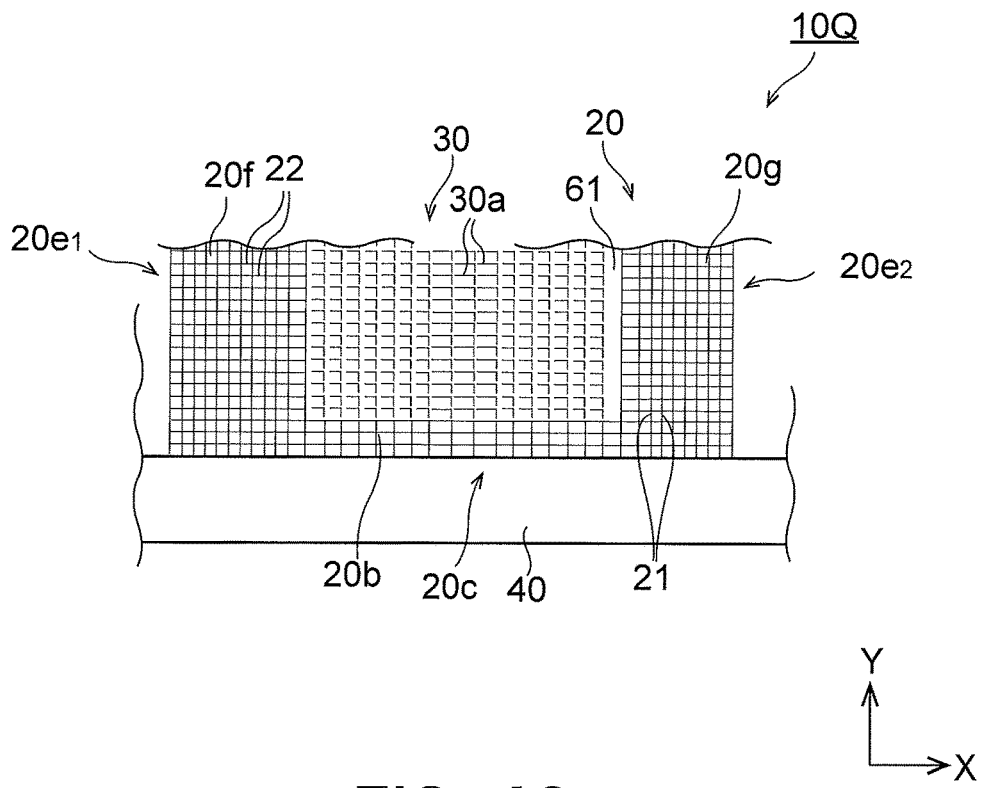
FIG. 46 is an enlarged plan view (view corresponding to FIG. 39) illustrating a wiring board according to a second modification of the third embodiment.

FIG. 46 illustrates a wiring board 10Q according to a second modification. The wiring board 10Q illustrated in FIG. 46 has the dummy pattern region 30 formed in the void portion 61 of the wiring board 10P illustrated in FIG. 45 (first modification). This dummy pattern region 30 is provided between the first pattern region 20f and the second pattern region 20g. The dummy pattern region 30 does not substantially function as an antenna, which is different from the antenna pattern region 20.

The dummy pattern region 30 is configured by repeating the dummy wiring 30a having a predetermined unit pattern shape. That is, the dummy pattern region 30 includes a plurality of the dummy wirings 30a each having the same shape, and each of the dummy wirings 30a is electrically independent of the antenna pattern region 20 (the antenna wiring 21 and the antenna connection wiring 22). Further, the plurality of dummy wirings 30a are regularly arranged over the entire region of the dummy pattern region 30. The plurality of dummy wirings 30a are spaced apart from each other in a plane direction, and are arranged in an island shape to protrude above the substrate 11. That is, each of the dummy wirings 30a is electrically independent of the antenna pattern region 20, the power feeding unit 40, and the other dummy wirings 30a. Each of the dummy wirings 30a has a substantially L shape in a plan view. Note that a width of the dummy wiring 30a (length in the X direction) may be gradually narrowed from the central portion in the width direction (X direction) of the dummy pattern region 30 toward the edge portion in the width direction (X direction) in accordance with the pitch of the antenna wiring 21.

In this case, the dummy wiring 30a has a shape in which a part of the above-described unit pattern shape 20a (see FIG. 40(a)) of the antenna pattern region 20 is missing. That is, the shape of the dummy wiring 30a is a shape obtained by removing a part of the L-shaped unit pattern shape 20a of the antenna pattern region 20. As a result, it is possible to make it difficult to visually recognize a difference between the antenna pattern region 20 and the dummy pattern region 30, and to make the antenna pattern region 20 arranged on the substrate 11 hardly visible.

As the dummy pattern region 30 electrically independent of the antenna pattern region 20 is arranged in the void portion 61 in this manner, a boundary between the antenna pattern region 20 and the void portion 61 can be made obscure. As a result, it is possible to make the antenna pattern region 20 hardly visible on the front surface of the display 91, and to make it difficult for a user of the image display device 90 to recognize the antenna pattern region 20 with the naked eye.

[Third Modification]

Figure 47:
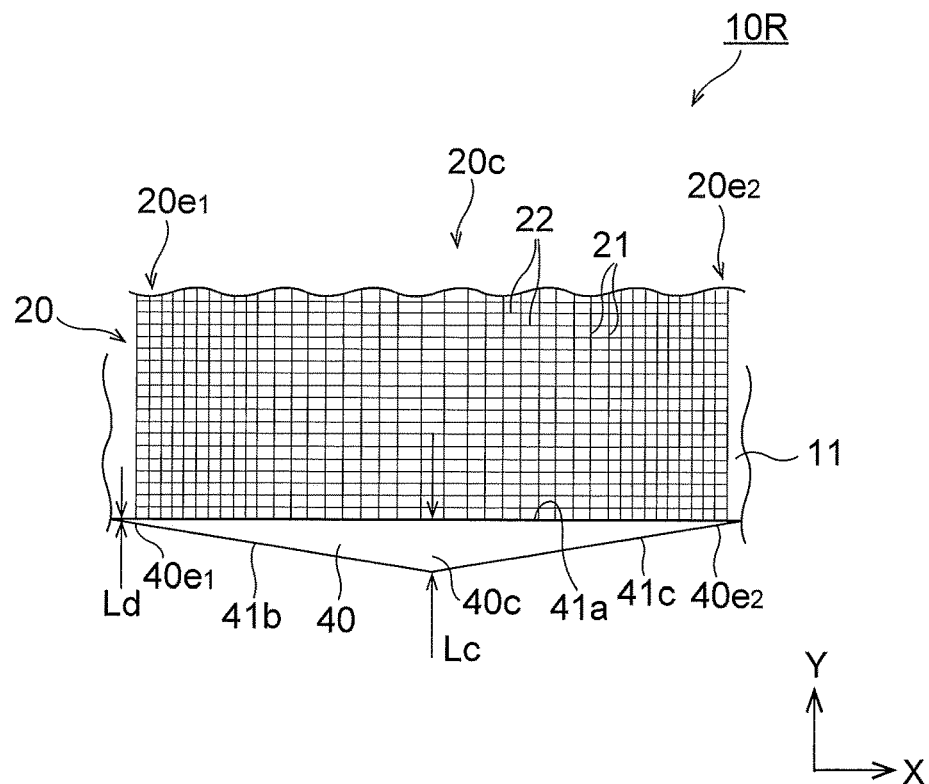
FIG. 47 is an enlarged plan view (view corresponding to FIG. 39) illustrating a wiring board according to a third modification of the third embodiment.

FIG. 47 illustrates a wiring board 10R according to a third modification. In FIG. 47, a length (length in the Y direction) $L_c$ of the power feeding unit 40 in a widthwise central portion 40c is set to be longer than a length (length in the Y direction) $L_d$ of the power feeding unit 40 in each of widthwise edge portions $40e_1$ and $40e_2$. That is, the power feeding unit 40 has a triangular shape in a plan view, and the length of the power feeding unit 40 (the length in the Y direction) is gradually shorten from the widthwise central portion 40c toward the widthwise edge portions $40e_1$ and $40e_2$. The power feeding unit 40 has a straight long side 41a electrically connected to the antenna pattern region 20, and a pair of straight short sides 41b and 41c each of which is connected to the long side 41a. Note that the planar shape of the power feeding unit 40 is not limited to the triangular shape. For example, the short sides 41b and 41c may be formed in a step shape or an arc shape such as a circular arc.

As the length $L_c$ of the power feeding unit 40 in the widthwise central portion 40c is made longer than the length $L_d$ in each of the widthwise edge portions $40e_1$ and $40e_2$ in this manner, a current is likely to concentrate on the widthwise central portion 40c of the power feeding unit 40. As a result, a current distribution is made more uniform between the widthwise central portion 20c and the widthwise edge portions $20e_1$ and $20e_2$ of the antenna pattern region 20 so that the antenna characteristics can be further improved. Further, it is possible to disperse heat generated in the power feeding unit 40 and to suppress a temperature rise of the power feeding unit 40 by increasing the length $L_c$ of the widthwise central portion 40c of the power feeding unit 40 where the current is likely to concentrate. Furthermore, the entire area of the power feeding unit 40 can be reduced, and thus, the weight of the wiring board 10 can be reduced.

[Fourth Modification]

Figure 48:
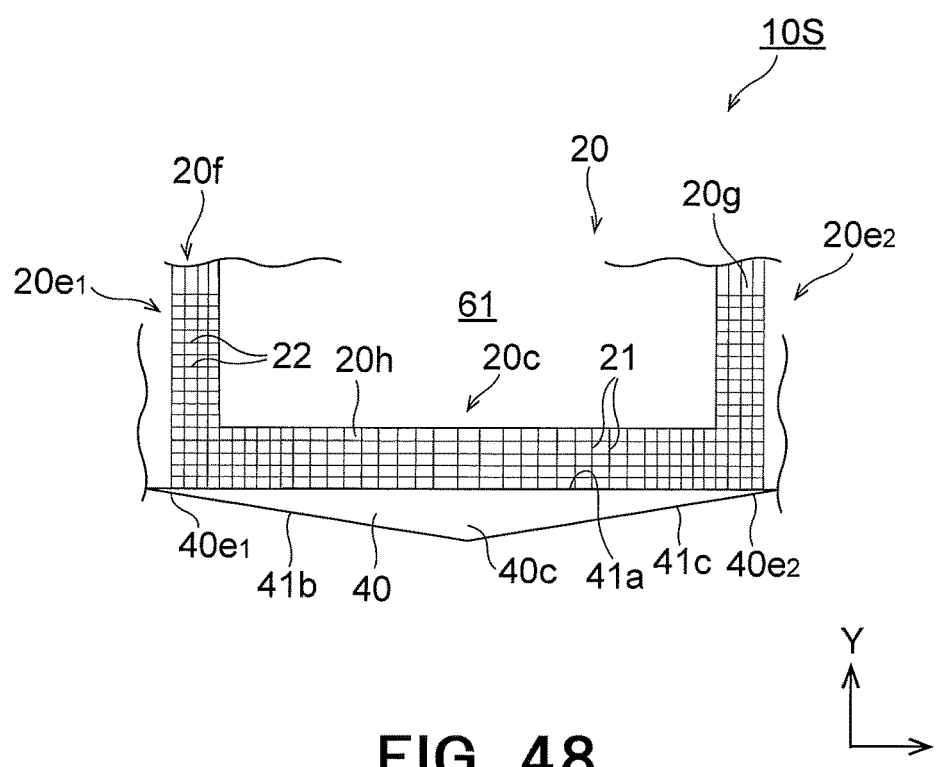
FIG. 48 is an enlarged plan view (view corresponding to FIG. 39) illustrating a wiring board according to a fourth modification of the third embodiment.

FIG. 48 illustrates a wiring board 10S according to a fourth modification. In FIG. 48, the void portion 61 in which the antenna wiring 21 and the antenna connection wiring 22 are not provided is formed in the widthwise central portion 20c of the antenna pattern region 20. Further, the antenna pattern region 20 has the first pattern region 20f and the second pattern region 20g separated with the void portion 61 therebetween. A configuration of this antenna pattern region 20 is substantially the same as the configuration of the antenna pattern region 20 of the wiring board 10P illustrated in FIG. 45 (first modification).

Further, the power feeding unit 40 has a triangular shape, and a length (length in the Y direction) of the power feeding unit 40 in the widthwise central portion 40c is set to be longer than a length (length in the Y direction) of the power feeding unit 40 in each of the widthwise edge portions $40e_1$ and $40e_2$. A configuration of this power feeding unit 40 is substantially the same as the configuration of the power feeding unit 40 of the wiring board 10R illustrated in FIG. 47 (third modification).

In this case, the transparency of the wiring board 10 can be improved, and a current distribution in the antenna pattern region 20 can be made more uniform.

[Fifth Modification]

Figure 49:
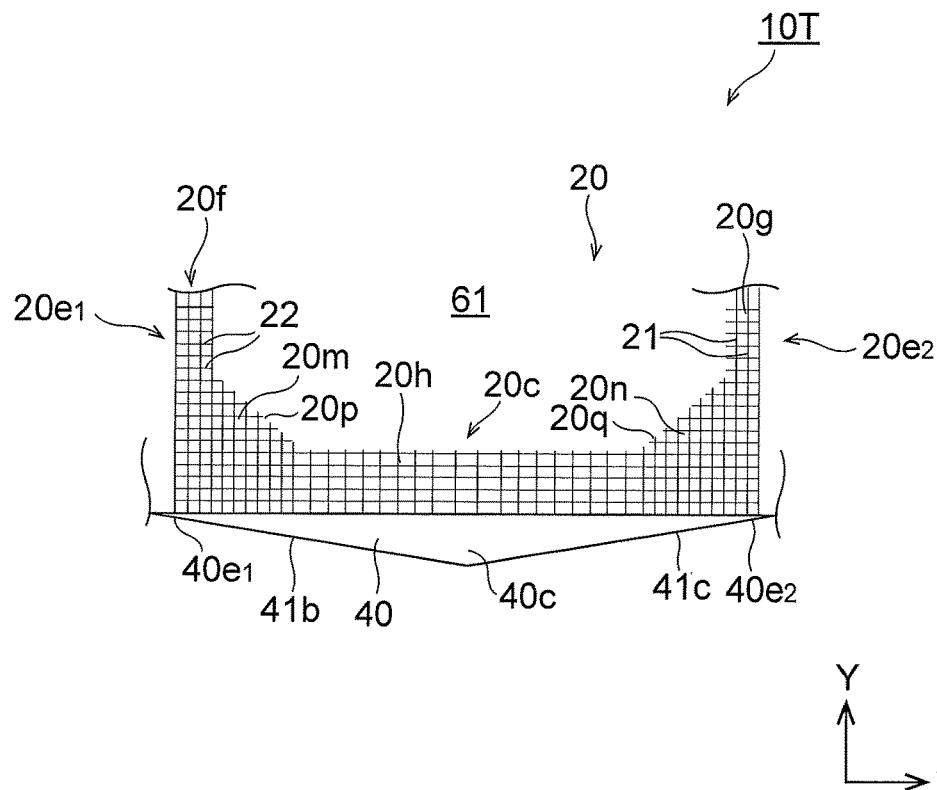
FIG. 49 is an enlarged plan view (view corresponding to FIG. 39) illustrating a wiring board according to a fifth modification of the third embodiment.

FIG. 49 illustrates a wiring board 10T according to a fifth modification. In FIG. 49, connection pattern regions 20m and 20n are provided, respectively, between the central pattern region 20h of the antenna pattern region 20 and each of the first pattern region 20f and the second pattern region 20g. One connection pattern region 20m is provided between the central pattern region 20h and the first pattern region 20f, and the other connection pattern region 20n is provided between the central pattern region 20h and the second pattern region 20g.

The connection pattern regions 20m and 20n have a substantially triangular shape in a plan view, and have inclined portions 20p and 20q formed obliquely with respect to the width direction (X direction) of the antenna pattern region 20, respectively. Each of the inclined portions 20p and 20q extends linearly, but is not limited thereto, and may extend in a curved shape or a step shape. Further, the connection pattern regions 20m and 20n may include the antenna wiring 21 and the antenna connection wiring 22 formed in a lattice shape or a mesh shape similarly to the central pattern region 20h and the second pattern region 20g. The other configurations are substantially the same as the configurations of the wiring board 10S illustrated in FIG. 48 (fourth modification).

In this case, the transparency of the wiring board 10 can be improved, and a current distribution in the antenna pattern region 20 can be made more uniform.

[Sixth Modification]

Figure 50:
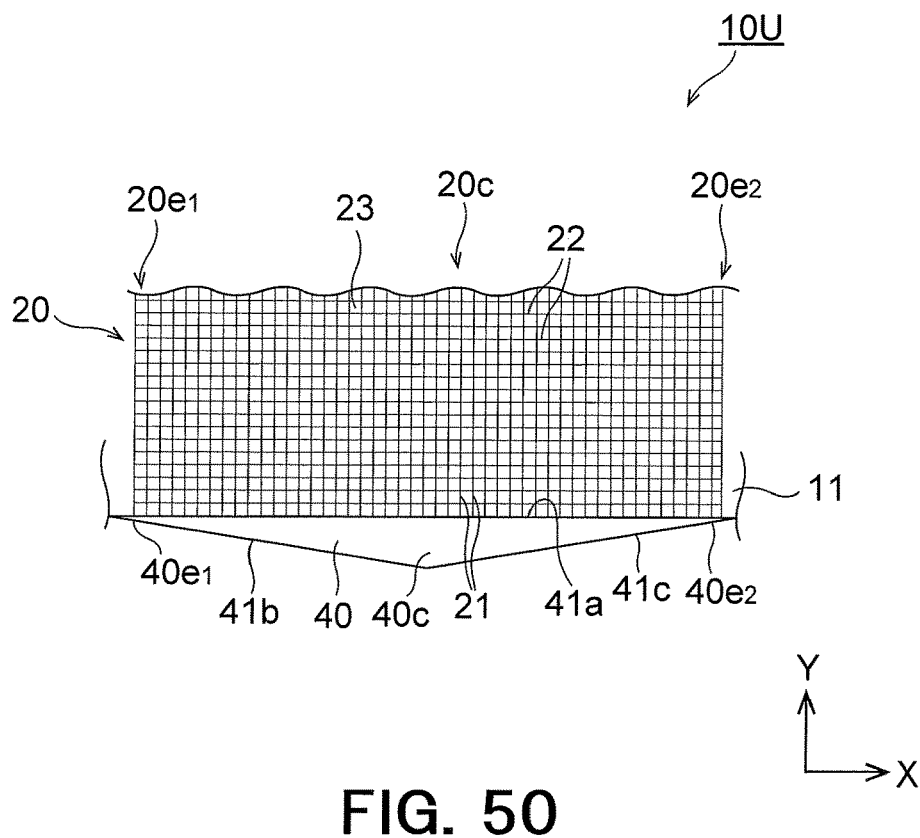
FIG. 50 is an enlarged plan view (view corresponding to FIG. 39) illustrating a wiring board according to a sixth modification of the third embodiment.

FIG. 50 illustrates a wiring board 10U according to a sixth modification. In FIG. 50, each of the antenna pattern regions 20 includes the plurality of antenna wirings 21 each having a function as an antenna and the plurality of antenna connection wirings 22 that connect the plurality of antenna wirings 21. In this case, the plurality of antenna wirings 21 are arranged at equal intervals. Further, the plurality of antenna connection wirings 22 are arranged at equal intervals. Note that a configuration of this power feeding unit 40 is substantially the same as the configuration of the power feeding unit 40 of the wiring board 10R illustrated in FIG. 47 (third modification).

Since the plurality of antenna wirings 21 and the plurality of antenna connection wirings 22 are arranged at equal intervals in this manner, there is no variation in size of the opening portion 23 in each of the antenna pattern regions 20, and it is possible to make the antenna pattern region 20 less visible with the naked eye. Further, a current distribution in the antenna pattern region 20 can be made more uniform.

The plurality of components disclosed in the above-described embodiments and modifications can be appropriately combined if necessary. Alternatively, some components may be deleted from all the components illustrated in the above-described embodiments and modifications.

The invention claimed is:

1. A wiring board comprising:
    a substrate having transparency;
    a plurality of first wirings which are arranged on an upper surface of the substrate and extend in a first direction, each of the first wirings having:
        a back surface in contact with the substrate;
        a front surface facing an opposite side of the back surface; and
        a pair of side surfaces which extend in the first direction and are adjacent to the back surface, each of the pair of side surfaces being recessed inward; and
    a second wiring which is arranged on the upper surface of the substrate and extends in a second direction intersecting with the first direction, the second wiring having:
        a back surface in contact with the substrate;
        a front surface facing an opposite side of the back surface of the second wiring;
        one side surface that extends in the second direction, is adjacent to the back surface of the second wiring, and is recessed inward; and
        another side surface that extends in the second direction, is adjacent to the back surface of the second wiring, and is recessed inward, an angle between the back surface of the second wiring and the other side surface being smaller than an angle between the back surface of the second wiring and the one side surface.

2. The wiring board according to claim 1, wherein a line width of the back surface of the second wiring is smaller than a line width of the back surface of each first wiring.

3. The wiring board according to claim 2, wherein the line width of the back surface of each first wiring is larger than a line width of the front surface of each first wiring, and the line width of the back surface of the second wiring is larger than a line width of the front surface of the second wiring.

4. The wiring board according to claim 2, wherein
the second wiring has a pair of side surfaces which extend in the second direction and are adjacent to the back surface of the second wiring, and
an angle between the front surface and each of the side surfaces of the second wiring is smaller than an angle between the upper surface of the substrate and each of the side surfaces of the second wiring.

5. The wiring board according to claim 2, wherein
each first wiring has a pair of side surfaces which extend in the first direction and are adjacent to the back surface of each first wiring, and
an angle between the front surface and each of the side surfaces of each first wiring is smaller than an angle between the upper surface of the substrate and each of the side surfaces of each first wiring.

6. The wiring board according to claim 2, wherein
an intersection between each first wiring and the second wiring includes a curved surface at at least one of corners formed by the upper surface of the substrate, a surface adjacent to the back surface of each first wiring, and a surface adjacent to the back surface of the second wiring, the curved surface being continuous among the surfaces.

7. The wiring board according to claim 1 having a radio wave transmission/reception function.

8. A wiring board comprising:
a substrate having transparency;
a plurality of first wirings which are arranged on an upper surface of the substrate and extend in a first direction, each of the first wirings having:
  a back surface in contact with the substrate;
  a front surface facing an opposite side of the back surface;
  a pair of side surfaces which extend in the first direction and are adjacent to the back surface; and
  a line width in a range of 0.1 µm or more and 5.0 µm or less;
a second wiring which is arranged on the upper surface of the substrate and extends in a second direction intersecting with the first direction, the second wiring having:
  a back surface in contact with the substrate;
  a front surface facing an opposite side of the back surface of the second wiring;
  a pair of side surfaces which extend in the second direction and are adjacent to the back surface of the second wiring; and
  a line width in a range of 0.1 µm or more and 5.0 µm or less;
four corners formed by an upper surface of the substrate, the pair of side surfaces of the first wiring, and the pair of side surfaces of the second wiring; and
curved surfaces that continuously connect one side surface of each first wiring and one side surface of the second wiring, a radius of curvature of the curved surface of only one of four corners or at only two adjacent corners of the four corners being larger than a radius of curvature at the other corners.

9. A method for manufacturing a wiring board, comprising:
forming a conductive layer on an upper surface of a substrate;
forming an insulating layer that includes a first trench extending in a first direction and a second trench extending in a second direction;
forming a first conductor arranged in the first trench and a second conductor arranged in the second trench;
removing the insulating layer; and
removing the conductive layer to expose the upper surface of the substrate and forming a first wiring and a second wiring from the first conductor and the second conductor.

10. The method for manufacturing a wiring board according to claim 9, wherein
the first wiring has a pair of side surfaces which extend in the first direction and are adjacent to a back surface of the first wiring, and each of the pair of side surfaces of the first wiring is recessed inward, and
the second wiring has a pair of side surfaces which extend in the second direction and are adjacent to a back surface of the second wiring, and each of the pair of side surfaces of the second wiring is recessed inward.

11. The method for manufacturing a wiring board according to claim 9, wherein
the first wiring has a pair of side surfaces which extend in the first direction and are adjacent to a back surface of the first wiring,
the second wiring has a pair of side surfaces which extend in the second direction and are adjacent to a back surface of the second wiring, and
one side surface of the first wiring and one side surface of the second wiring are continuously connected by a curved surface.

12. The method for manufacturing a wiring board according to claim 9, wherein
a line width of a back surface of the second wiring is smaller than a line width of a back surface of the first wiring.

13. The method for manufacturing a wiring board according to claim 9, wherein
the insulating layer that includes the first trench and the second trench is formed using an imprinting method.

14. The method for manufacturing a wiring board according to claim 9, wherein
a method for forming the first wiring and the second wiring comprises:
forming the conductive layer by a sputtering method;
forming the first wiring and the second wiring by an electrolytic plating method; and
removing the conductive layer by wet etching so as to expose the upper surface of the substrate.

15. The method for manufacturing a wiring board according to claim 9, further comprising
performing a blackening treatment on front surfaces of the first wiring and the second wiring.

16. A wiring board comprising:
a substrate having transparency;
an antenna pattern region which is arranged on the substrate and includes a plurality of wirings; and
a dummy pattern region which is arranged around the antenna pattern region and includes a plurality of dummy wirings electrically independent of the wirings,
wherein each of the antenna pattern region and the dummy pattern region is formed by repeating a predetermined unit pattern shape, and a unit pattern shape of the dummy pattern region is a shape in which a part of a unit pattern shape of the antenna pattern region is missing,
the missing part of the unit pattern shape of the antenna pattern region is located on an extension of the wiring, and an additional pattern apart from the dummy wirings is arranged in the dummy pattern region.

17. The wiring board according to claim 16, wherein the dummy wiring has a first dummy wiring portion and a second dummy wiring portion, and the first dummy wiring portion and the second dummy wiring portion are arranged apart from each other in a plane direction.

18. The wiring board according to claim 16, wherein an aperture ratio of the dummy pattern region is higher than an aperture ratio of the antenna pattern region.

19. The wiring board according to claim 18, wherein the aperture ratio of the dummy pattern region is in a range of 87% or more and less than 100%.

20. The wiring board according to claim 16, wherein a difference between the aperture ratio of the dummy pattern region and the aperture ratio of the antenna pattern region is 1% or less.

21. The wiring board according to claim 16, wherein the antenna pattern region includes a plurality of connection wirings that connect the plurality of wirings.

22. The wiring board according to claim 16 having a radio wave transmission/reception function.

23. A wiring board comprising:
a substrate having transparency;
an antenna pattern region which is arranged on the substrate and includes a plurality of wirings; and
a dummy pattern region which is arranged around the antenna pattern region and includes a plurality of dummy wirings electrically independent of the wirings, each dummy wiring having a first dummy wiring portion and a second dummy wiring portion, the first dummy wiring portion and the second dummy wiring portion each being located on an extension of the wiring,
wherein the dummy wiring has a substantially L shape in a plan view.

24. The wiring board according to claim 23, wherein an additional pattern apart from the dummy wirings is arranged in the dummy pattern region.

25. A wiring board comprising:
a substrate having transparency;
an antenna pattern region which is arranged on the substrate and includes a plurality of wirings; and
a dummy pattern region which is arranged around the antenna pattern region and includes a plurality of dummy wirings electrically independent of the wirings, each dummy wiring having a first dummy wiring portion and a second dummy wiring portion, and the first dummy wiring portion and the second dummy wiring portion being arranged obliquely with respect to the wiring, the first dummy wiring portion and the second dummy wiring portion being arranged apart from each other in a plane direction,
wherein no first dummy wiring portion and no second dummy wiring portion exist between first dummy wiring portions adjacent to each other, and
no first dummy wiring portion and no second dummy wiring portion exist between second dummy wiring portions adjacent to each other.

\* \* \* \* \*